(12) United States Patent
Johnson

(10) Patent No.: US 9,651,874 B2
(45) Date of Patent: May 16, 2017

(54) SCANNED-SPOT-ARRAY DUV LITHOGRAPHY SYSTEM

(71) Applicant: Kenneth C. Johnson, Santa Clara, CA (US)

(72) Inventor: Kenneth C. Johnson, Santa Clara, CA (US)

( * ) Notice: Subject to any disclaimer, the term of this patent is extended or adjusted under 35 U.S.C. 154(b) by 0 days.

(21) Appl. No.: 14/906,875

(22) PCT Filed: Jun. 20, 2014

(86) PCT No.: PCT/US2014/043462
§ 371 (c)(1),
(2) Date: Jan. 21, 2016

(87) PCT Pub. No.: WO2015/012982
PCT Pub. Date: Jan. 29, 2015

(65) Prior Publication Data
US 2016/0161856 A1   Jun. 9, 2016

Related U.S. Application Data

(63) Continuation-in-part of application No. 13/801,919, filed on Mar. 13, 2013, now Pat. No. 9,097,983.

(60) Provisional application No. 61/675,709, filed on Jul. 25, 2012, provisional application No. 61/618,584, filed on Mar. 30, 2012, provisional application No. 61/857,166, filed on Jul. 22, 2013, provisional application No. 61/937,552, filed on Feb. 9, 2014, provisional application No. 61/921,407, filed on Dec. 28, 2013.

(51) Int. Cl.
*G03B 27/42* (2006.01)
*G03F 7/20* (2006.01)

(52) U.S. Cl.
CPC .......... *G03F 7/704* (2013.01); *G03F 7/70291* (2013.01)

(58) Field of Classification Search
CPC .. G03F 7/70291; G03F 7/704; G03F 7/70275; G03F 7/70508; G03F 7/70391; G03F 7/2051; G03F 7/70383; G03F 7/20; G03F 7/70116; G03F 7/70516; G03F 7/70191; G03F 7/70308; G03F 7/70; G03F 7/70133; G03F 7/70158; G03F 7/70266; G03F 7/70575
See application file for complete search history.

(56) References Cited

U.S. PATENT DOCUMENTS

2011/0188016 A1* 8/2011 De Jager ............. G03F 7/70275
355/55

* cited by examiner

*Primary Examiner* — Mesfin Asfaw
(74) *Attorney, Agent, or Firm* — Kilpatrick Townsend & Stockton LLP

(57) ABSTRACT

A DUV scanned-spot-array lithography system comprises an array of phase-Fresnel microlenses, which focus multiple radiation beams through intermediate foci at the object surface of a projection system. The intermediate foci are imaged by the projection system onto corresponding focused-radiation spots on an image plane, and the spots expose a photosensitive layer proximate the image plane as the layer is scanned in synchronization with modulation of the beams. The modulators may comprise micromechanical shutters proximate the intermediate foci for ON/OFF switching, in series with transmission grating modulators for gray-level control, and the microlenses may also be actuated to provide dynamic beam centering control. A nodal line printing technique may be used to provide ultra-high-resolution and high-throughput maskless printing capability in conjunction with multi-patterning or dual-wavelength recording processes.

19 Claims, 37 Drawing Sheets

| | $h = 0.8\,\text{mm}$ | (8.1) |
|---|---|---|
| $h$: image field radius | $w = \sqrt{2}\,h = 1.13\,\text{mm}$ | (8.2) |
| $w$: exposure field width | $\delta \approx 20\,\text{nm}$ | (8.3) |
| $d$: center spacing between image spots | $N = w/\delta \approx 56569$ | (8.4) |
| $\delta$: center spacing between raster lines | $N = 256^2 = 65536$ | (8.5) |
| $N$: image points per exposure field | $\delta = w/\sqrt{N} = 17.3\,\text{nm}$ | (8.6) |
| $f_{sync}$: synchronization frequency | $d = w/\sqrt{N} = 4.42\,\mu\text{m}$ | (8.7) |
| $speed$: scan speed | $f_{sync} = 2 \cdot 10^6\,\text{sec}^{-1}$ | (8.8) |
| $rate$: area scan rate per exposure field | $speed = f_{sync}\,\delta = 34.5\,\text{mm/sec}$ | (8.9) |
| $dose$: exposure dose | $rate = w \cdot speed = 39.1\,\text{mm}^2/\text{sec}$ | (8.10) |
| $eff$: optical efficiency | $dose = 30\,\text{mJ/cm}^2$ | (8.11) |
| $power$: source power | $eff = 0.25$ | (8.12) |
| | $power = rate \cdot dose / eff$ $= 46.9\,\text{mW}$ | (8.13) |

FIG. 8

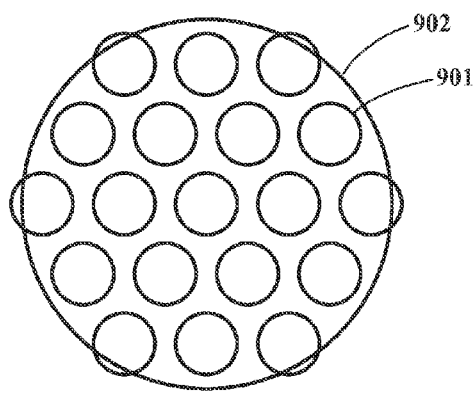

FIG. 9

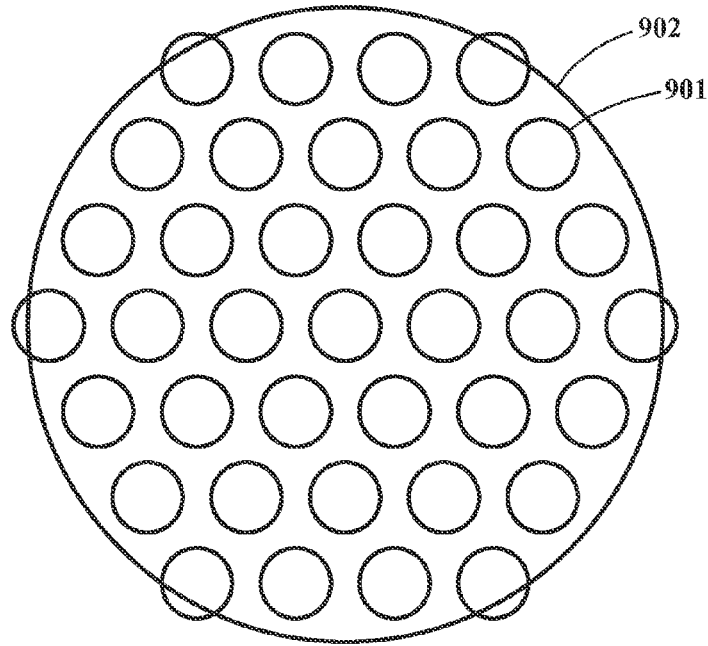

FIG. 10

| $(x_2, x_3) = (x_2', x_3') + (x_2'', x_3'')$ | (11.1) |
|---|---|
| grating phase (cycles) = $gp[x_2', x_3', x_2'', x_3'']$ | (11.2) |
| $gp[x_2', x_3', x_2'', x_3''] =$ $gp[x_2'\cos\theta + x_3'\sin\theta, x_3'\cos\theta - x_2'\sin\theta, x_2''\cos\theta + x_3''\sin\theta, x_3''\cos\theta - x_2''\sin\theta]$ | (11.3) |
| $\cos\theta = x_2'/R$ and $\sin\theta = x_3'/R$, with $R = \sqrt{(x_2')^2 + (x_3')^2}$ | (11.4) |
| $gp[x_2', x_3', x_2'', x_3''] = gp[R, 0, (x_2'' x_2' + x_3'' x_3')/R, (x_3'' x_2' - x_2'' x_3')/R]$ | (11.5) |
| $gp[x_2', 0, x_2'', x_3''] = gp[-x_2', 0, -x_2'', -x_3'']$ | (11.6) |
| $gp[x_2', 0, x_2'', x_3''] = gp[x_2', 0, x_2'', -x_3'']$ | (11.7) |

FIG. 11

Design data for FIG. 13

Wavelength: 266 nm
Refractive indices:
    Air   1.0
    $SiO_2$   1.5
    $HfO_2$   2.1
    $Al_2O_3$   1.7
Period: $\Lambda$ = 2.2437 µm
Layers:

| | $t$ (µm) | $xL/\Lambda$ | $xR/\Lambda$ | | $t$ (µm) | $xL/\Lambda$ | $xR/\Lambda$ |
|---|---|---|---|---|---|---|---|
| $SiO_2$ | | | | | | | |
| $HfO_2$ | 0.0580 | | | $HfO_2$ | 0.0141 | 0.5759 | 1.0210 |
| $Al_2O_3$ | 0.0020 | | | $Al_2O_3$ | 0.0020 | | |
| $HfO_2$ | 0.0141 | 0.1846 | 1.0511 | $HfO_2$ | 0.0141 | 0.6362 | 1.0183 |
| $Al_2O_3$ | 0.0020 | | | $Al_2O_3$ | 0.0020 | | |
| $HfO_2$ | 0.0141 | 0.2707 | 1.0338 | $HfO_2$ | 0.0141 | 0.7076 | 1.0150 |
| $Al_2O_3$ | 0.0020 | | | $Al_2O_3$ | 0.0020 | | |
| $HfO_2$ | 0.0141 | 0.2997 | 1.0284 | $HfO_2$ | 0.0141 | 0.7782 | 1.0113 |
| $Al_2O_3$ | 0.0020 | | | $Al_2O_3$ | 0.0020 | | |
| $HfO_2$ | 0.0141 | 0.3638 | 1.0264 | $HfO_2$ | 0.0141 | 0.8418 | 1.0081 |
| $Al_2O_3$ | 0.0020 | | | $Al_2O_3$ | 0.0020 | | |
| $HfO_2$ | 0.0141 | 0.4449 | 1.0248 | $HfO_2$ | 0.0141 | 0.8838 | 1.0063 |
| $Al_2O_3$ | 0.0020 | | | $Al_2O_3$ | 0.0020 | | |
| $HfO_2$ | 0.0141 | 0.5091 | 1.0230 | $HfO_2$ | 0.0141 | 0.9485 | 1.0000 |
| $Al_2O_3$ | 0.0020 | | | $Al_2O_3$ | 0.0020 | | |

FIG. 14

Diffraction efficiencies of transmitted orders for FIG. 13 (TE and TM average)

| order | Incident angle | | |
|---|---|---|---|
| | 25.38° | 23.61° | 21.85° |
| -3 | 0.00069 | 0.0011 | 0.0021 |
| -2 | 0.00010 | 0.00017 | 0.00078 |
| -1 | 0.00048 | 0.00017 | 0.00037 |
| 0 | 0.00055 | 0.00054 | 0.00051 |
| 1 | 0.79 | 0.81 | 0.82 |
| 2 | 0.00064 | 0.00072 | 0.00039 |
| 3 | 0.00180 | 0.0011 | 0.00064 |
| 4 | 0.00014 | 0.00020 | 0.00026 |
| 5 | 0.00038 | 0.00056 | 0.0013 |
| 6 | 0.00084 | 0.00057 | 0.00064 |
| 7 | 0.00015 | 0.000080 | 0.00017 |
| 8 | 0.00036 | 0.000072 | 0.00047 |
| 9 | 0.00033 | 0.00041 | 0.00056 |
| 10 | 0.00023 | 0.00041 | 0.00087 |
| 11 | 0.00013 | 0.00015 | 0.00029 |
| 12 | 0.00044 | 0.00015 | 0.00017 |
| 13 | 0.00038 | 0.00020 | 0.00042 |

FIG. 15

Design data for FIG. 16

Wavelength: 266 nm
Refractive indices:
    Air   1.0
    $SiO_2$   1.5
    $HfO_2$   2.1
    $Al_2O_3$   1.7
Period: $\Lambda = 1.0564$ μm
Slant angle: $\gamma = 44.98°$
Layers:

|  | $t$ (μm) | $xL/\Lambda$ | $xR/\Lambda$ |
|---|---|---|---|
| $SiO_2$ |  |  |  |
| $Al_2O_3$ | 0.0020 |  |  |
| $HfO_2$ | 0.0489 | 0.7175 | 1.5707 |
| $Al_2O_3$ | 0.0020 |  |  |
| $HfO_2$ | 0.0385 | 0.7648 | 1.4064 |
| $Al_2O_3$ | 0.0020 |  |  |
| $HfO_2$ | 0.0157 | 0.8048 | 1.3582 |
| $Al_2O_3$ | 0.0020 |  |  |
| $HfO_2$ | 0.0348 | 0.8367 | 1.2196 |
| $Al_2O_3$ | 0.0020 |  |  |
| $HfO_2$ | 0.0263 | 0.8367 | 1.1348 |
| $Al_2O_3$ | 0.0020 |  |  |
| $HfO_2$ | 0.0525 | 0.8367 | 1.0000 |
| $Al_2O_3$ | 0.0020 |  |  |

FIG. 17

Diffraction efficiencies of transmitted orders for FIG. 16 (TE only)

| order | Incident angle | | |
|---|---|---|---|
| | 3.97° | 2.90° | 1.82° |
| -3 | 0.0059 | 0.0012 | 0.0010 |
| -2 | 0.0021 | 0.000077 | 0.0022 |
| -1 | 0.81 | 0.83 | 0.82 |
| 0 | 0.0011 | 0.000014 | 0.00091 |
| 1 | 0.00044 | 0.000069 | 0.0014 |
| 2 | 0.00029 | 0.00065 | 0.0031 |
| 3 | 0.00068 | 0.000013 | 0.000058 |
| 4 | 0.0010 | 0.0019 | 0.0044 |

FIG. 18

| | |
|---|---|
| $\mathbf{x} = x_1 \hat{\mathbf{e}}_1 + x_2 \hat{\mathbf{e}}_2 + x_3 \hat{\mathbf{e}}_3$ | (24.1) |
| $\mathbf{u} = u_1 \hat{\mathbf{e}}_1 + u_2 \hat{\mathbf{e}}_2 + u_3 \hat{\mathbf{e}}_3, \quad |\mathbf{u}| = \sqrt{u_1^2 + u_2^2 + u_3^2} = n$ | (24.2) |
| $\sqrt{u_2^2 + u_3^2} \le NA$ (circular aperture) | (24.3) |
| $|u_2| \le NA_2, \quad |u_3| \le NA_3; \quad \sqrt{NA_2^2 + NA_3^2} = NA$ (rectangular aperture) | (24.4) |
FIG. 24
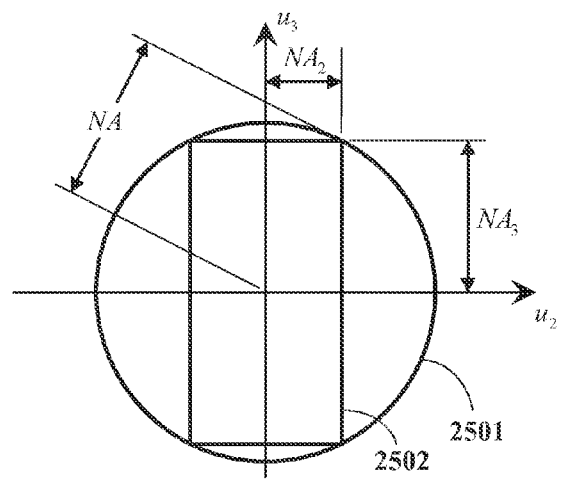
FIG. 25
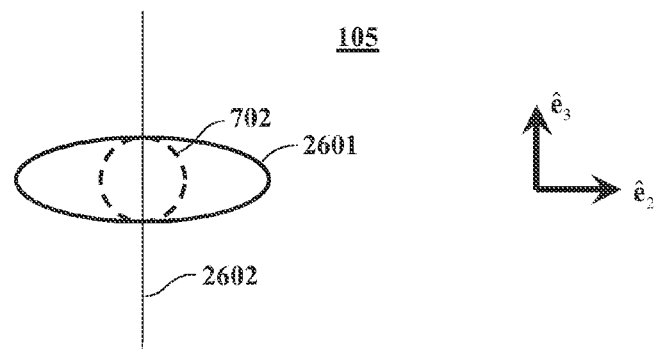
FIG. 26

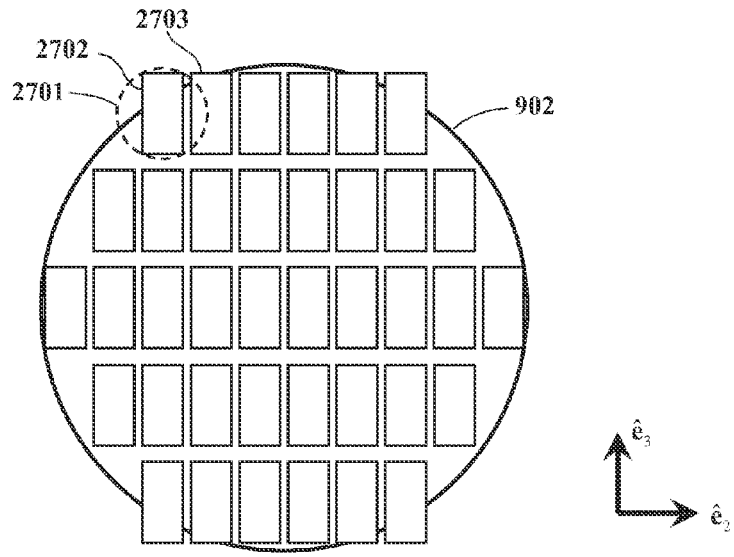

FIG. 27

| | |
|---|---|
| $\mathbf{A} = A_1\hat{\mathbf{e}}_1 + A_2\hat{\mathbf{e}}_2 + A_3\hat{\mathbf{e}}_3, \quad \mathbf{A} \cdot \mathbf{u} = A_1 u_1 + A_2 u_2 + A_3 u_3 = 0$ | (28.1) |
| $\mathbf{E}[\mathbf{x}] = \iint \mathbf{A}[u_2, u_3] \exp[i\frac{2\pi}{\lambda}\mathbf{u} \cdot \mathbf{x}] du_2 du_3$ | (28.2) |
| $u_1 = \sqrt{n^2 - u_2^2 - u_3^2}$ | (28.3) |
| $\mathbf{E}[x_2, x_3] = \iint \mathbf{A}[u_2, u_3] \exp[i\frac{2\pi}{\lambda}(u_2 x_2 + u_3 x_3)] du_2 du_3$ | (28.4) |
| $\mathbf{A} \cdot \hat{\mathbf{e}}_3 = A_3 = 0$ | (28.5) |
| $\mathbf{A}[u_2, u_3] = P[u_2, u_3]\left(\hat{\mathbf{e}}_2 - \frac{u_2}{u_1}\hat{\mathbf{e}}_1\right) \quad (P = A_2)$ | (28.6) |
| $\mathbf{E}[x_2, x_3] \cdot \hat{\mathbf{e}}_3 = E_3[x_2, x_3] = 0$ | (28.7) |
| $\mathbf{E}[x_2, x_3] \cdot \hat{\mathbf{e}}_2 = E_2[x_2, x_3] = \iint P[u_2, u_3] \exp[i\frac{2\pi}{\lambda}(u_2 x_2 + u_3 x_3)] du_2 du_3$ | (28.8) |
| $\mathbf{E}[x_2, x_3] \cdot \hat{\mathbf{e}}_1 = E_1[x_2, x_3] = -\iint P[u_2, u_3] \frac{u_2}{\sqrt{n^2 - u_2^2 - u_3^2}} \exp[i\frac{2\pi}{\lambda}(u_2 x_2 + u_3 x_3)] du_2 du_3$ | (28.9) |
| $P[u_2, u_3] = P_2[u_2] P_3[u_3]; \quad E_2[x_2, x_3] = E_{2,2}[x_2] E_{2,3}[x_3]$ | (28.10) |
| $E_{2,2}[x_2] = \int_{-NA_2}^{NA_2} P_2[u_2] \exp[i\frac{2\pi}{\lambda}u_2 x_2] du_2, \quad E_{2,3}[x_3] = \int_{-NA_3}^{NA_3} P_3[u_3] \exp[i\frac{2\pi}{\lambda}u_3 x_3] du_3$ | (28.11) |

FIG. 28A

| | |
|---|---|
| $P_3[u_3] = 1 \rightarrow \begin{cases} E_{2,3}[x_3] = 2NA_3 \left( \dfrac{\sin[\frac{2\pi}{\lambda} x_3 NA_3]}{\frac{2\pi}{\lambda} x_3 NA_3} \right); \\ x_3 = \frac{1}{2} m\lambda / NA_3 \text{ (non-zero integer } m) \rightarrow E_{2,3}[x_3] = 0 \end{cases}$ | (28.12) |
| $P_3[u_3] = 1 - |u_3|/NA_3 \rightarrow \begin{cases} E_{2,3}[x_3] = NA_3 \left( \dfrac{\sin[\frac{\pi}{\lambda} x_3 NA_3]}{\frac{\pi}{\lambda} x_3 NA_3} \right)^2; \\ x_3 = m\lambda / NA_3 \text{ (non-zero integer } m) \rightarrow E_{2,3}[x_3] = 0 \end{cases}$ | (28.13) |
| $P_3[u_3] = \mathrm{sgn}[u_3] \rightarrow \begin{cases} E_{2,3}[x_3] = -2iNA_3 \dfrac{\sin^2[\frac{\pi}{\lambda} x_3 NA_3]}{(\frac{\pi}{\lambda} x_3 NA_3)}; \\ x_3 = m\lambda / NA_3 \text{ (any integer } m) \rightarrow E_{2,3}[x_3] = 0 \end{cases}$ | (28.14) |
| $P_3[u_3] = \begin{cases} 3u_3/NA_3, & |u_3|/NA_3 < \frac{1}{3} \\ \frac{3}{2}\mathrm{sgn}[u_3](1-|u_3|/NA_3), & \frac{1}{3} < |u_3|/NA_3 < 1 \end{cases} \rightarrow$ $\begin{cases} E_{2,3}[x_3] = -3iNA_3 \dfrac{\sin^3[\frac{2}{3}\frac{\pi}{\lambda} x_3 NA_3]}{(\frac{\pi}{\lambda} x_3 NA_3)^2}; \\ x_3 = \frac{3}{2} m\lambda / NA_3 \text{ (any integer } m) \rightarrow E_{2,3}[x_3] = 0 \end{cases}$ | (28.15) |
| $P_3[u_3] = \begin{cases} 0, & |u_3|/NA_3 < \frac{1}{2} \\ \mathrm{sgn}[u_3], & \frac{1}{2} < |u_3|/NA_3 < 1 \end{cases} \rightarrow$ $\begin{cases} E_{2,3}[x_3] = -iNA_3 \dfrac{(1-\cos[\frac{\pi}{\lambda} x_3 NA_3])(1+2\cos[\frac{\pi}{\lambda} x_3 NA_3])}{(\frac{\pi}{\lambda} x_3 NA_3)}; \\ x_3 = \frac{2}{3} m\lambda / NA_3 \text{ (any integer } m) \rightarrow E_{2,3}[x_3] = 0 \end{cases}$ | (28.16) |
| $P_3[u_3] = \begin{cases} 1, & |u_3|/NA_3 < \frac{3}{4} \\ 0, & |u_3|/NA_3 > \frac{3}{4} \end{cases} \rightarrow$ $\begin{cases} E_{2,3}[x_3] = \frac{3}{2}NA_3 \dfrac{\sin[\frac{3}{2}\frac{\pi}{\lambda} x_3 NA_3]}{(\frac{3}{2}\frac{\pi}{\lambda} x_3 NA_3)}; \\ x_3 = \frac{2}{3} m\lambda / NA_3 \text{ (non-zero integer } m) \rightarrow E_{2,3}[x_3] = 0 \end{cases}$ | (28.17) |
| $P_3[u_3] = \begin{cases} 1, & |u_3|/NA_3 < \frac{1}{2} \\ 2(1-|u_3|/NA_3), & |u_3|/NA_3 > \frac{1}{2} \end{cases} \rightarrow$ $\begin{cases} E_{2,3}[x_3] = NA_3 \dfrac{(1-\cos[\frac{\pi}{\lambda} x_3 NA_3])(1+2\cos[\frac{\pi}{\lambda} x_3 NA_3])}{(\frac{\pi}{\lambda} x_3 NA_3)^2}; \\ x_3 = \frac{2}{3} m\lambda / NA_3 \text{ (non-zero integer } m) \rightarrow E_{2,3}[x_3] = 0 \end{cases}$ | (28.18) |

FIG. 28B

| Symbol | Description |
|---|---|
| $N_{spot/row}$ | Number of focus spots per spot row |
| $i_{spot}$ | Spot index: $0, 1, \ldots, N_{spot/row} - 1$ |
| $N_{line/row}$ | Number of lines scanned per spot row |
| $i_{line}$ | Line-scan index: $0, 1, \ldots, N_{line/row} - 1$ |
| $N_{pulse/line}$ | Number of pulses per line scan |
| $i_{pulse}$ | Pulse index: $0, 1, \ldots, N_{pulse/line} - 1$ |
| $N_{row/block}$ | Number of spot rows per echelon block |
| $i_{row}$ | Row index: $0, 1, \ldots, N_{row/block} - 1$ |
| $N_{block/field}$ | Number of echelon blocks per image field |
| $i_{block}$ | Block index: $0, 1, \ldots, N_{block/field} - 1$ |
| $i_{2\,field}, i_{3\,field}$ | Field indices: $0, 1, \ldots$ |
| $G_2, G_3$ | Printing grid steps in $\hat{e}_2$ and $\hat{e}_3$ directions |
| $N_{dot/pulse}$ | $x_2$ scan distance per pulse in $G_2$ units |
| $N_{dot/spot}$ | $x_2$ offset between focus spots in $G_2$ units |
| $N_{dot/row}$ | Echelon $x_2$ offset, in $G_2$ units, per spot row |
| $N_{row/field}$ | Number of spot rows per image field |
| $N_{dot/line}$ | $x_2$ scan distance, in $G_2$ units, per line scan |
| $N_{line/field}$ | Number of raster lines scanned per image field (over all line scans) |
| $N_{offset}$ | $x_2$ offset between field rows in $G_2$ units |
| $L_{block}$ | Nominal $x_2$ length of echelon blocks |
| $N_{dot/pulse} = N_{spot/row}$ | (38.1) |
| $GCD[N_{dot/pulse}, N_{dot/spot}] = 1$ | (38.2) |
| $N_{dot/row} = N_{dot/spot} \cdot N_{spot/row}$ | (38.3) |
| $N_{row/field} = N_{row/block} \cdot N_{block/field}$ | (38.4) |
| $N_{dot/line} = N_{dot/pulse} \cdot N_{pulse/line}$ | (38.5) |
| $N_{line/field} = N_{line/row} \cdot N_{row/field}$ | (38.6) |
| $x_2 = (i_{pulse} \cdot N_{dot/pulse} + i_{spot} \cdot N_{dot/spot} + i_{row} \cdot N_{dot/row} + i_{2\,field} \cdot N_{dot/line} + i_{3\,field} \cdot N_{offset}) \cdot G_2$ | (38.7) |
| $x_3 = (i_{row} + i_{block} \cdot N_{row/block} + i_{line} \cdot N_{row/field} + i_{3\,field} \cdot N_{line/field}) \cdot G_3$ | (38.8) |
| $L_{block} = N_{dot/row} \cdot N_{row/block} \cdot G_2$ | (38.9) |
| $L_{block} = \sqrt{\frac{1}{2}(5 - \sqrt{13})} \cdot R_{field}$ | (38.10) |

FIG. 38

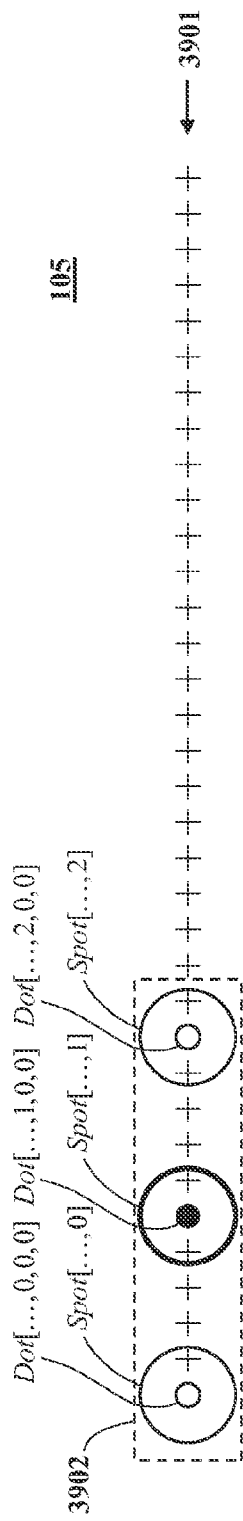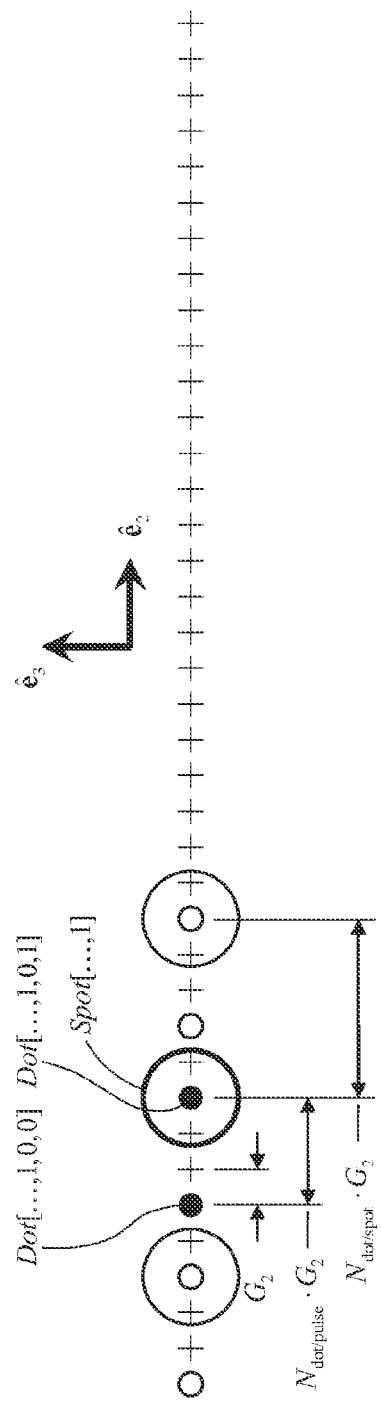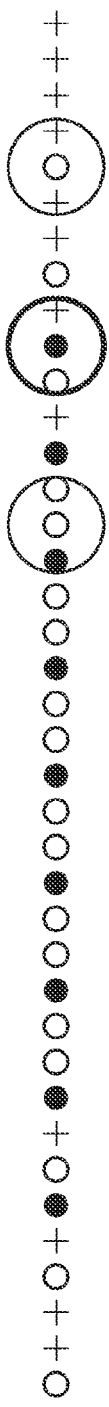
FIG. 39A
FIG. 39B
FIG. 39C

| | |
|---|---|
| $\lambda = 193 \text{ nm}$ | (53.1) |
| $NA = 1.35$ | (53.2) |
| $NA_3 = 2NA/\sqrt{5} = 1.207, \quad NA_2 = NA/\sqrt{5} = 0.604$ | (53.3) |
| $G_3 = \lambda / NA_2 = 160 \text{ nm}$ | (53.4) |
| $G_2 = \lambda / (2 NA_2) = 160 \text{ nm}$ | (53.5) |
| $N_{\text{dot/spot}} \cdot G_2 \geq 1 \mu\text{m}$ | (53.6) |
| $N_{\text{row/block}} \cdot G_3 \geq 2 \mu\text{m}$ | (53.7) |
| $N_{\text{dot/spot}} \geq 7$ | (53.8) |
| $N_{\text{dot/spot}} = 8$ | (53.9) |
| $N_{\text{dot/spot}} \cdot G_2 = 1.279 \mu\text{m}$ | (53.10) |
| $N_{\text{row/block}} \geq 13$ | (53.11) |
| $N_{\text{row/block}} = 2 N_{\text{dot/spot}} = 16$ | (53.12) |
| $N_{\text{row/block}} \cdot G_3 = 2.557 \mu\text{m}$ | (53.13) |
| $N_{\text{dot/row}} \cdot N_{\text{row/block}} \cdot G_2 \approx 1 \text{ mm}$ | (53.14) |
| $N_{\text{row/block}} \cdot N_{\text{block/field}} \cdot G_3 \approx 2 \text{ mm}$ | (53.15) |
| $N_{\text{dot/row}} \approx 1 \text{ mm}/(N_{\text{row/block}} \cdot G_2) \approx 391$ | (53.16) |
| $N_{\text{spot/row}} = N_{\text{dot/row}} / N_{\text{dot/spot}} \approx 49$ | (53.17) |
| $N_{\text{dot/pulse}} = N_{\text{spot/row}} = 49$ | (53.18) |
| $N_{\text{dot/row}} = N_{\text{dot/spot}} \cdot N_{\text{spot/row}} = 392$ | (53.19) |
| $N_{\text{dot/row}} \cdot N_{\text{row/block}} \cdot G_2 = 1.003 \text{ mm}$ | (53.20) |
| $N_{\text{block/field}} \approx 2 \text{ mm}/(N_{\text{row/block}} \cdot G_3) \approx 782$ | (53.21) |
| $N_{\text{block/field}} = 2 N_{\text{dot/row}} = 784$ | (53.22) |
| $N_{\text{row/block}} \cdot N_{\text{block/field}} \cdot G_3 = 2.005 \text{ mm}$ | (53.23) |

FIG. 53A

| | |
|---|---|
| $N_{dot/line} \cdot G_2 \approx 30\,mm$ | (53.24) |
| $N_{line/field} \cdot G_3 \approx 60\,mm$ | (53.25) |
| $N_{line/field} \approx 375381$ | (53.26) |
| $N_{row/field} = N_{row/block} \cdot N_{block/field} = 12544$ | (53.27) |
| $N_{line/row} = N_{line/field} / N_{row/field} \approx 30$ | (53.28) |
| $N_{line/row} = 30$ | (53.29) |
| $N_{line/field} = N_{line/row} \cdot N_{row/field} = 376320$ | (53.30) |
| $N_{line/field} \cdot G_3 = 60.02\,mm$ | (53.31) |
| $N_{dot/line} = N_{line/field} / 2 = 188160$ | (53.32) |
| $N_{dot/line} \cdot G_2 = 30.01\,mm$ | (53.33) |
| $rep\_rate = 6000\,sec^{-1}$ | (53.34) |
| $speed = N_{dot/pulse} \cdot G_2 \cdot rep\_rate = 47.0\,mm/sec$ | (53.35) |
| $N_{field} = 38$ | (53.36) |
| $N_{spot} = N_{spot/row} \cdot N_{row/field} \cdot N_{field} = 23\,356\,928$ | (53.37) |
| $data\_rate = N_{spot} \cdot rep\_rate = 1.40 \cdot 10^{11}\,sec^{-1}$ | (53.38) |
| $area\_rate = G_2 \cdot G_3 \cdot data\_rate = 35.8\,cm^2/sec$ | (53.39) |
| $N_{dot} = N_{dot/line} \cdot N_{line/field} \cdot N_{field} = 2\,690\,718\,105\,600$ | (53.40) |
| $area = G_2 \cdot G_3 \cdot N_{dot} = 687\,cm^2$ | (53.41) |
| $scan\_time = area / area\_rate = 19.2\,sec$ | (53.42) |
| $dose = 30\,mJ/cm^2$ | (53.43) |
| $power = area\_rate \cdot dose = 1.07\,W$ | (53.44) |

FIG. 53B

| | |
|---|---|
| $op_{illum}[x_2,x_3] + gp_1[x_2, x_3 - x_{3\,lens}] + gp_2[x_2,x_3] + op_{proj}[x_2,x_3,x_{3\,image}] = C$ | (57.1) |
| $op_{illum}[x_2,x_3] + gp_1[x_2,x_3] - x_{3\,lens}\,Dgp_1[x_2,x_3] + gp_2[x_2,x_3]$ $+ op_{proj}[x_2,x_3,0] + M\,x_{3\,lens}\,Dop_{proj}[x_2,x_3,0] = C + x_{3\,lens}\,DC$ | (57.2) |
| $Dgp_1[x_2,x_3] = \dfrac{\partial}{\partial x_3} gp_1[x_2,x_3]$ | (57.3) |
| $Dop_{proj}[x_2,x_3,0] = \dfrac{\partial}{\partial x_{3\,image}} op_{proj}[x_2,x_3,x_{3\,image}]\bigg|_{x_{3\,image}=0}$ | (57.4) |
| $M = \dfrac{dx_{3\,image}}{dx_{3\,lens}}\bigg|_{x_{3\,lens}=0}$ | (57.5) |
| $DC = \dfrac{dC}{dx_{3\,lens}}\bigg|_{x_{3\,lens}=0}$ | (57.6) |
| $op_{illum}[x_2,x_3] + gp_1[x_2,x_3] + gp_2[x_2,x_3] + op_{proj}[x_2,x_3,0] = C$ | (57.7) |
| $-Dgp_1[x_2,x_3] + M\,Dop_{proj}[x_2,x_3,0] = DC$ | (57.8) |
| $gp_1[x_2,x_3] = gp_1[x_2,0] + M\int_0^{x_3} Dop_{proj}[x_2,x_3,0]dx_3 - DC\,x_3$ | (57.9) |
| $gp_2[x_2,x_3] = C - op_{illum}[x_2,x_3] - gp_1[x_2,x_3] - op_{proj}[x_2,x_3,0]$ | (57.10) |
| $DC = 0$ | (57.11) |
| $gp_1[0,0] = 0$ | (57.12) |
| $gp_1[x_2,0] = gp_1[0,x_2] = M\int_0^{x_2} Dop_{proj}[0,x_3,0]dx_3$ | (57.13) |

FIG. 57

SCANNED-SPOT-ARRAY DUV LITHOGRAPHY SYSTEM

CROSS-REFERENCE TO RELATED APPLICATIONS

This application claims the benefit under 35 U.S.C. §119(e) of the following three applications, all of which name Kenneth C. Johnson as the inventor:

U.S. Provisional Patent Application Ser. No. 61/857,166, filed Jul. 22, 2013 for "Scanned-Spot-Array DUV Lithography System";

U.S. Provisional Patent Application Ser. No. 61/921,407, filed on Dec. 28, 2013 for "Scanned-Spot-Array DUV Lithography System, Addendum"; and U.S. Provisional Patent Application Ser. No. 61/937,552, filed on Feb. 9, 2014 for "Scanned-Spot-Array DUV Lithography System, Second Addendum".

(Patent and patent application numbers will be generally abbreviated after the first citation by their three-digit suffix, e.g., U.S. Provisional Patent Application Ser. No. 61/857,166 is referred to as the '166 application.)

This application is a continuation-in-part of U.S. patent application Ser. No. 13/801,919, filed Mar. 13, 2013 for "Scanned-Spot-Array EUV Lithography System." The '919 application claims the benefit under 35 U.S.C. §119(e) of the following two applications, both of which name Kenneth C. Johnson as the inventor:

U.S. Provisional Patent Application Ser. No. 61/618,584, filed Mar. 30, 2012 for "Scanned-Spot-Array EUV Lithography System"; and U.S. Provisional Patent Application Ser. No. 61/675,709, filed on Jul. 25, 2012 for "Scanned-Spot-Array EUV Lithography System."

This application incorporates by reference, for all purposes, the entire disclosures (including any attached documents) of the above and the following applications, all naming Kenneth C. Johnson as the inventor:

U.S. Pat. No. 6,498,685, filed Jan. 4, 2000 for "Maskless Microlens EUV Lithography System";

U.S. Provisional Patent Application Ser. No. 60/116,074, filed Jan. 15, 1999 for "Spatially Modulated Microlens Array for EUV Maskless Lithography" (incorporated by reference in the '685 patent);

U.S. Provisional Patent Application Ser. No. 60/124,140, filed Mar. 12, 1999 for "Improved Grating Modulator Design for EUV Maskless Lithography" (incorporated by reference in the '685 patent);

U.S. patent application Ser. No. 13/103,874, filed May 9, 2011 for "Optical Systems and Methods for Absorbance Modulation";

U.S. patent application Ser. No. 13/523,843, filed Jun. 14, 2012 for "Spot-Array Imaging System for Maskless Lithography and Parallel Confocal Microscopy."

This disclosure pertains primarily to DUV (deep ultraviolet) embodiments of the '843 and '919 applications. Additional prior-art references cited in the disclosure are listed in the "References" section.

COMPUTER PROGRAM LISTING APPENDICES

The following text files were provided as "printed" (PDF) appendices to the '166 application, and as computer-readable (txt) files, and are incorporated by reference herein. These files contain design specifications for an illustrated embodiment of the invention, for use in the Zemax optical design program (Ref. 1). The content of these files are described, and usage instructions are provided, in the written specification below.

The PDF appendices are as follows
Appendix 1 titled "SiO2_266.ZTG" (1 page);
Appendix 2 titled "CaF2_266.ZTG" (1 page);
Appendix 3 titled "IF132_266.ZTG" (1 page);
Appendix 4 titled "SpotScanSystem_reverse.ZPL" (37 pages); and
Appendix 5 titled "SpotScanRMS.ZPL" (3 pages).
The computer-readable (txt) files are named as follows.
Text file 1 titled "SiO2_266_ZTG.txt" (30 lines);
Text file 2 titled "CaF2_266_ZTG.txt" (31 lines);
Text file 3 titled "IF132_266_ZTG.txt" (35 lines);
Text file 4 titled "SpotScanSystem_reverse_ZPL.txt" (2289 lines); and
Text file 5 titled "SpotScanRMS_ZPL.txt" (168 lines).
After downloading for use, the text file names need to be modified by deleting the ".txt" extension and changing the last underscore to a period (e.g., rename "SiO2_266_ZTG.txt" to "SiO2_266.ZTG"). The files will be referred to by their modified names hereafter.

BACKGROUND OF THE INVENTION

This application relates generally to scanned-spot-array lithography systems, and more specifically to scanned-spot-array lithography systems using deep ultraviolet (DUV) sources.

Scanned-Spot-Array Optical Lithography is a maskless lithographic printing method in which an array of diffraction-limited focused-radiation spots is raster-scanned over a printing surface (a photosensitive optical recording medium) to synthesize a high-resolution recorded image. The spots may be individually modulated by a spatial light modulator, or they may be collectively modulated by a single modulator.

A scanned-spot system described in U.S. Pat. No. 5,900,637 (the '637 patent) comprises Fresnel zone plates 200, which convert parallel (i.e., collimated) beamlets 212 of electromagnetic radiation into focused beamlets 213 converging to foci 215 on a printing substrate (the '637 patent's FIG. 2; col. 2, line 55 to col. 3, line 8; and col. 4, lines 4-27). The beamlets are individually modulated by micromechanical shutters 219 between the zone plates and the substrate. Alternatively, the beamlets may be modulated by means of either shutters or micromechanical mirrors preceding the zone plates in the parallel beam paths (the '637 patent's FIG. 3; col. 4, lines 23-44).

An alternative spot-scanning system disclosed in U.S. Pat. No. 6,133,986 (the '986 patent) similarly uses an array 11 of light-modulating elements such as micromirrors to modulate individual beamlets, which are focused by a microlens array 2 onto foci on a printing surface 12. (See the '986 patent's FIG. 2 and col. 4, lines 28-48). In an improvement over the '637 patent the beamlets all pass through a common projection aperture 7 of a projection system 1, which images the modulator elements onto corresponding microlenses. (By contrast, the '637 patent's FIG. 3 illustrates the beamlet light paths as being parallel and non-intersecting in the space between the mirror array and the zone plates.) The focusing elements in the '986 patent may be continuous-profile microlenses, which have higher optical efficiency and less chromatic aberration than zone plates. Other possible microlens forms include micro-Fresnel lenses or binary optics (the '986 patent's col. 13, lines 34-38). The '986 patent also describes methods for sensing and correcting positional errors between the microlenses and the printing surface, e.g., by means of a piezoelectric transducer coupled directly to the microlens array (col. 19, line 19 to col. 25, line 9).

U.S. Pat. No. 6,897,941 (the '941 patent) discloses a spot-scanning system, which is similar to those of the '637 and '986 patents in that it uses a spatial light modulator to modulate an array of parallel optical beams, and focuses the modulated beams onto a spot array by means of microlens focusing elements. (See the '941 patent's col. 4, line 60 to col. 5, line 15 and col. 6, lines 24-40.) As illustrated in the '941 patent's FIGS. 1 and 2, the modulated beams 106 are parallel in the sense of being collimated between the collimating optics 103 and focusing elements 114. The beamlets may be focused directly onto the printing substrate 120 in the manner of the '637 and '986 patents' inventions, or the focused spots may be imaged through a demagnifying lens 150 (col. 6, lines 53-55). Positioning errors may be controlled by means of a compensator system similar to the '986 patent's positioning feedback and control mechanisms (the '941 patent's col. 3, lines 62-65 and col. 11, line 66 to col. 12, line 21). In an improvement over the '637 and '986 patents, the system resolution is improved by incorporating a "beam shaper" (or "apodizer") comprising an array of shaped apertures in the parallel beam path (col. 2, lines 50-55; col. 3, lines 26-38; col. 5, lines 34-64). (the '986 patent discloses a different apodization technique in which the apodization is applied to the projection aperture, not to an "array of shaped apertures"; see the '986 patent's col. 11, lines 15-20.)

SUMMARY OF THE INVENTION

U.S. patent application Ser. No. 13/523,843 (the '843 application) discloses design concepts for a scanned-spot system in which focused-radiation exposure spots are generated by imaging an array of radiant-energy source spots through a projection lens onto a printing surface at the projection lens's image plane. The source spots are formed in the projection lens's object surface by a microlens array. This is similar to the '941 patent's embodiment employing a "demagnifying lens" (i.e., a projection lens), but in an improvement over '941 the microlenses in the '843 application may be configured to counterbalance and neutralize imperfect imaging characteristics of the projection lens, enabling aberration-free point imaging over the entire spot array.

The microlenses can also (or alternatively) be configured to achieve narrow-band achromatization, intensity control, and polarization control of the image-plane radiation. The exposure spots may be individually modulated by a spatial light modulator, or they may be collectively modulated by a single modulator (in which case the spots all print identical patterns). If they are individually modulated, the modulator elements may precede the microlens array as in the '986 and '941 patents, or they may comprise high-speed micromechanical shutters integrated with an aperture array following the microlens array (see the '843 application's para. 0091 and FIG. 15).

U.S. patent application Ser. No. 13/801,919 (the '919 application) describes a specific embodiment of the '843 application's invention that is adapted primarily for EUV (extreme ultraviolet) application, but which could also be used for DUV or visible-light lithography or other forms of high-resolution printing. The design uses a Schwarzschild catoptric projection lens comprising only two mirrors, and a novel microlens array comprising phase-Fresnel diffractive doublets in an achromatic Schupmann configuration. The Schupmann microlenses provide advantages of high optical efficiency and low chromatic aberration, and they can be formed on flat substrates (the '919 application's FIG. 10) using accurate microfabrication processes such as atomic layer deposition and e-beam lithography (the '919 application's para. 0125).

The '919 application further discloses a modulation method in which modulator elements (indicated schematically as boxes 1105 in the '919 application's FIG. 11) are located at the microlens foci (see the '919 application's para. 0073). This differs from the '941 patent's configuration employing a demagnifying lens, in which the modulation is applied to parallel beams before they intercept and are focused by the microlenses. It is similar to the shutter system illustrated in the '637 patent's FIG. 2, except that in the '637 patent, the shutters cannot be positioned close to the microlens foci because the foci are at the printing surface. In the '919 application, the microlens foci are imaged through projection optics and onto the printing surface at reduced magnification, so the microlenses can be comparatively large elements of low numerical aperture and the modulators can intercept the beams at or close to the intermediate foci. The modulators can consequently be comparatively small elements, as illustrated by element 1105 in the '919 application's FIG. 11.

As noted in the '843 and '919 applications, and as used herein, the term "microlens" can generally denote a refractive and/or reflective micro-optic focusing device. For example, the micromirror illustrated in the '919 application's FIG. 12 is a type of reflective microlens. Further, as used herein, the terms "lens" can generally denote a refractive and/or reflective focusing device.

The present application discloses embodiments of the '919 and '843 applications' inventions that are configured primarily for DUV lithography. Embodiments of the invention provide a scanned-spot-array lithography system and method in which multiple radiation beams are focused through intermediate foci at the object surface of a projection system, and the intermediate foci are imaged by the projection system onto corresponding focused-radiation spots on an image plane. The spots are scanned across a printing surface (i.e., a photosensitive layer proximate the image plane) in synchronization with modulation of the radiation beams to record a synthesized, high-resolution raster image on the printing surface. The beam modulation is preferably effected by means of modulator elements such as micromechanical shutters proximate the intermediate foci. (Element 1105 in the '919 application's FIG. 11 schematically represents a modulator element in one embodiment of the invention.)

In a first aspect of the invention, a scanned-spot-array lithography system comprises an array of microlenses and corresponding optical modulators, a projection system, and a scanning mechanism, wherein the array of microlenses and corresponding optical modulators, the projection system, and the scanning mechanism operate cooperatively to print a lithographic image on a photosensitive layer when the layer is positioned proximate an image plane.

In this system, each microlens receives radiation from a radiation source and focuses it into a convergent beam converging toward a corresponding intermediate focus. Each convergent beam transmits through and diverges from the corresponding intermediate focus, transmits through the projection system, and is focused by the projection system onto a corresponding focused-radiation spot on the image plane.

The optical modulator corresponding to each microlens is positioned to intercept the corresponding convergent beam proximate the intermediate focus, and operates to modulate the radiation transmitting to the corresponding focused-radiation spot. The scanning mechanism raster-scans the photosensitive layer relative to the focused-radiation spots in synchronization with the modulation to record a synthesized, high-resolution raster image on the photosensitive layer.

The system may further comprise collimation optics, which receive divergent radiation from the radiation source and direct it into substantially collimated radiation intercepting the microlens array.

In various embodiments of the invention, the system according to the first aspect can be characterized by one or more of the following attributes:

- The microlenses are configured to substantially eliminate geometric point-imaging optical aberrations at the focused-radiation spots.
- The microlenses are singlet microlens elements.
- The microlenses are Schupmann doublets, each doublet comprising first and second microlens elements. The first microlens element of each doublet focuses radiation toward the corresponding intermediate focus, the second element receives radiation diverging from the intermediate focus and further diverges it; and the first and second elements are configured to substantially eliminate chromatic aberration at the corresponding focused-radiation spot.
- The microlenses comprise phase-Fresnel elements.
- The projection system comprises at least one phase-Fresnel lens surface.
- Each modulator comprises a micromechanical shutter mechanism.
- Each modulator comprises two proximate transmission diffraction gratings, one of which is actuated to vary the convergent beam's zero-order transmittance through both gratings between a substantially zero-transmittance OFF state and a high-transmittance ON state.
- Each modulator comprises a micromechanical shutter mechanism for effecting ON/OFF switching; and two proximate transmission diffraction gratings, one of which is actuated to effect gray-level control by continuously varying the convergent beam's zero-order transmittance through both gratings between low, high, and intermediate transmittance levels.
- Each convergent beam traverses two microlens elements, one of which is micromechanically actuated to provide spot centration control.
- Each convergent beam traverses two microlens elements, one of which is micromechanically actuated to provide spot centration control, and the microlenses are configured to substantially eliminate geometric point-imaging optical aberrations at the focused-radiation spots and to maintain substantial elimination of aberrations over the full actuation range of the centration control.

In a second aspect of the invention, the system according to the first aspect is characterized by the radiation source being monochromatic, the microlenses and the projection system being configured to produce substantially zero-intensity nodal lines at some or all of the focused-radiation spots, and the scanning mechanism raster-scanning the photosensitive layer in the direction of the nodal lines.

In a third aspect of the invention, a method of printing a synthesized, high-resolution raster image on a photosensitive layer proximate an image plane uses a system according to the second aspect of the invention. In this third aspect, the method comprises exposing the photosensitive layer to a nodal line exposure pattern and a trim exposure pattern, wherein the system according to the second aspect performs the nodal line exposure, and selected portions of the nodal line pattern are exposed by the trim exposure.

In some embodiments of this method, a scanned-spot-array lithography system according to the first aspect of the invention performs the trim exposure.

In a fourth aspect of the invention, the system according to the first aspect is characterized by the radiation from the radiation source comprising first and second distinct wavelengths, the microlenses and the projection system being configured to produce intensity maxima in the first wavelength coinciding with substantially zero-intensity nodal lines in the second wavelength at some or all of the focused-radiation spots, and the scanning mechanism raster-scanning the photosensitive layer in the direction of the nodal lines.

In a fifth aspect of the invention, a method of printing a synthesized, high-resolution raster image on a photosensitive layer proximate an image plane uses a system according to the fourth aspect of the invention. In this fifth aspect, the method comprises exposing the photosensitive layer to focused-radiation spots comprising intensity maxima at a first wavelength coinciding with nodal lines at a second wavelength, and the second wavelength inhibiting photoactivation of the photosensitive layer by the first wavelength.

In a sixth aspect of the invention, multiple instances of the system of the first aspect are configured to operate in parallel and to simultaneously print onto a photosensitive layer on a common image plane, wherein the separate instances comprise separate microlens arrays, modulators, and projection systems.

In a seventh aspect of the invention, a method of printing a synthesized, high-resolution raster image on a photosensitive layer proximate an image plane, comprises directing radiation from a radiation source through an array of microlenses and corresponding optical modulators, through a projection system, and onto the image plane in a manner so as to generate focused-radiation spots; and operating a scanning mechanism to raster-scan the photosensitive layer relative to the focused-radiation spots in synchronization with the modulation to record the synthesized, high-resolution raster image on the photosensitive layer.

In this method, the focused-radiation spots are generated as follows. Each microlens receives radiation from the radiation source and focuses it into a convergent beam converging toward a corresponding intermediate focus, each convergent beam transmits through and diverges from the corresponding intermediate focus, transmits through the projection system, and is focused by the projection system onto a corresponding focused-radiation spot on the image plane, and the optical modulator corresponding to each microlens is positioned to intercept the corresponding convergent beam proximate the intermediate focus, and operates to modulate the radiation transmitting to the corresponding focused-radiation spot.

A further understanding of the nature and advantages of the present invention may be realized by reference to the remaining portions of the specification and the drawings, which are intended to be exemplary and not limiting.

BRIEF DESCRIPTION OF THE DRAWINGS

FIG. 8 tabulates design parameters and equations relating to system printing performance for the embodiment of FIGS. 1A and 1B;

FIG. 9 illustrates an array of 19 projection lenses covering a 300-mm semiconductor wafer (in plan view);

FIG. 10 illustrates 37 projection lenses covering a 450-mm wafer;

FIG. 11 outlines the functional form of the microlens grating phase;

FIG. 14 tabulates design data corresponding to FIG. 13;

FIG. 15 tabulates calculated optical performance data corresponding to FIG. 13;

FIG. 17 tabulates design data corresponding to FIG. 16;

FIG. 18 tabulates calculated optical performance data corresponding to FIG. 16;

FIGS. 24 and 25 illustrate a rectangular aperture geometry, and associated equations, used for nodal line printing;

FIG. 26 illustrates an elongated focused-radiation spot resulting from aperture narrowing;

FIG. 27 illustrates an array of 38 projection lenses, with narrowed, rectangular apertures, covering a 300-mm semiconductor wafer (in plan view);

FIGS. 28A and 28B tabulate equations defining several alternative pupil functions and associated focal-plane field amplitudes;

FIG. 38 tabulates equations related to an interleaved raster scan method;

FIGS. 39A-39C and 40-44 illustrate the interleaved raster scan method;

FIGS. 53A and 53B tabulate equations for a 193-nm immersion ("193i") design example;

FIG. 57 tabulates equations associated with spot centering control;

DESCRIPTION OF SPECIFIC EMBODIMENTS

The Description of Specific Embodiments is divided into two parts: Part 1 discloses a detailed optical design for a scanned-spot-array lithography system that is configured to operate with a 266-nm diode laser. The diode laser has a high repetition rate (e.g. 80 MHz), which is advantageous for high-throughput maskless lithography. Part 2 discloses an alternative "nodal line printing" method, which could achieve higher throughput and better print resolution with the comparatively low repetition rate (e.g., 6 kHz) of a 193-nm or 157-nm excimer laser. With this approach, linear interference nulls in the focused-radiation spots are used to print narrow line features. Dense line patterns can be formed by using prior-art multi-patterning and pitch division techniques, or by using a non-linear, dual-wavelength recording process. (Part 1 is based primarily on the '166 application, and Part 2 is based on the '407 and '552 applications.)

PART 1

1. Overview

Figure 4:
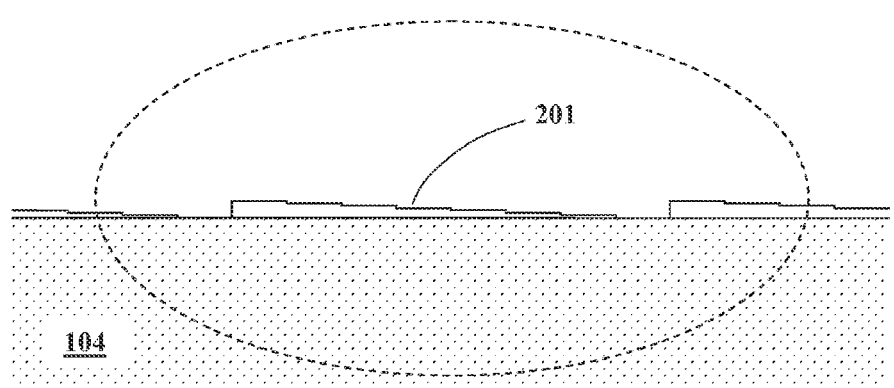
FIG. 4 is an enlarged view of region 4 in FIG. 3A, illustrating detail of the phase-Fresnel facet structure.

An embodiment of the invention is adapted primarily for DUV application, using a dioptric projection lens similar to that depicted schematically as assembly 303 in the '843 application's FIG. 4, although the '843 application did not disclose an actual optical design for the projection lens. The '919 application provided design data for an EUV Schwarzschild (catoptric) projection lens, which could be used for DUV, but a dioptric lens can achieve better imaging resolution. The system employs microlens focusing elements (301 in the '843 application's FIG. 4), which may be configured to compensate for the projection system's imperfect imaging characteristics, but the dioptric projection system reduces the amount of aberration correction required in the microlens design.

The projection lens is designed to operate in immersion mode, similar to prior-art 193-nm immersion lithography lenses (for semiconductor wafer processing), but using a frequency-quadrupled diode laser at a 266-nm wavelength. The diode laser has a comparatively high repetition rate (e.g., 80 MHz versus 6 kHz for a 193-nm excimer laser), which may be advantageous for high-throughput maskless lithography. The diode laser's longer wavelength would limit print resolution, but this limitation can be largely overcome by using high-refractive-index optical materials, which could be used at 266 nm even though they do not yet meet requirements for 193-nm lithography. (Optical absorption, scatter, and birefringence tend to be much lower at longer wavelengths.)

A limitation of the 266-nm diode laser is its comparatively wide spectral bandwidth, about 50 pm (picometer), compared to less than 1 pm for line-narrowed excimer lasers. To accommodate the spectral bandwidth, the projection system includes two phase-Fresnel, diffractive lens surfaces as achromatizing elements. (The phase-Fresnel surfaces are annular-zone diffraction gratings blazed for maximum efficiency in the +1 or −1 diffraction order.) Two diffractive surfaces suffice to correct both axial and lateral color. In addition, the diffractive surfaces provide the functionality of strong aspheric elements. (The system has no aspheric refracting surfaces.) The combination of phase-Fresnel projection lens elements and aberration-correcting microlenses make it possible to achieve design optical aberrations below the milliwave (0.001 wave) level across the entire image field and over the laser's full wavelength spectrum.

The microlens array (element 301 in the '843 application's FIG. 4) could comprise Schupmann diffractive doublets similar in function to that illustrated in the '919 application's FIG. 10 to minimize chromatic aberration. But the microlenses' chromatic aberration over the 50 pm source bandwidth would be insignificant (less than 1 milliwave) due to their small focal lengths, so in the preferred embodiment the microlenses are diffractive singlet elements. (Schupmann doublets could have advantages in alternative embodiments.) The microlenses are preferably phase-Fresnel elements, similar to the projection lens's diffractive surfaces, which can be fabricated using techniques such as atomic layer deposition and e-beam lithography.

The projection lens images a 40-mm-diameter object field onto a 1.6-mm-diameter image field at 25× reduction. The system is comparatively small, with a maximum lens diameter of 52 mm (compared to about 250 mm for prior-art immersion lithography systems, e.g., U.S. Pat. No. 8,355, 201). Multiple such projection systems can operate in parallel on a single wafer to achieve printing throughput of order twenty 300-mm wafers per hour. This is significantly lower than prior-art mask-projection scanners, which can process more than 200 wafers per hour, but the laser power requirement is also commensurately lower. The spot-scanning system's scan speed would also be comparatively low, e.g., 35 mm/sec, in contrast to prior-art mask-projection scanners, which scan the wafer at about 700 mm/sec and the mask at 2.8 m/sec while maintaining nanometer-scale dynamic alignment (Ref. 2). The spot-scanning system can use a backside alignment technique for accurate, real-time positional feedback, enabling superior overlay control for multi-patterning lithography.

The small-scale projection lens design has multiple advantages over prior-art, monolithic projection lenses. Small-scale lens elements use less glass volume per unit aperture area and can be manufactured more easily. Geometric and chromatic optical aberrations generally scale in proportion to the lens size. Thermally-induced aberrations are also less significant with small-scale lenses, and smaller elements achieve temperature equilibration more quickly. The effects of optical absorption, refractive index inhomogeneity, stress birefringence, bubbles and inclusions in the lens glass all scale in proportion to the in-glass optical path length, which is reduced with small-scale lenses. Also, wafer non-flatness would have less impact over the comparatively small image field of a small-scale projection lens.

2. Illustrative Design Configuration

Figure 1A:
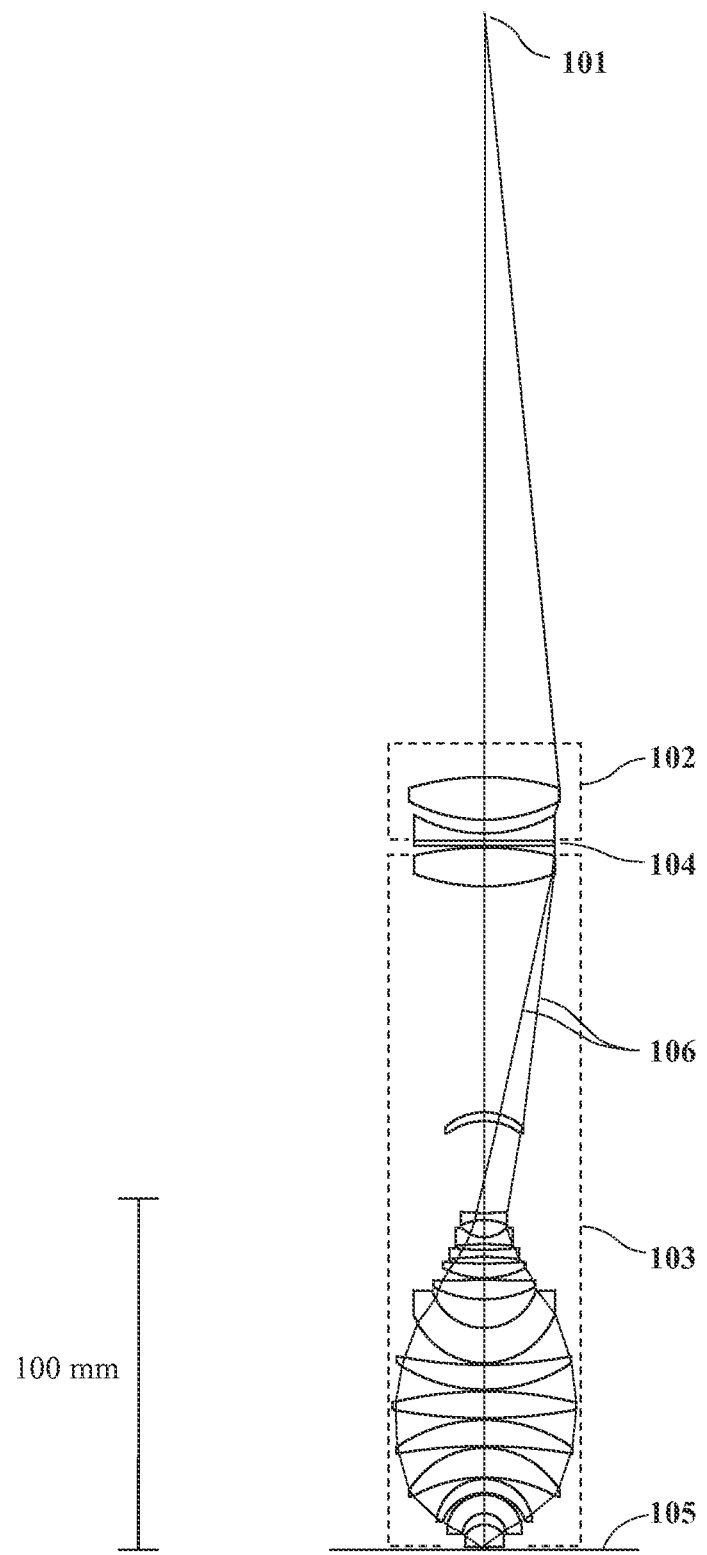
FIGS. 1A and 1B show a cross-sectional view of the lithography system optics in a particular embodiment.
Figure 1B:
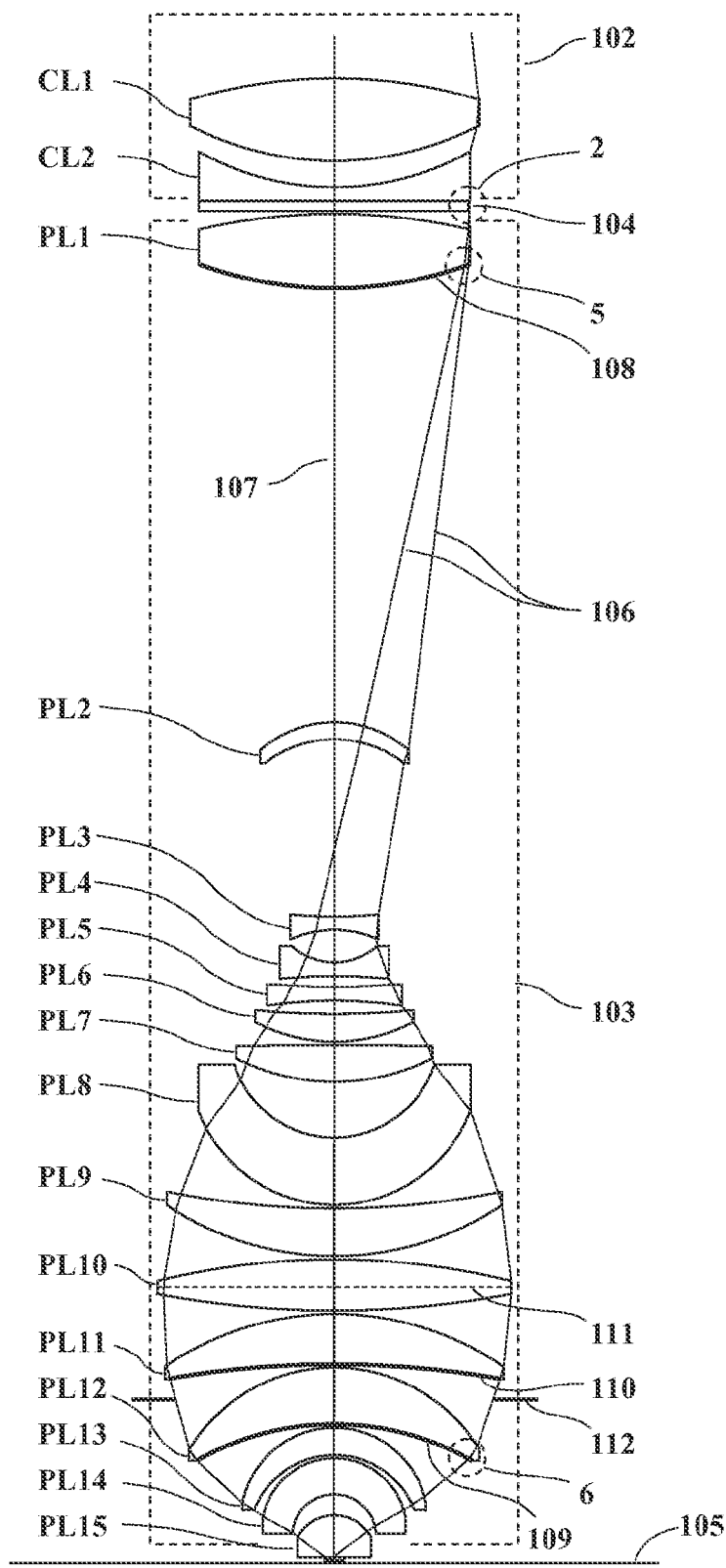

FIGS. 1A and 1B show a cross-sectional view of the lithography system optics in a particular embodiment. Laser radiation originating from source point 101 is collimated by collimator 102, is focused by a microlens array through intermediate foci at the object plane of a projection system 103, and is modulated by elements of a spatial light modulator (SLM) at the intermediate foci. The microlenses and modulators are disposed on opposite sides of a microlens/SLM plate 104. The intermediate foci are imaged by the projection system onto a printing surface 105, which is optically coupled to the projection lens through an immersion fluid. The printing surface is raster-scanned in synchronization with the modulators to synthesize a high-resolution printed image. Two limit rays 106 at the edge of the image field are illustrated in FIGS. 1A and 1B.

The optics are configured to work with a 266-nm diode laser being developed by Coherent Inc. (Ref. 3), based on its Paladin (355-nm) product platform, with a power rating initially targeted at 1.5 W and a repetition rate of at least 80 MHz. The diode laser's comparatively wide spectral bandwidth (50 pm) necessitates the use of an achromatic projection lens. The wide bandwidth is a consequence of the laser's very short pulse duration, of order 15 picosecond (although this is not short enough to induce significant optical non-linearity in the projection lenses, Ref. 4).

Referring to FIG. 1B, the collimator and projection system designs have rotational symmetry around an optical axis 107. The collimator 102 comprises an achromatic air-spaced doublet with a biconvex calcium fluoride ($CaF_2$) element CL1 and a piano-concave synthetic fused silica ($SiO_2$) element CL2, both of which have spherical surfaces. The transmitted beam from the doublet is approximately collimated. In principle, off-axis phase-Fresnel microlenses could be used to neutralize chromatic aberration in the collimator, but the microlens design is simplified by using a substantially achromatic collimator. The aberration-correcting function of the microlenses obviates the need for aspheric elements in the collimator.

Figure 2:
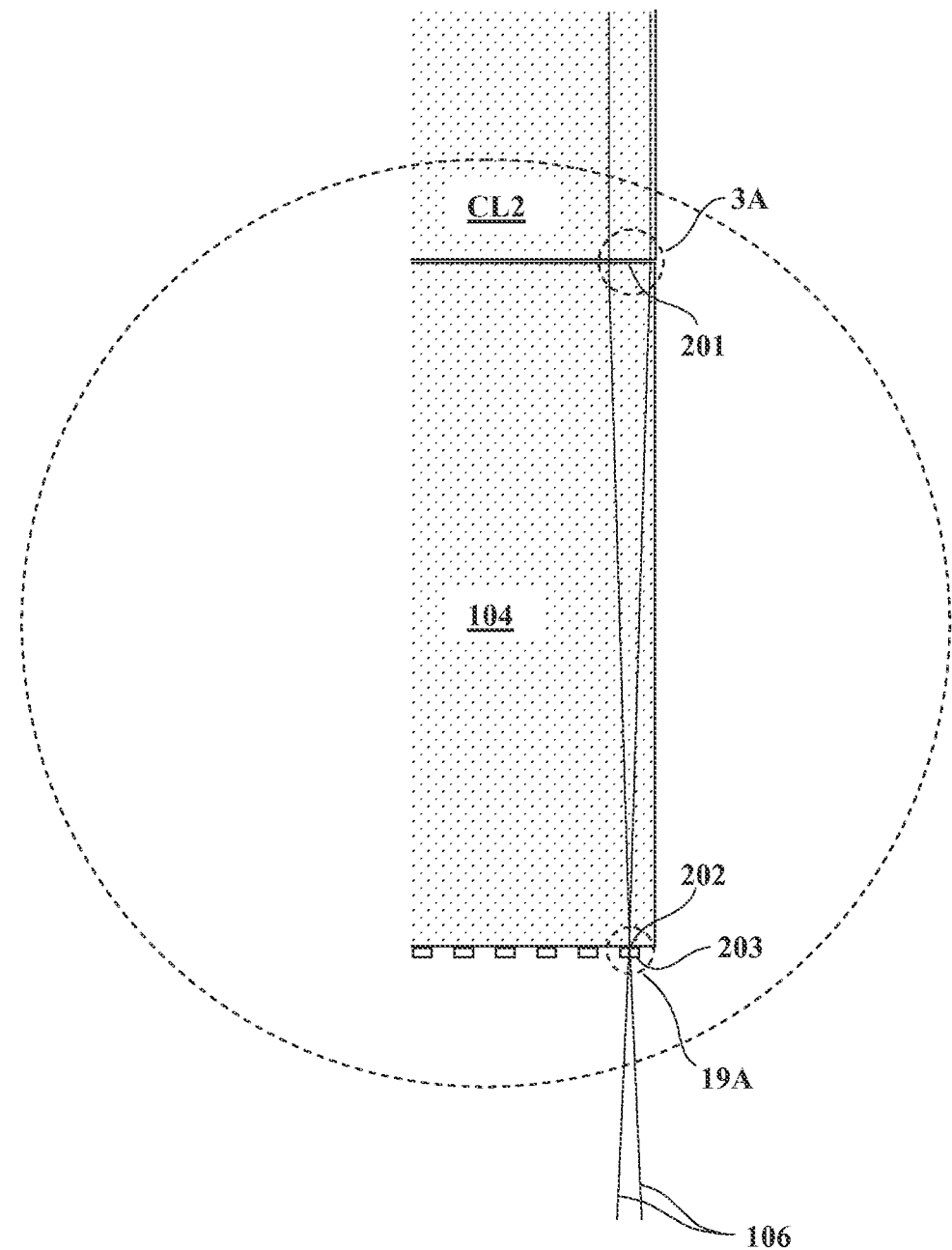
FIG. 2 is an expanded view of region 2 in FIG. 1B.

The planar surface of CL2 is in close proximity to the top surface of plate 104. FIG. 2 is an expanded view of region 2 in FIG. 1B, showing the edge portions of lens element CL2 and plate 104 intercepted by limit rays 106. The plate thickness is 1.56 mm, and a 10-micron air space separates the plate and CL2. (In alternative embodiments CL2 could be optically contacted to the plate.) The microlenses (e.g., microlens 201, shown in an expanded view of FIG. 2 region 3A in FIG. 3A) are formed on the plate's top (CL2-facing) surface. The intermediate foci (e.g., focus 202) are proximate the plate's bottom surface, which provides a substrate for the SLM. (A modulator element is illustrated schematically as box 203 in FIG. 2.) The CL2 planar surface can serve as a substrate for a microstructure such as that illustrated in the '843 application's FIG. 47, which controls polarization and intensity. (Alternatively, the microlenses may be formed on the CL2 planar surface and polarization/intensity control structures may be formed on top surface of plate 104.)

Referring again to FIG. 1B, the projection optics comprise 15 lens elements PL1 . . . PL15, which are all $SiO_2$ and all have spherical or planar surfaces, except that surface 108 on PL1 and surface 109 on PL12 comprise phase-Fresnel layers on spherical $SiO_2$ substrates. In addition, a form-birefringent polarization-control structure similar to that illustrated in the '843 application's FIGS. 42 and 43 may be formed, e.g., on spherical surface 110 of PL11 or on a buried planar surface 111 within element PL10. An aperture stop 112 may be located between PL11 and PL12. The last lens element PL15 is piano-convex, with its planar side optically coupled to the printing surface 105 through a 0.5-mm layer of immersion fluid (DuPont IF132, Ref. 5), enabling operation at a numerical aperture of 1.2. Alternatively, the printing surface may be optically contacted to a solid, transparent cover plate, which is optically coupled to the last lens element through an immersion fluid. (Insertion of an $SiO_2$ cover plate would have no effect on the optical design other than to reduce the PL15 thickness by an amount equal to the plate thickness.)

Figure 3A:
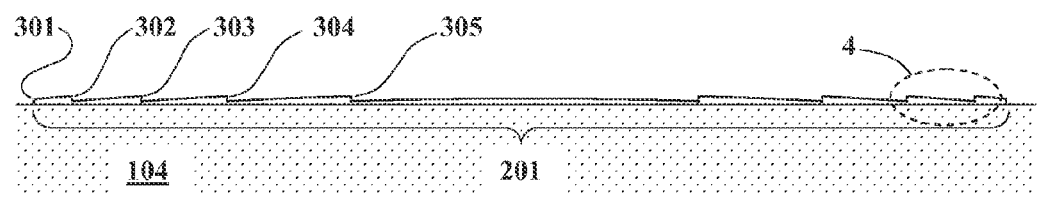
FIG. 3A illustrates a phase-Fresnel microlens in the meridional cross-sectional plane of FIGS. 1A, 1B, and 2 (region 3A in FIG. 2)
Figure 3B:
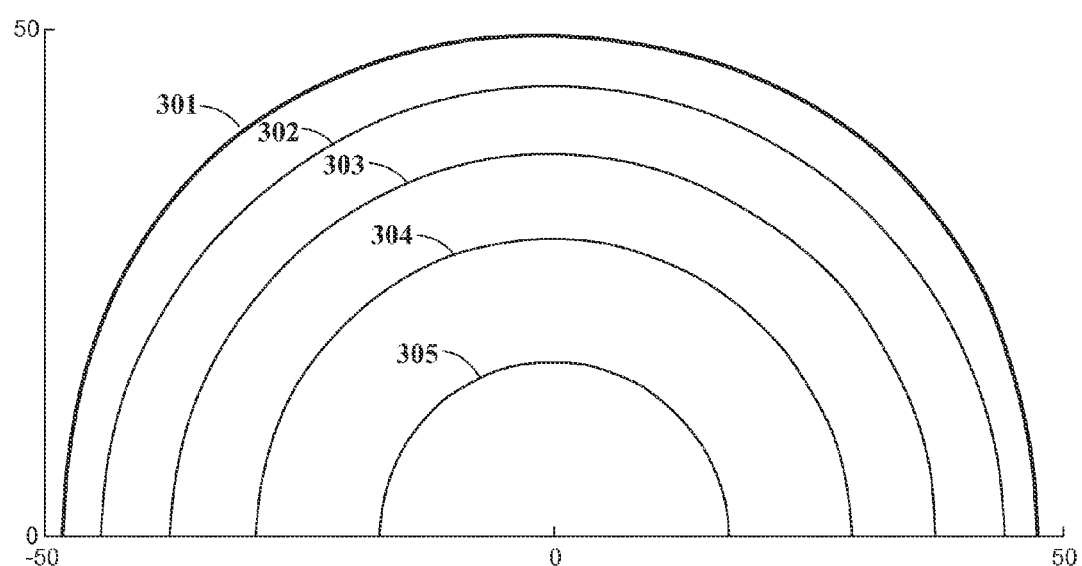
FIG. 3B illustrates the microlens in plan view.

FIG. 3A illustrates a phase-Fresnel microlens 201 (one of an array of microlenses on plate 104) in the meridional cross-sectional plane of FIGS. 1A, 1B and 2. (A "meridional" plane contains axis 107.) FIG. 3B shows a plan view of one half of the microlens on one side of the meridional plane. (The microlens design has bilateral symmetry across the meridional plane.) The scales in FIG. 3B are marked in micron units. The microlens clear aperture 301 has a diameter of approximately 100 micron, and the microlens surface has four facet steps 302, 303, 304 and 305. The microlens apertures and facet boundaries are not exactly circular, and they vary slightly in shape across the microlens array, due to aberration in the collimation and projection optics and the microlenses' aberration-correcting design form.

Region 4 in FIG. 3A is shown in an enlarged view in FIG. 4, illustrating detail of the microlenses' phase-Fresnel facet structure for microlens 201 in a preferred embodiment. The minimum facet width is approximately 5 microns. The Fresnel facets could be etched directly into the $SiO_2$ plate 104 as a linear-ramp profile (e.g., using gray-scale lithography), but they are preferably formed as a multilayer "staircase" pattern, as illustrated, comprising layers of a material of high refractive index such as hafnium oxide ($HfO_2$, also referred to as hafnia) or silicon nitride ($Si_3N_4$). (A method for fabricating such structures will be described in section 6.) A diffractive structure formed in a high-index medium will generally have a shallower grating profile, higher optical efficiency, and less optical scatter than one formed directly in $SiO_2$. (The form-birefringent polarization-control structures are also preferably formed in a high-index medium such as $HfO_2$ or $Si_3N_4$, as described in the '843 application.) Using $HfO_2$, the facet heights are approximately one-quarter micron.

Figure 5:
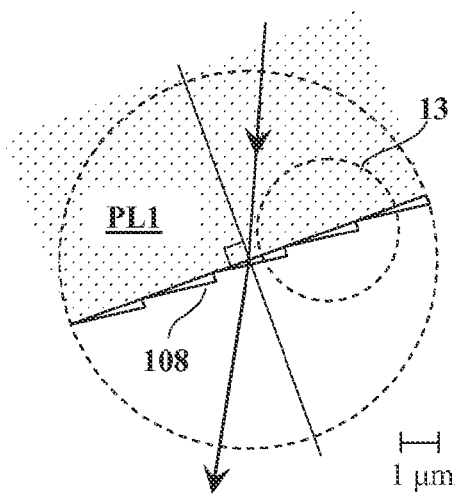
FIGS. 5 and 6 are enlarged views of corresponding regions 5 and 6 in FIG. 1B, illustrating the projection system's phase-Fresnel surfaces.
Figure 6:
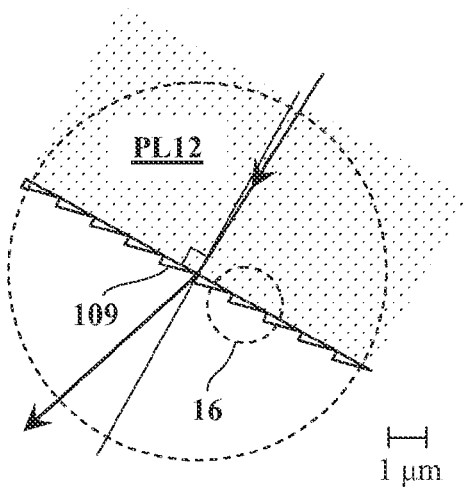

The projection system's phase-Fresnel surfaces 108 and 109 have a form similar to the microlenses, as illustrated by the enlarged views of FIG. 1B regions 5 and 6 shown in corresponding FIGS. 5 and 6. (Phase-Fresnel surface 108 has negative optical power, and surface 109 has positive power.) A 1-micron dimensional reference is shown in the figures. The figures represent the diffractive surfaces near the periphery of the lens apertures where the grating period is smallest. The minimum period is 2.16 micron for surface 108 and 1.04 micron for surface 109. The phase-Fresnel surfaces have a form similar to the microlenses (e.g., $HfO_2$ layers with a facet height of approximately one-quarter micron).

The following sections provide additional detail on the system's components, design methodologies, and alternative embodiments.

3. Printing Process

Figure 7:
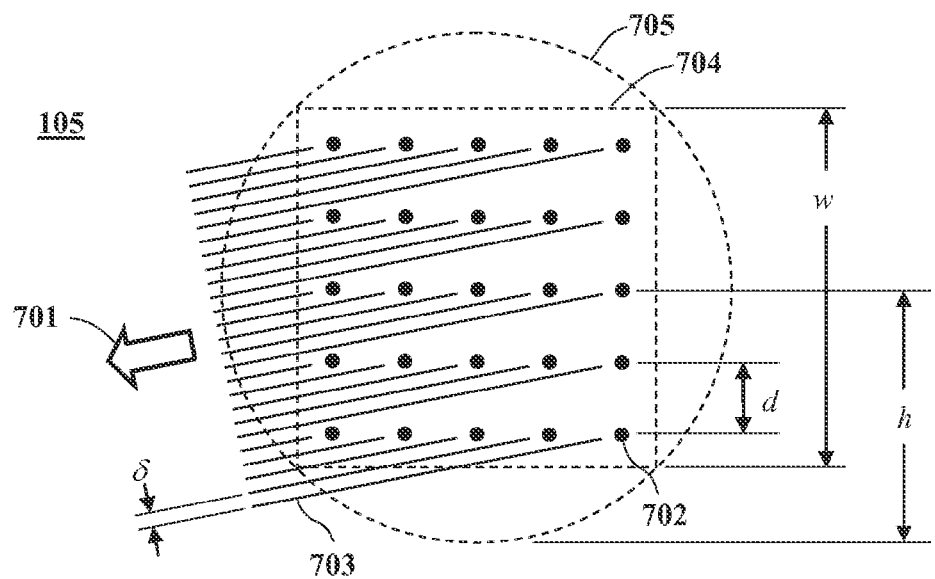
FIG. 7 schematically illustrates the printing process.

FIG. 7 schematically illustrates the printing process, and FIG. 8 tabulates design parameters and equations relating to system printing performance. As illustrated in FIG. 7, the printing surface 105 (shown in plan view) scans in direction 701 so that each focused-radiation spot 702 of a spot array traces a raster line 703 in synchronization with modulation of the spot intensity. The spots are centered on a square grid distributed over a square exposure field 704, which is inscribed within a circular image field 705. (In alternative embodiments, the spots might be centered on a triangular grid to increase the microlens array's fill factor, and the exposure field would not necessarily be square.) The image field radius is denoted h; the exposure field width is w; the center spacing between spots is d; the center spacing between raster lines is $\delta$; and the number of spots per exposure field is N. These quantities, and their relationships defined by the FIG. 7 geometry, are tabulated in FIG. 8.

The image field radius is specified as h=0.8 mm (Eq. 8.1 in FIG. 8), implying an exposure field width of w=1.13 mm (Eq. 8.2). The raster line spacing is specified to be approximately 20 nm ($\delta \cong 20$ nm, Eq. 8.3). (The image's minimum spatial period based on the Nyquist frequency limit of $\lambda/(2$ NA) is 111 nm for a wavelength $\lambda$ of 266 nm and numerical aperture NA of 1.2; thus a 20-nm line spacing is well within the system's optical resolution limit.) There are N raster lines distributed across the width dimension w, implying that $N \cong 56569$ (Eq. 8.4). The specified number of spots is increased to N=65536 so that the spots form a 256-by-256 array (Eq. 8.5). This adjustment reduces the raster line spacing to $\delta$=17.3 nm (Eq. 8.6) There are $\sqrt{N}$ spots distributed across the width dimension w; implying that d=4.42 μm (Eq. 8.7).

The projection system's object plane is imaged onto the image plane at 25× reduction; thus the 0.8-mm image field radius implies an object field radius of 20 mm, and the spot center spacing of 4.42 μm implies a microlens center spacing of 110 μm.

The modulator switching is assumed to be triggered by a clock with synchronization frequency $f_{sync}$=2 MHz (Eq. 8.8). The printing surface is assumed to scan a distance $\delta$ per clock pulse, implying a scan speed of 34.5 mm/sec (Eq. 8.9). The modulators would not necessarily need to switch at a 2 MHz rate, but their ON/OFF transitions are controlled with 0.5-microsecond resolution. If the switching time is 1 microsecond (2 clock pulses), for example, then the distance between switching points along the scan lines would be at least $2\delta$ (i.e., 34.6 nm), but the locations of the switching points would be specified with a positioning resolution of $\delta$. The switching can be controlled in finer time increments (up to the limit of the 80 MHz source repetition rate) to accurately control gray level and exposure dose.

The area scan rate is 39.1 $mm^2$/sec per exposure field (Eq. 8.10). Multiple projection systems can be used in parallel to achieve a higher scan rate. For example, FIG. 9 illustrates an array of 19 projection lenses such as lens 901 covering a 300-mm semiconductor wafer 902 (in plan view). The aggregate area scan rate for 19 exposure fields is 742 $mm^2$/sec, which equates to 37.8 wafers per hour considering only the scan time. Taking into account the throughput overhead from wafer loading, alignment, and scan reversal, the printing throughput could be expected to be of order 20 wafers per hour.

In contrast to prior-art immersion lithography systems, the same throughput level could be maintained at larger wafer sizes by using more projection systems. For example, FIG. 10 illustrates 37 projection lenses 901 covering a 450-mm wafer 902. This system could achieve approximately the same 20 wafer-per-hour throughput as the 19-lens, 300-mm system of FIG. 9. The throughput is limited primarily by the assumed printing grid step (17.3 nm), the SLM clock frequency (2 MHz), the number of modulators and microlenses per SLM (65,536), and the throughput overhead from non-printing operations (approximately 50%).

Assuming an exposure dose of 30 mJ/cm$^2$ (FIG. 8, Eq. 8.11) and optical efficiency of 25% including transmittance and fill-factor losses (Eq. 8.12), the estimated source power requirement per exposure field would be 46.9 mW (Eq. 8.13). (The refractive lens surfaces should be anti-reflection coated to minimize transmittance losses.) The total power for a 19-lens, 300-mm system would be 0.89 W, and for a 37-lens, 450-mm system it would be 1.73 W. The power from a single laser can be partitioned (e.g., by means of a Dammann grating) to supply all of the projection systems.

4. Optical Design

A detailed optical design for the illustrative embodiment is provided in the '166 application's Computer Program Appendix 4 as a Zemax macro (ZPL file), which initializes the design in Zemax. (The macro and associated files will be described in section 5.) The design optimization was not performed in Zemax, but an outline of the design methodology follows.

The optical system is designed from bottom-to-top, using reverse ray tracing from the printing surface 105 to the source 101 (FIG. 1A) to optimize the reverse images of the target exposure points at the source. First, the projection optics are designed to optimize the point-imaging performance between the object plane and image plane over a range of wavelengths (e.g., wavelengths 266, 265.98, and 266.02 nm were used for the illustrative design). In this design phase, optical rays are reverse-traced from a set of design image field points on the image plane (i.e., the printing surface 105 in FIG. 1B) back to the object plane (on the bottom of plate 104). A conical fan of rays defined by the image numerical aperture (NA=1.2) is traced from each image point to the conjugate object spot. (FIG. 2 illustrates meridional limit rays 106 of one such ray fan intercepting object point 202.) The system design parameters are optimized to minimize the aberrated spot sizes of the reverse point images on the object surface.

In principle, the object surface need not be planar, but a flatness constraint is imposed to avoid the complication of fabricating microlenses and SLM components on non-planar substrates. Image distortion need not be controlled because the microlens positioning is determined to accommodate any distortion. The projection system is telecentric at the image (i.e., the ray fan traced back from each image point covers a conical directional range centered on a chief ray that is normal to the image plane). The system is also designed to also be at least approximately telecentric at the object (i.e. the chief rays are approximately normal to the object plane). This constraint is imposed so that the microlenses need not operate at extremely oblique incidence angles, and to avoid extreme distortion of the system's entrance pupil (which would result in highly distorted microlens apertures). The object telecentricity is achieved by using an optimization merit function that includes penalty terms for non-telecentricity.

At this stage the design does not yet include the microlenses, but the rays should be traced back to the microlens plane (the top surface of plate 104) to ensure that there is no caustic or extreme nonuniformity in the ray distribution over the microlens apertures. A caustic will be manifested as a local minimum in the meridional ray-intercept coordinate on the microlens plane as a function of image-space ray angle. A caustic-free, uniform distribution of rays on the microlens plane can be ensured by including in the optimization merit function a penalty term related to the curvature (nonlinearity) of the microlens-plane ray coordinates versus image-space ray direction for each image point. (A uniform ray distribution can also be achieved by imaging each microlens aperture onto the projection system's entrance pupil by means of a focusing element proximate the microlens focal point. This design option will be described more fully in Part 2, section 19.)

The image-field aperture radius is 0.8 mm and the object-field aperture radius is 20 mm, for a 25× demagnification ratio. These aperture dimensions and the axial length of the PL3 . . . PL15 lens group are constrained during optimization. The axial length controls the maximum lens aperture size, which should be small enough to fit the lens packing geometry illustrated in FIGS. 9 and 10. The largest lens element, PL10, has a 26.2-mm aperture radius. The object field size should preferably not exceed this dimension; otherwise it would further constrain the packing geometry. But within this limitation a large object field has advantages in terms of easing microlens fabrication tolerances and enabling the use of a large number of microlenses.

The immersion fluid thickness is 0.5 mm. (The fluid fills the space between the last lens element PL15 and the printing surface, but as noted previously, a solid cover plate could alternatively be interposed between the fluid and the printing surface.) The thickness of the microlens/SLM plate 104 is 1.56 mm, which is chosen to make the microlens diameters approximately 100 μm. (As noted previously, the microlens center spacing is 110 μm.)

After the projection system is defined, the microlens centers are defined by the centroids of the ray fans on the microlens plane, and the intermediate foci are defined by the ray centroids on the object plane. The collimator 102 (FIGS. 1A, 1B, and 2) is designed so that a reverse ray trace of rays through the microlens centers and corresponding intermediate foci converge to the source 101. (The microlenses need not be defined at this stage because the center rays are undeviated by the microlenses, although they are deviated by refraction at the microlens plane.) The optical power balance between collimator elements CL1 and CL2 is determined to achieve substantially achromatic reverse imaging of the center rays at the source.

With the projection and collimation optics both defined, the microlenses are designed to precisely eliminate point imaging aberrations between the source and the image points at the principal design wavelength of 266 nm. As noted in the Overview, the microlenses could be designed as Schupmann doublets to minimize chromatic aberration, but the narrow laser bandwidth and short microlens focal lengths obviate the need for microlens achromatization. A single design wavelength thus suffices for the microlens design.

The microlenses' Fresnel zone patterns are defined by a phase-matching process. For each of a set of design microlens positions, a dense ray fan is reverse-traced from the corresponding image point back to the microlens surface to define a set of design points (ray-intercept loci) in the microlens aperture. A second ray fan is traced from the source to the same design points. The microlens-induced optical phase shift at each design point is defined so that the total source-to-image phase (the sum of the grating phase and the optical phase along the ray segments preceding and following each design point) is constant across the microlens aperture. The grating phase values are fit to a polynomial function of position coordinates on the microlens aperture (with the coordinate origin at the lens center) to define the phase as a continuous function of position. This process is repeated for each of a set of design microlens positions, and the phase polynomial coefficients may themselves be fit to a polynomial function of the microlens center coordinates (relative to axis 107 in FIG. 1B) to define the grating phase as a continuous function of microlens center position.

The functional form of the microlens grating phase is outlined in FIG. 11. The phase is defined in relation to Cartesian coordinates $(x_1, x_2, x_3)$ with the axis 107 corresponding to the $x_1$ axis (i.e., $x_2=0$ and $x_3=0$ on axis 107). The microlenses are on a constant-$x_1$ plane, and the position coordinates $(x_2, x_3)$ within each microlens aperture are decomposed into the microlens center coordinates $(x_2', x_3')$ relative to axis 107 and offset coordinates $(x_2'', x_3'')$ relative to the microlens center, Eq. 11.1. The grating phase gp in cycle units (1 cycle=$2\pi$ radian) is a function of the four coordinates $x_2'$, $x_3'$, $x_2''$ and $x_3''$, Eq. 11.2. (Function arguments are delimited by square braces "[ . . . ]" in FIG. 11.) Based on rotational symmetry of the optical system around axis 107, the phase is invariant under rotation of both vectors $(x_2', x_3')$ and $(x_2'', x_3'')$ by a common angle $\theta$, Eq. 11.3.

With $\theta$ defined as the angle of $(x_2', x_3')$ relative to the $x_2$ axis according to Eq. 11.4, the second function argument on the right side of Eq. 11.3 vanishes (Eq. 11.5). Thus, it suffices to define the phase function for lens centers in the meridional plane $x_3'=0$. For any other $x_3'$ the phase is defined by Eq. 11.5. $gp[x_2', x_3', x_2'', x_3'']$ is invariant under sign inversion of all of the coordinate arguments (from Eq. 11.3 with $\theta=\pi$); thus it suffices to define $gp[x_2', 0, x_2'', x_3'']$ for $x_2'$ non-negative (Eq. 11.6). The phase function has bilateral symmetry across the meridional plane $x_3'=0$ (Eq. 11.7); thus it suffices to define $gp[x_2', 0, x_2'', x_3'']$ for $x_3''$ non-negative. The function $gp[x_2', 0, x_2'', x_3'']$ may be represented as a multivariate polynomial function of three parameters $x_2'$, $x_2''$ and $x_3''$, with the choice of monomial terms limited by the symmetry conditions in Eqs. 11.6 and 11.7. (The phase function's $x_2''$ and $x_3''$ dependence would preferably be modeled using Zernike circle polynomials for optimal numerical precision, but to accommodate Zemax limitations the present design used a standard polynomial representation.)

The Zemax macro in the '166 application's Appendix 4 illustrates the system design for 25 representative microlens positions, with the grating phase for each position defined by an order-14 polynomial in $x_2''$ and $x_3''$. (In Zemax the grating phase is specified in radians, not cycles.) The polynomial coefficients can be determined by performing a least-squares fit to a set of rays defined by a square array of direction cosines in the image space (truncated to the numerical aperture limit). To minimize numerical precision error, the coordinates $x_2''$ and $x_3''$ should be normalized to the nominal microlens aperture radius (0.05 mm) when calculating the least-squares fit. The fit should preferably be applied not to the grating phase directly, but rather to the phase gradient, as represented by finite differences between adjacent data points on the microlens aperture. (A direct fit to the phase itself will tend to result in steep "walls" in the fitting error at the aperture boundary, which can cause spurious ray trace errors and possible manufacturing complications.) The phase polynomial's constant term is not included as a fitting parameter if a gradient fit is performed.

In a variation of the above process, the microlens phase maps are determined from interferometric measurements of the as-built system in order to compensate for manufacturing errors. (Analogous methods are used with conventional lens polishing, Ref. 6.) For each of a set of test microlens positions, a narrow-band radiation beam at the 266-nm design wavelength is directed from a corresponding image point through the projection system 103 and is interferometrically analyzed to determine the beam's phase profile across the microlens aperture. A beam is similarly directed from the source point 101 through the collimator optics, and its phase profile across the microlens aperture is also interferometrically measured. The two phase profiles determine the microlens phase function in the manner described above, using measured data in lieu of ray-trace calculations. A sampling of the phase functions over a limited number of microlenses can be extended to the entire array by interpolation or polynomial fitting. (The symmetry conditions defined by Eqs. 11.5-7 cannot be assumed to hold in the presence of manufacturing errors.) With this process, system aberrations can be reduced to a level that is limited only by the accuracy of interferometric measurement and microlens fabrication.

Manufacturing error compensation can alternatively be implemented by first assembling the entire optical system, including the microlenses, according to the design specification, measuring the entire system's source-to-image wavefront aberrations at selected image points (e.g., by means of miniature Shack-Hartmann wavefront sensors positioned below the image plane), and then designing and constructing a replacement microlens array to correct any measured wavefront errors.

In the above-outlined design process, the phase-Fresnel structures (the microlenses and surfaces 108 and 109 in FIG. 1B) are designed using an "equivalent-element model" in which the structure is represented as a functionally equivalent, infinitesimally thin phase-shifting layer, which induces a discontinuous optical phase shift between incident and transmitted beams across a design optical surface. The design surface is proximate the physical phase-Fresnel structure (e.g., at the substrate), and the optical phase shift is equal to the grating phase on the design surface. The grating phase is defined as a continuous function of position on the design surface, which varies by one cycle between adjacent Fresnel zone boundaries, and it defines the phase relationship between the incident and transmitted electromagnetic fields extrapolated to the design surface. (The physical phase-Fresnel structure has finite thickness, but the fields are extrapolated via analytic continuation to a zero-thickness design surface.) After the lens design is completed, the physical phase-Fresnel structure is designed to produce the desired phase shift in the extrapolated fields. The structure is optimized to achieve high diffraction efficiency and minimal optical scatter within the system's field of view. Examples of optimized phase-Fresnel structures will be illustrated in section 6.

5. The PDF Appendices and Text Files

The Appendices in the '166 application include three ZTG ("Zemax Table Glass") files (SiO2_266.ZTG, CaF2_266.ZTG, IF132_266.ZTG) and two ZPL ("Zemax Programming Language") files (SpotScanSystem_reverse.ZPL, SpotScanRMS.ZPL). Appendix 4 (SpotScanSystem_reverse.ZPL) contains a detailed design specification for the FIG. 1 optical system in Zemax (Ref. 1). The ZTG files should be placed in the Zemax "Glass" directory, and the ZPL files should be placed in the "ZPL" directory. These directory locations are specified in Zemax under the File—Preferences—Folders tab.

The design is initialized in Zemax by starting with an uninitialized design (use File—New to clear the design), invoking the menu command Macros—Edit/Run ZPL Macros, and selecting SpotScanSystem_reverse.ZPL from the pull-down selection list. This sets up a multi-configuration design in which each configuration represents a separate focused-radiation spot and associated microlens position. Twenty-five microlens positions are represented. For each configuration, rays are reverse-traced from the design image point back to the source. After the design is initialized, the RMS phase error of the reverse point images at the intermediate foci (without aberration compensation) and at the source (with aberration compensation) can be calculated and tabulated by running the SpotScanRMS.ZPL macro.

6. Phase-Fresnel Lenses

Applications of phase-Fresnel lenses for achromatization and for lithography are described in the '843 application and in the prior art references cited therein (Miyamoto, cited herein as Ref. 7, and U.S. Pat. Nos. 5,161,057, 5,589,982, and 6,960,773). The '919 application also discusses refractive/diffractive microlens achromats (see the '919 application's FIG. 7 and associated Eqs. 7.1-9 in FIG. 4C). Similar design forms could be used for the projection system's phase-Fresnel surfaces 108 and 109 in FIG. 1B. U.S. Pat. No. 5,623,365 and Ref. 8 describe the use of diffractive lenses for achromatizing lithography projection systems, but these disclosures only consider diffractive structures formed on flat plates. They do not disclose methods for manufacturing achromatizing diffractive lenses on curved substrates or with accuracies required for DUV lithography.

The phase-Fresnel elements are preferably formed in a high-index optical coating material such as $HfO_2$ deposited on the $SiO_2$ substrate, rather than etching or machining the structures directly in $SiO_2$. The high refractive index of $HfO_2$ (2.1 at 266 nm, versus 1.5 for $SiO_2$, Ref. 9) results in a much shallower grating profile with less optical scatter into extraneous diffraction orders relative to an $SiO_2$ grating. The phase-Fresnel structures in the projection optics are preferably formed on glass-to-air lens interfaces (not air-to-glass) to minimize transmission scatter.

The phase-Fresnel gratings can be accurately formed using a multilayer deposition/etch process similar to that described in the '919 application for EUV phase-Fresnel microlenses. The '919 application describes a process in which multiple Mo/Ru bilayers are deposited on a thin, EUV-transparent Si substrate, and are subsequently etched to form a multilevel phase-Fresnel structure, with the Ru layers operating as an etch stop. A similar process is described in U.S. Pat. No. 6,187,211. For DUV lithography at 266 nm, aluminum oxide ($Al_2O_3$) can be used as an etch stop in conjunction with $HfO_2$. $Al_2O_3$ has good transparency and a high refractive index (1.7) at 266 nm (Ref. 9), but it should preferably be used only in very thin layers (e.g., 2 nm) because of the index difference between $Al_2O_3$ and $HfO_2$.

Other material combinations can be used for the phase-Fresnel structures. For example, silicon nitride ($Si_3N_4$), which has a high index (2.2) and only slight optical absorption at 266 nm, could be used in combination with either $HfO_2$ or $Al_2O_3$.

Figure 12A:
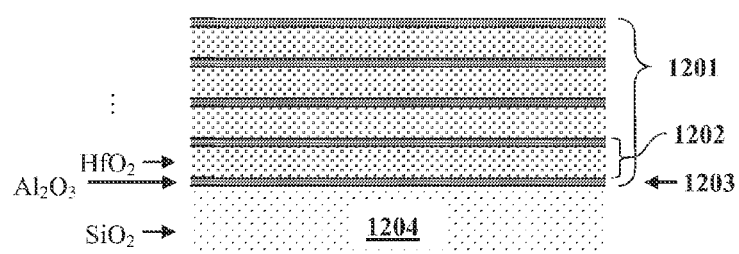
FIGS. 12A-12C conceptually illustrate a process for manufacturing phase-Fresnel grating structures.
Figures 12B, 12C:
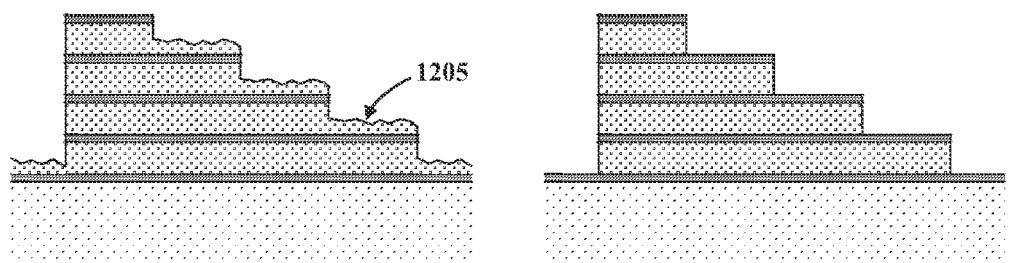

A process for manufacturing phase-Fresnel grating structures is conceptually illustrated in FIGS. 12A-12C. A multilayer film stack 1201 comprising $Al_2O_3/HfO_2$ bilayers (e.g., bilayer 1202) and an $Al_2O_3$ base layer 1203 (shown in cross-section in FIG. 12A) is deposited on an $SiO_2$ substrate 1204 using a process such as atomic layer deposition (ALD). (A similar process has been used to form $Al_2O_3/HfO_2$ bilayer stacks for CMOS gate dielectrics, Ref. 10, and for RF capacitors, Ref. 11.) The layers are selectively removed by a process such as e-beam lithography, focused ion beam (FIB) machining, or mechanical machining (e.g., diamond-point turning), FIG. 12B. The last residual layer 1205 of $HfO_2$ is removed by means of a selective etch, which stops at the topmost remaining $Al_2O_3$ layer, FIG. 12C. (A directed ion-beam etch would preferably be used to form vertical or optimally sloped sidewalls.) By this method, the structure's vertical dimensions are determined by the ALD process, which can achieve angstrom-level tolerances on film thicknesses. The etching or machining process only determines the lateral structure dimensions.

For optimal performance, at least some of the deposited layers for surfaces 108 and 109 in FIG. 1B may need to have a radial thickness gradient across the lens aperture. A process such as masked ALD or uniform ALD followed by ion milling may be used to form the thickness gradient. (Ion milling would not significantly compromise the ALD thickness accuracy if only a small fraction of the ALD-deposited film is removed.) As an alternative to ALD, a deposition process such as masked magnetron sputtering may be used. (A similar process has been used to fabricate graded-thickness EUV mirror coatings, Ref. 12.)

For the axisymmetric surfaces 108 and 109 in FIG. 1B, single-point diamond turning can be used to do most of the patterning (FIG. 12B). The diamond tool would only be used to form shallow steps in a surface whose geometry has already been accurately determined by spherical polishing and ALD deposition. Thus, precise and accurate cutting can be achieved by using real-time surface metrology (e.g., laser interferometry) on the workpiece to provide tool feedback control. If the machining is sufficiently accurate it may be possible to directly cut optimal, continuous-profile Fresnel facets in a single $HfO_2$ film without any etch processes.

Axisymmetric phase-Fresnel structures can alternatively be formed by an "ion turning" process in which a lathe-type machine operates in vacuum with a focused ion beam replacing the cutting tool. (This process has been used to manufacture small machining tools, Ref. 13.) Turning processes could also be adapted to use e-beam or laser-beam writing for lithographic patterning. Non-axisymmetric phase-Fresnel structures such the microlens array on plate 104 can be formed using e-beam lithography or FIB machining.

As illustrated in FIGS. 3A and 3B, the microlenses have very shallow phase-Fresnel structures, with a profile height of approximately one-quarter micron and a minimum facet width of approximately 5 microns. Optical scatter into extraneous diffraction orders is not a significant concern because most of the scatter can be blocked by apertures at the intermediate foci. The lithographic patterning tolerances would be comparatively loose because of the large (25×) demagnification factor (compared to, e.g., 4× for prior-art mask-projection lithography).

By contrast, the projection system's phase-Fresnel structures are more challenging. The facet profile heights are also approximately one-quarter micron, but the minimum facet width is approximately 2 microns for surface 108 (FIG. 5) and 1 micron for surface 109 (FIG. 6). If the system includes polarization-control optics, the surface-109 design is simplified because it would operate with substantially TE (transverse-electric) polarization (i.e., linear polarization with the electric field transverse to the meridional plane at each surface point). Surface 108, on the other hand, would typically need to be designed to work with both TE and TM (transverse-magnetic) polarization.

Figure 13:
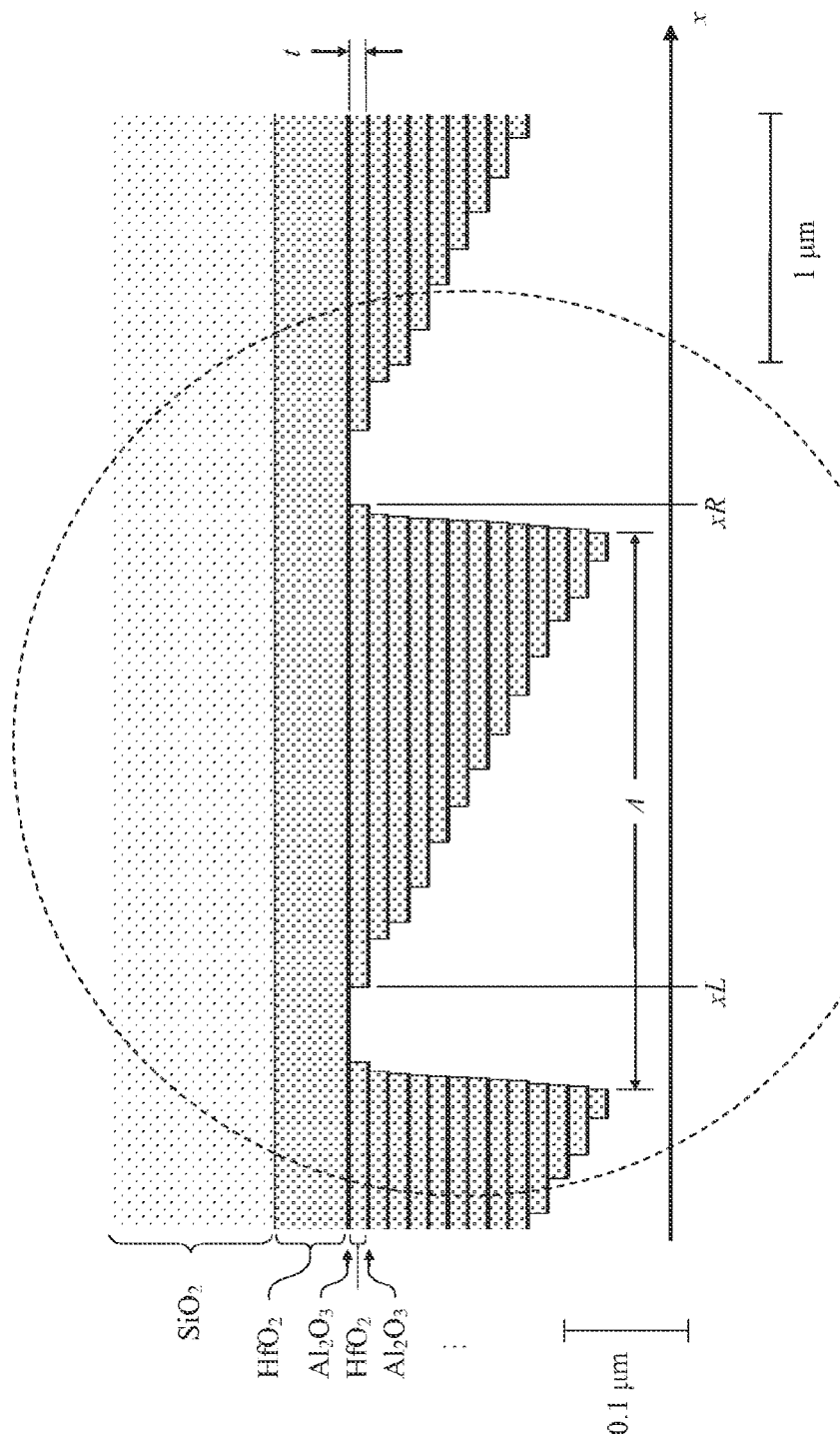
FIG. 13 is an enlarged view of region 13 in FIG. 5 (with exaggerated aspect ratio), illustrating a Fresnel facet structure that could be used on the peripheral region of surface 108 in FIG. 1B.

FIG. 13 is an enlarged view of region 13 in FIG. 5, illustrating a Fresnel facet structure that could be used near the periphery of surface 108. Corresponding design data is tabulated in FIG. 14, and optical performance data is tabulated in FIG. 15. For clarity of illustration, the facet aspect ratio is exaggerated by a factor of five in FIG. 13 (as indicated by the scale bars). Fourteen $Al_2O_3/HfO_2$ bilayers are deposited on the $SiO_2$ lens substrate, starting with a relatively thick (58-nm) $HfO_2$ layer. All other $HfO_2$ layers are 14-nm thick, and all $Al_2O_3$ layers are 2-nm thick. The first deposited bilayer is unpatterned.

The layer thicknesses are denoted t, and the patterned layers' left and right boundary coordinates are denoted as xL and xR, as illustrated in FIG. 13 for a particular layer. These dimensions are tabulated in FIG. 14. The xL and xR coordinates are specified as fractions of the grating period, $\Lambda=2.24$ μm. The assumed material refractive indices at the 266-nm design wavelength are listed in FIG. 14.

Calculated diffraction efficiencies (averaged over TE and TM polarization) of all non-evanescent transmitted diffraction orders are tabulated in FIG. 15 for three incidence angles covering the full operating angle range. (The grating performance was modeled using GD-Calc, Ref. 14.) These calculations are for meridional incident rays. The operating incidence range includes skew rays, but the efficiency characteristic of a skew ray is nearly the same as its meridional projection. Most of the incident energy (about 81%) is diffracted into the first transmitted order. The total energy scattered into extraneous transmitted orders amounts to approximately 1% of the first order, and most of the scattered energy either does not intercept the printing surface or is broadly dispersed over the surface.

The efficiency data in FIG. 15 contains no phase information. The grating's lateral position (along the x direction in FIG. 13) determines the phase in the first transmitted order, which should match the design phase as defined by the previously-described equivalent-element model. The phase differs slightly between TE and TM polarizations. (The difference is of order 1 milliwave.) For the purpose of lens design, the TE and TM phase can be averaged. The phase difference will be manifested in the transmitted beam's polarization state, and is taken into account in the polarization-control optics.

Figure 16:
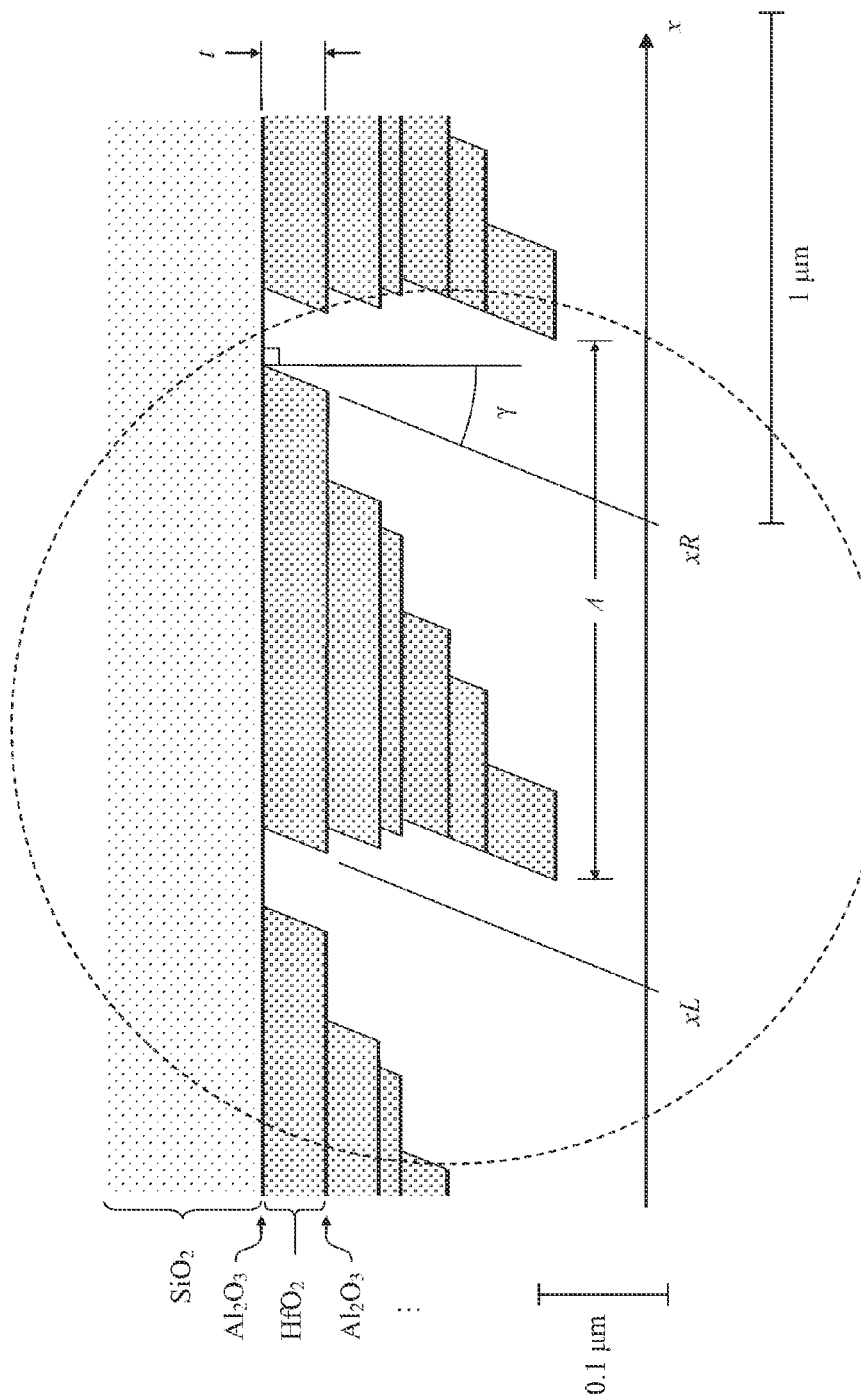
FIG. 16 is an enlarged view of region 16 in FIG. 6 (with exaggerated aspect ratio), showing an illustrative Fresnel facet design for the peripheral region of surface 109 in FIG. 1B.

FIG. 16 is an enlarged view of region 16 in FIG. 6, showing an illustrative Fresnel facet design near the periphery of surface 109. The facet aspect ratio is exaggerated by a factor of 2.5 in FIG. 16. The grating walls are slanted at an angle $\gamma=45°$ from the substrate normal (although the slant angle appears smaller in the figure due to the distorted aspect ratio). The grating structure consists of an unpatterned $Al_2O_3$ base layer and six patterned $Al_2O_3/HfO_2$ bilayers. The $Al_2O_3$ layers are all 2-nm thick, and the $HfO_2$ thicknesses are all individually optimized.

The layer thicknesses are denoted t, and the patterned layers' left and right boundary coordinates are denoted as xL and xR, as illustrated in FIG. 16 for a particular layer. (The xL and xR coordinates are projected onto an x axis in the slant direction, as illustrated.) The design data corresponding to FIG. 16 is tabulated in FIG. 17. xL and xR are specified as fractions of the grating period, $\Lambda=1.06$ μm.

Optical performance data corresponding to FIG. 16 (TE diffraction efficiency) is tabulated in FIG. 18 for three meridional incidence angles covering the full operating range. Based on the x sign convention illustrated in FIG. 16 the grating's operating diffraction order is the −1 order, and the TE efficiency in this order is approximately 82%. In contrast to the FIG. 13 grating, the FIG. 16 structure's efficiency would drop off significantly for skew rays (e.g., to around 76%). In addition, the TM efficiency would be considerably lower (about 56%), and optical scatter into extraneous orders would be higher for TM. Thus, polarization control would be required to achieve high efficiency and low scatter at surface 109.

7. Polarization Control

The projection system may incorporate a form-birefringent polarization-control grating such as that described in the '843 application (see the '843 application's FIGS. 28 and 41-45) and in the prior art cited therein (cited herein as Ref's. 15 and 16). The grating may be formed, e.g., on spherical surface 110 of PL11 or on a buried planar surface 111 within element PL10 (FIG. 1B). Additional form-birefringent structures may be provided on the CL2 planar surface (or on the top of plate 104 if the microlenses are formed on CL2). The laser source and associated polarizing optics provide substantially circularly-polarized radiation to the collimator 102, and the form-birefringent structures operate to make all optical rays substantially TE-polarized (i.e., linearly polarized normal to the meridional plane) at the printing surface 105. (Most of the polarization control functionality can be provided by the projection system, with comparatively shallow CL2 microstructures functioning to only correct small imperfections in the projection system's polarization control.)

Three advantages of polarization control are that (1) it improves lithographic print resolution; (2) it allows use of a high-index, birefringent last lens element PL15 such as sapphire for imaging at a higher numerical aperture; and (3) it allows the last phase-Fresnel surface 109 to be designed for substantially TE-polarized light only.

Figure 44:
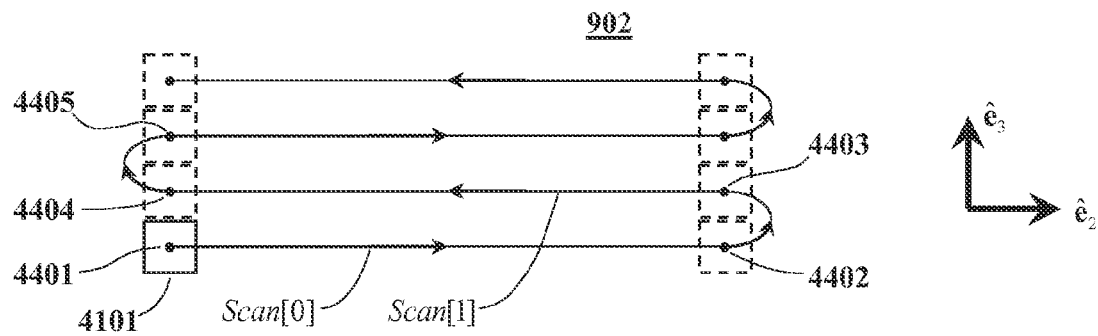
Figure 45:
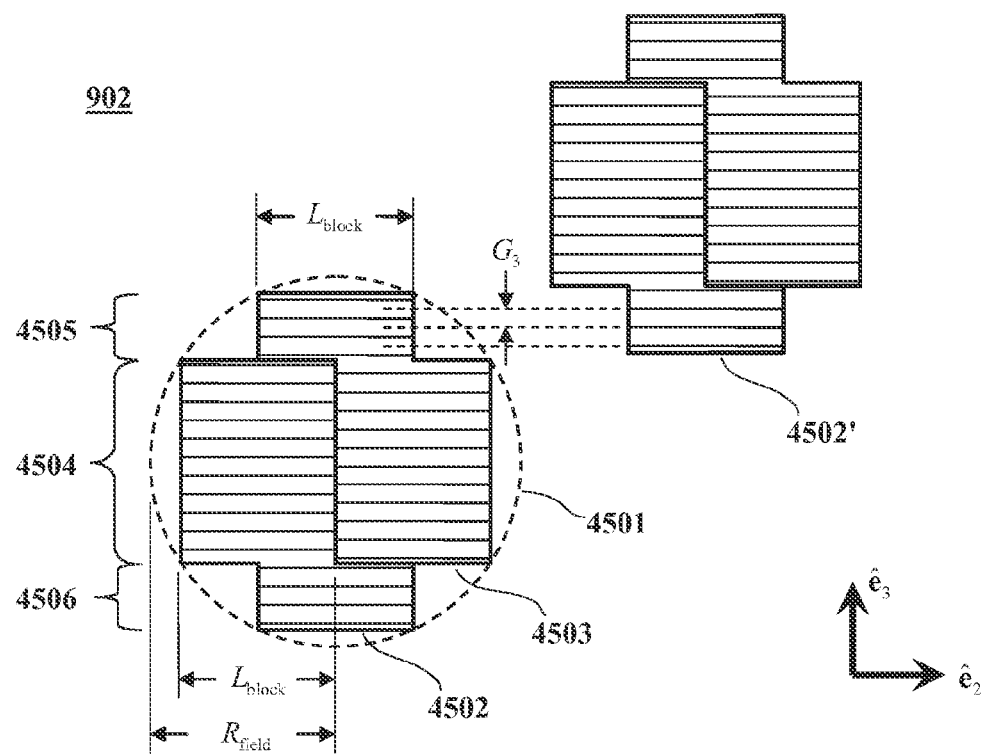
FIG. 45 illustrates an alternative scan configuration that makes more efficient use of a circular image field.

The '843 application illustrates two form-birefringent grating designs, one optimized for uniform transmission efficiency (the '843 application's FIG. 44), and one optimized for minimum grating height (the '843 application's FIG. 45). An advantage of the latter configuration is that the height minimization condition implies that the TE/TM phase shift ("arg[ρ]") will be minimally sensitive to the grating line width (w). The design can alternatively be optimized for uniform grating height across the lens aperture to simplify the manufacturing process. The illustrated design in the '843 application uses $Si_3N_4$ as the grating material. Similar structures have been fabricated as visible-light quarter-wave plates using nonstoichiometric silicon nitride ($SiN_x$; Ref. 17). Alternatively, a material such as $HfO_2$ can be used, and the grating may be formed on an etch-stop layer such as $Al_2O_3$. A grating structure with non-uniform thickness can be formed, e.g., by (1) using ALD to deposit a thin $Al_2O_3$ base layer on an $SiO_2$ substrate, (2) ALD-depositing a thicker, uniform $HfO_2$ grating layer over the $Al_2O_3$, (3) ion-milling the $HfO_2$ to create the desired thickness profile, (4) depositing a second $Al_2O_3$ layer on top of the $HfO_2$, (5) patterning the top $Al_2O_3$ layer using e-beam lithography, and (6) using masked ion milling to create the grating spaces (with the top $Al_2O_3$ functioning as a hard mask and the base layer functioning as an etch stop).

8. The Spatial Light Modulator

The focused-radiation spots may be individually modulated by a spatial light modulator comprising multiple optical modulator elements, one of which is depicted schematically as element 203 in FIG. 2. The '919 application illustrates a modulator as element 1105 in the '919 application's FIG. 11, and identifies a couple of options for the modulator mechanisms including MEMS-actuated shutters, as disclosed in U.S. Pat. Nos. 6,214,633 and 6,701,039 and Ref's. 18 and 19, or a "Stacked-Grating Light Modulator" (SGLM) as disclosed in U.S. Pat. No. 8,687,277. The latter application pertains to reflective modulator mechanisms, but also makes mention of a transmission-type SGLM, which is disclosed in U.S. Provisional Patent Applications 60/116,074 and 60/124,140.

Figure 19A:
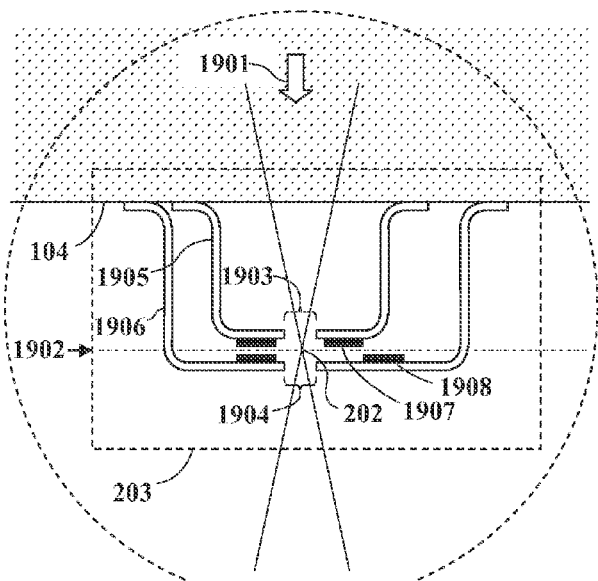
FIGS. 19A-19D illustrate an optical modulator (in region 19A of FIG. 2) comprising paired apertures, which are actuated to move in opposite directions.
Figure 19C:
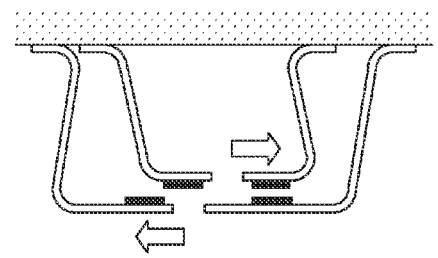
Figure 19B:
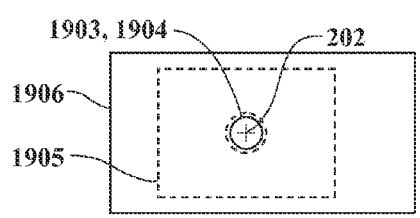
Figure 19D:
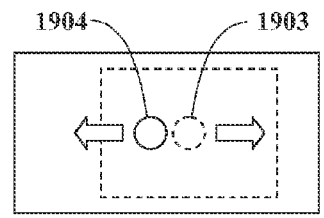

In a preferred embodiment the optical modulators comprise paired apertures, which are actuated to move in opposite directions as illustrated in FIGS. 19A-19D. FIG. 19A is an enlarged view of region 19A in FIG. 2. A modulator element 203 on plate 104 is illustrated in its ON state in FIG. 19A (in a cross-sectional elevation view) and in FIG. 19B (in plan view). Radiation 1901 is directed toward the intermediate focus 202 at the projection system's object plane 1902 and transmits through two apertures 1903 and 1904 proximate the intermediate focus. The apertures are attached to the substrate 104 by means of leaf-spring flexures 1905 and 1906. The apertures are mechanically actuated, e.g., by electrostatic coupling between electrically conductive films 1907 and 1908, to control their lateral positional relationship. In the ON state the apertures are aligned and centered on the intermediate focal point 202 to transmit the radiation. In the OFF state, illustrated in FIGS. 19C and 19D, the two apertures are laterally displaced in opposite directions from their ON positions to block the radiation.

A lateral displacement of each aperture by at least half the aperture diameter would suffice to achieve full beam modulation. In the ON state the aperture boundaries could coincide approximately with the first diffraction node of the Airy diffraction pattern at the focal point. A larger aperture area may be required if the focused beams are highly aberrated at the intermediate foci to nullify aberration in the projection system. But in the illustrated embodiment the projection system is diffraction-limited, so the apertures can be close to the theoretical Airy disk size. The diameter of the first Airy diffraction node is $1.22\lambda/NA$, where $\lambda$ is the wavelength (266 nm) and NA is the object-space numerical aperture, which is smaller than the image-space numerical aperture (1.2) by the demagnification factor (25), i.e. NA=0.048. The node diameter is 6.8 micron; thus the modulator could achieve full modulation with approximately 3.4 microns travel by each aperture.

9. Wafer Encapsulation and Alignment; Athermalization

Figure 20:
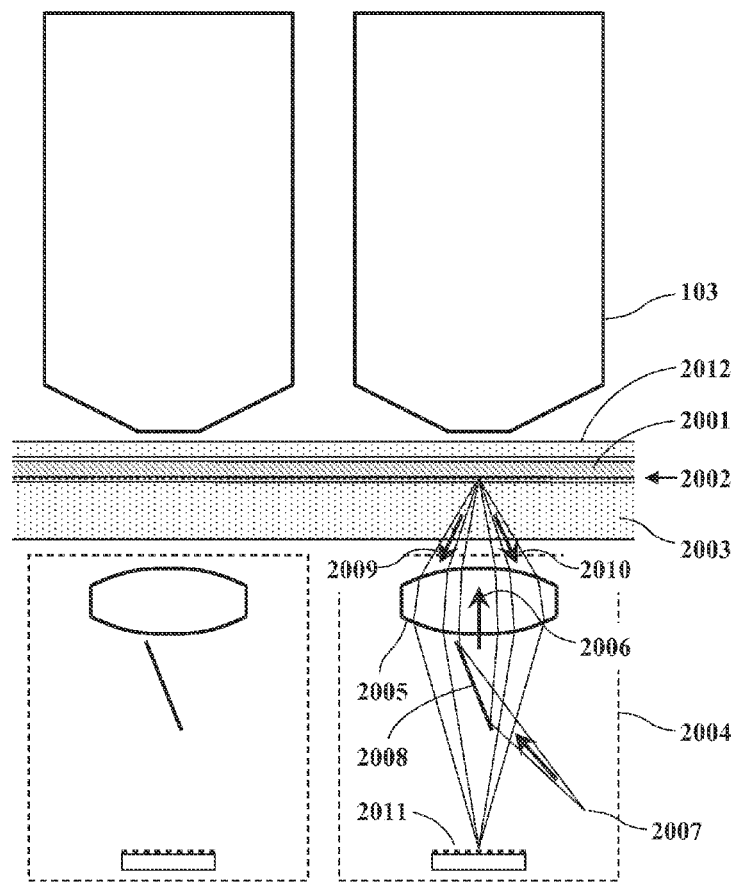
FIG. 20 illustrates a backside wafer alignment technique.

State-of-the-art semiconductor manufacture relies on multi-patterning to form sub-wavelength structures with optical lithography. Pattern alignment requires accurate overlay control, which can be achieved by using a backside wafer alignment technique illustrated in FIG. 20. A semiconductor wafer 2001 (shown in cross-section) is initially processed to form an alignment pattern 2002, in the form of a diffraction grating, on its backside. During subsequent lithography exposure processes, the wafer is vacuum-sealed to a transparent substrate 2003, through which the alignment pattern is viewed with alignment optics 2004. (Multiple viewing systems may operate in parallel to provide substantially full-wafer coverage.) The alignment optics comprises a microscope objective 2005 through which illumination 2006 is directed (e.g., by diverting light from a laser source 2007 with fold mirror 2008). The alignment pattern diffracts the illumination into two reflected beams 2009 and 2010 (+1 and −1 diffraction orders), which are collected by the objective and directed onto an optical detector 2011 conjugate to the pattern. The detector comprises an array of pixel sensor elements, and the optical interference pattern between the two collected beams interacts with the pixel array to form a Moiré signal pattern, which is analyzed to accurately measure and control the wafer's position relative to the lithography system. (Small alignment corrections can be effected by translational motion of the microlens/SLM plate 104 in FIG. 1A, or by actuating the individual microlenses.) Advantages of this method are that the same backside alignment pattern is used for all process steps; the pattern is unaffected by topside processing and has little sensitivity to air currents and temperature; the alignment pattern can cover substantially the entire wafer; and the alignment can be monitored in real time, during the exposure process, at the wafer location directly below each exposure field.

It may also be advantageous to vacuum-seal a thin, transparent cover plate 2012 over the wafer during the lithography exposure process. The cover plate acts as a solid immersion medium. An immersion fluid would be used between the projection lens 103 and the cover plate, but would not contact the wafer. The cover plate could make it easier to focus the projection lens on the wafer, because the autofocus mechanism (e.g., an optical interferometer or capacitive proximity sensor) would rely on detection of the cover plate's top surface without the complication of discerning focus information on complex wafer topography. Also, by separating the immersion fluid from the wafer, the impact of particle contaminants in the fluid on print quality is greatly diminished and the fluid need not be compatible with wafer resist chemistry.

In some applications it may be advantageous to use the cover plate vacuum-seal process to perform contact planarization on a deformable photoresist material. Alternatively, a resist-compatible immersion fluid may be used for optical coupling between the resist and the cover plate. Some applications might use the cover plate itself as the workpiece. In this case a photoresist would be deposited on the cover plate's bottom side, which would subsequently be etched to form useful microstructures.

Aside from alignment and focus, the system may also require athermalization mechanisms, including sensors and controls, to maintain optical imaging performance. The sensors may include, for example, micro-optic Shack-Hartmann wavefront sensors that are positioned below selected image points during the wafer load/unload cycle to detect thermally-induced aberrations. (The Shack-Hartmann sensors may also be used in the manufacturing process to characterize optical aberrations prior to finalization of the microlens design.) Time-variable image distortion can be substantially corrected, e.g., by means of micromechanical actuators coupled to individual microlens elements. Also, passive athermalization can be achieved by the choice of lens materials and lens housing design.

10. Design Variations

The projection system design illustrated in FIG. 1B can be modified to increase the numerical aperture and improve image resolution by using more optical elements, by using aspheric surfaces (or more phase-Fresnel surfaces), or by using a high-index glass for the last lens element PL15. Two glass materials that have been considered for high-NA, 193-nm immersion lithography are sapphire ($Al_2O_3$) and lutetium aluminum garnet ($Lu_3Al_5O_{12}$, also referred to as "LuAg"), but they have not been commercialized because of the high birefringence of crystalline sapphire and the unacceptable absorption and birefringence of LuAg (Ref's 20, 21, 22). However, the absorption and birefringence of LuAg are lower by an order of magnitude at 266 nm (see FIGS. 5 and 6 in Ref. 20 and FIG. 2 in Ref. 21), and the high birefringence of sapphire would not be a limitation if polarization-control mechanisms are employed to ensure TE polarization on the last lens element (Ref. 22). Furthermore, the effects of absorption and birefringence would be greatly diminished by the system's relatively small scale (e.g., 6 mm center thickness for element PL15 versus over 25 mm for the last lens element in U.S. Pat. No. 8,355,201).

For some applications, Schupmann doublet microlenses similar to those described in the '919 application could have advantages over the singlet design described above. The singlet lens form (similar to FIG. 2) and doublet form (similar to the '919 application's FIGS. 10 and 11) are comparatively illustrated in FIGS. 21A and 21B. The singlet form (FIG. 21A) uses a single microlens element 201 to generate each focused-radiation spot by focusing incident radiation through intermediate focus 202. The radiation may be modulated by modulator element 203, and the microlens and modulator may be formed on opposite sides of a solid, transparent plate 104. A Schupmann doublet 2101 (FIG. 21B) comprises a similar microlens element 201 of comparatively lower optical power (i.e., longer focal length) to focus radiation through an intermediate focus 202. But the beam diverging from the intermediate focus is then further diverged by a second microlens element 2102 having negative optical power, so that the emergent beam diverges from a virtual intermediate focus 2103. The optical power can be balanced between elements 201 and 2102 to achieve a substantially achromatic virtual focus 2103. (To some extent, the microlens doublet could also be configured to neutralize slight axial chromatic aberration in optical elements external to the microlens doublet). The beam may be modulated by a modulator 203 proximate the first (real) intermediate focus 202. A solid transparent plate 104 may fill the space between microlens elements 201 and 2102, except for the vicinity of modulator 203. (Plate 104 may comprise two half-plates that are optically contacted on the intermediate focal plane 2104 after the modulator structures have been formed.)

Figure 21A:
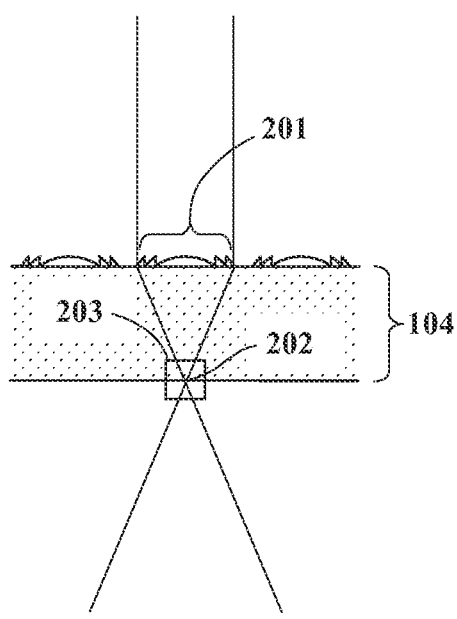
FIGS. 21A and 21B comparatively illustrate a singlet microlens (FIG. 21A) and a Schupmann doublet microlens (FIG. 21B)
Figure 21B:
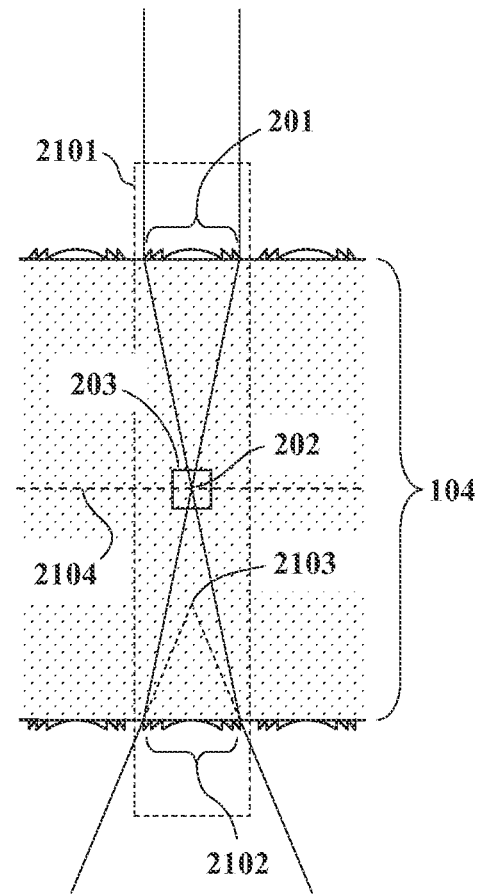

FIG. 21B is similar to the '919 application's FIGS. 10 and 11, but with a couple of differences. The first microlens 201 in FIG. 21B is convex and the second microlens 2102 is concave (not vice-versa, as in the '919 application) because the microlens material has a refractive index greater than 1. Also, the space between the microlenses may be solid (e.g., $SiO_2$, not vacuum as in the '919 application). The geometric relations illustrated in the '919 application's FIG. 8A and Eq. 8.1 in the '919 application's FIG. 4C assume that the medium between the microlenses is vacuum. With a solid medium, the axial distances between the microlenses and the intermediate focal plane 2104 are increased by a factor of the medium refractive index.

The Schupmann microlens configuration has potential advantages in addition to achromatic performance. Dividing the microlens functionality between two elements of comparatively lower optical power can result in a more manufacturable microlens design. The first element 201 can correct aberrations between the source 101 (FIG. 1) and the intermediate focus 202, while the second element 2102 corrects aberrations between the intermediate focus and the printing surface 105, resulting in a substantially aberration-free intermediate focus (except for chromatic). This can be advantageous for the modulator design. The comparatively low optical power of element 201 results in a commensurately large diffraction-limited focus 202, which would be a disadvantage if shutter-type modulators such as the FIG. 19A-19D system are used. But it would also reduce the beam divergence angle at the intermediate focus, which would be advantageous if diffractive modulator elements (described below) are used.

Figure 22A:
FIGS. 22A-22D illustrate several variant microlens forms.

The phase-Fresnel microlenses (either singlet or Shupmann doublet) and the projection system's phase-Fresnel optics can take a variety of structural forms other than those described above. FIGS. 22A-22D illustrate several variant microlens forms. FIG. 22A shows a cross-sectional profile 2201 of a conventional phase-Fresnel surface, which is blazed for optimum first-order efficiency at a particular design wavelength (e.g., 266 nm). This form is similar to microlens 201 in FIG. 3A, but with the profile height exaggerated. The multilevel stepped profile illustrated in FIG. 12C is an approximation to an ideal sloped facet profile illustrated in FIG. 22A.

Figure 22B:
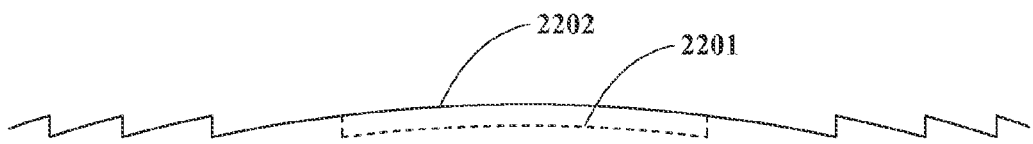

The surface profile shape in FIG. 22A is defined so that the grating phase (i.e., the optical phase discontinuity from the incident to the transmitted beam) varies by one cycle between adjacent facets on the design surface in the equivalent optical model, and the profile steps between facets induce a one-cycle optical phase discontinuity in the transmitted beam. More generally, the facet boundaries on a phase-Fresnel structure can be placed at any position (not just at one-cycle intervals of the grating phase), and the profile steps between facets can induce optical phase discontinuities equating to any integer number of cycles. For example, FIG. 22B illustrates a phase-Fresnel profile 2202, which is similar to profile 2201 except that the center profile step has been omitted.

Figure 22C:
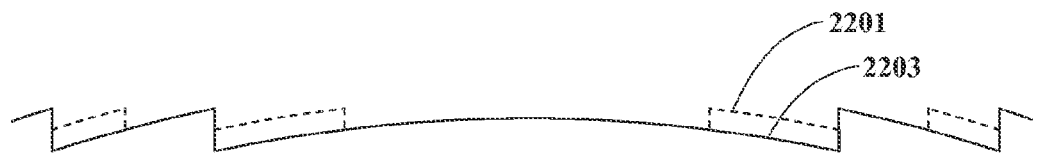

In FIG. 22C, the design grating phase varies by two cycles between profile steps on profile 2203, and the steps induce a two-cycle optical phase discontinuity. Profile 2203 represents a phase-Fresnel structure that is blazed in the second diffraction order at the primary design wavelength (e.g., 266 nm), and is simultaneously blazed in the first order at approximately twice the primary wavelength (e.g., 532 nm), as disclosed in U.S. Pat. No. 5,589,982. (For near-normal incidence the order-m blaze wavelength is approximately equal to $|n-n'|h/m$, where h is the profile step height, and n and n' are the optical medium refractive indices on either side of the profile. n and n' may be functions of wavelength.) A high-order phase-Fresnel structure can be useful for applications requiring multi-wavelength operation, such as absorbance modulation optical lithography, two-color lithography, or multi-wavelength scanning confocal microscopy.

Figure 22D:
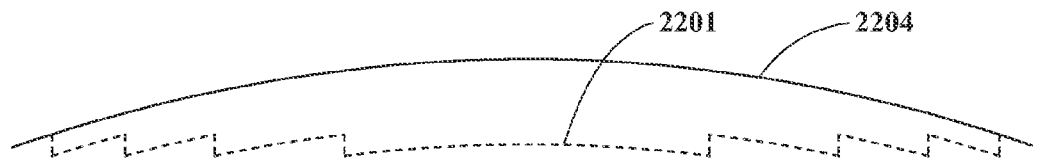

The microlenses can alternatively be continuous-profile, refractive lens structures, as illustrated by profile 2204 in FIG. 22D. Any of the profile forms in FIGS. 22A-22D, including the refractive microlens profile 2204, can be constructed as an approximately equivalent multi-step profile, which is manufactured by a process such as that illustrated in FIGS. 12A-12C.

A phase-Fresnel transmission lens can be roughly characterized as a discontinuous optical surface that induces integer-cycle optical phase discontinuities at the surface profile steps. This characterization is based on geometric optics concepts, but the types of diffractive structures illustrated in FIGS. 13 and 16, which are optimized using accurate electromagnetic simulations, have at least a coarse resemblance to the Fresnel facets illustrated, e.g., in FIG. 22A. The microlens 201 in FIGS. 2 and 3A is illustrated as a phase-Fresnel structure, but can in general be any type of refractive and/or diffractive optical focusing device.

Diffraction optics can also be used as modulator elements, as an alternative to the shutter-type device illustrated in FIGS. 19A-19D. Rather than blocking radiation with a non-transmitting shutter in the modulator's OFF state, the radiation can be directed out of the image field by means of a transmitting, scattering surface such as a phase diffraction grating configured to extinguish the zero transmitted order. Proximate transmission gratings can be used in combination to achieve full beam modulation with very small (e.g., submicron) mechanical motion, as disclosed in U.S. Provisional Patent Applications 60/116,074 and 60/124,140. An optical modulator 203 of this type is illustrated in cross-section in FIGS. 23A and 23B.

A first lamellar grating 2301 comprises a high-index optical medium such as $HfO_2$ deposited on a substrate 2302 such as $SiO_2$ (perhaps with an interfacial etch-stop layer such as $Al_2O_3$). The first grating is proximate a second grating 2303 comprising, e.g., $HfO_2$ on a $SiO_2$ superstrate 2304. In the FIG. 23A configuration, representing the device's OFF state, incident radiation 2305 transmits through the device and the two gratings operate conjunctively to substantially extinguish a transmitted beam's zero order 2306, diverting the radiation into diffraction orders such as the +1 and −1 orders (2307 and 2308). In the ON state (FIG. 23B) one or both gratings are laterally translated to change their positional relationship, and the gratings operate to transmit most of the incident radiation 2305 into the zero order 2306, with comparatively little energy going into the extraneous orders 2307 and 2308.

Figure 23A:
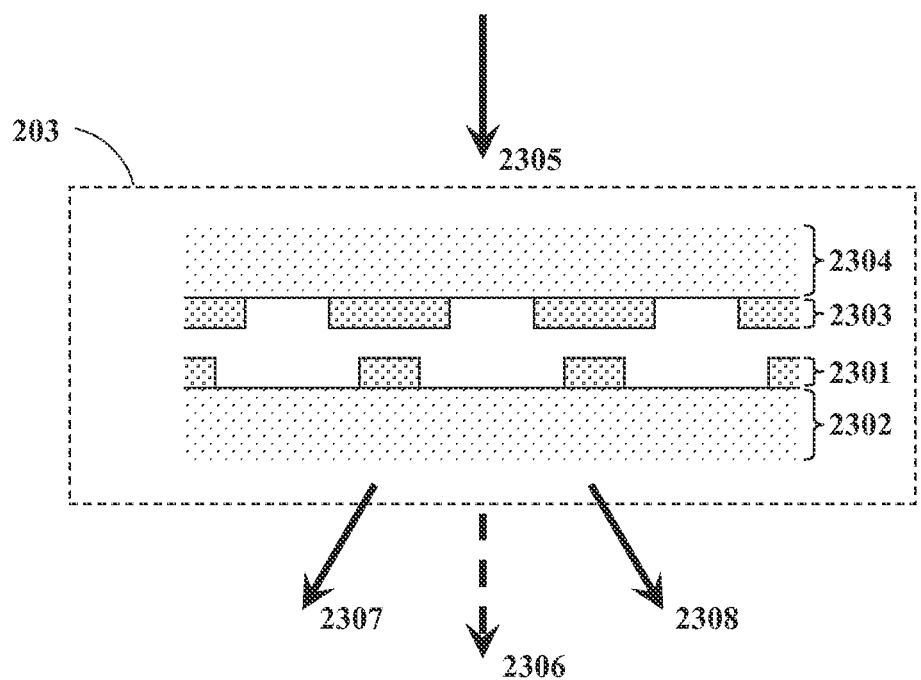
FIGS. 23A and 23B illustrate an optical modulator comprising proximate transmission gratings.
Figure 23B:
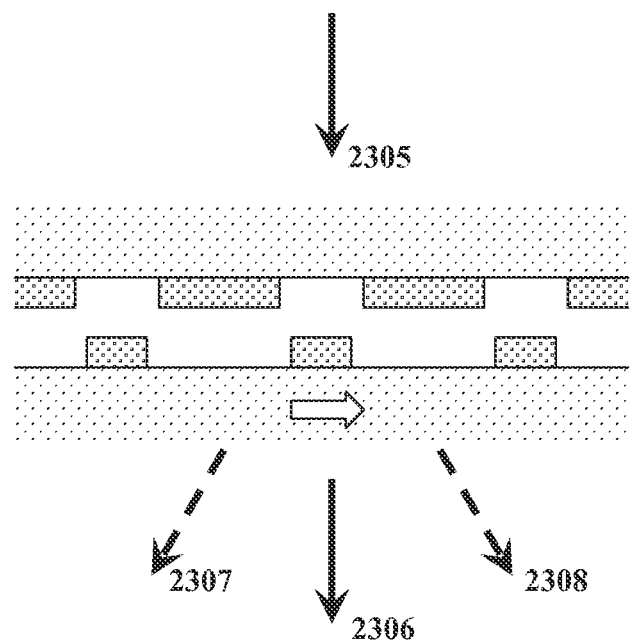

A grating modulator such as that illustrated in FIGS. 23A and 23B has the advantage that it can achieve full modulation with very small (e.g., submicron) translational motion. However, it is difficult to achieve a high extinction ratio over a large range of incidence angles, so the device typically requires highly collimated radiation, implying a comparatively large beam aperture. An advantage of the Schupmann doublet system (FIG. 21B) for this type of modulator is that the low power of the first microlens 201 results in lower beam divergence at the modulator 203 (compare FIGS. 21A and 21B).

The microlens/SLM configurations illustrated in FIGS. 2, 21A and 21B can be modified to use reflective modulators, such as that of U.S. Pat. No. 8,687,277, or other prior-art reflective modulators similar to Texas Instruments' Digital Micromirror Device (DMD, U.S. Pat. No. 5,061,049) or Silicon Light Machines' Grating Light Valve (GLV, U.S. Pat. No. 5,841,579). This can be accomplished by folding the light path before or after the reflective modulator elements. An illustration of this design alternative is provided in the '407 application's FIG. 26.

The projection system design detailed in FIGS. 1A and 1B and in the '166 application's Computer Program Appendix 4 is premised on the use of a 266-nm frequency-quadrupled diode laser with a wide spectral bandwidth (50 pm, compared to less than 1 pm for line-narrowed excimer lasers), necessitating the use of an achromatic projection lens. However, an alternative 266-nm, continuous-wave laser presently available from the OXIDE laser company (Ref. 23) has a bandwidth of only 0.002 pm, which would eliminate the need for achromatization. The OXIDE laser could significantly simplify the projection optics design by eliminating the need for phase-Fresnel lens surfaces 108 and 109 (FIG. 1B). It may still be advantageous to use such structures to provide the functionality of aspheric lens surfaces, but they would not be needed for achromatization.

A phase-Fresnel lens surface that operates only to provide aspheric power could have a much coarser grating pitch (making it more manufacturable and efficient) because most of the lens's optical power can be in its spherical refracting surfaces. For example, the phase-Fresnel structure's line density (i.e., the grating phase gradient) can be constrained to be zero at the lens edge. (By contrast, the line density at the edge of element 108 is approximately 500/mm, and that of element 109 is about 1000/mm.)

The OXIDE laser is available with an output power of up to 2 W. Design concepts for highly efficient continuous-wave DUV lasers with much higher power are under development by William F. Krupke (WFK Lasers), e.g., see U.S. Pat. No. 7,283,576, "Optically-pumped DUV atomic vapor lasers".

Phase-Fresnel lens surfaces could also be used to achromatize projection optics for an excimer laser such as a 193-nm argon fluoride (ArF) laser or a 157-nm fluorine (F2) laser, eliminating the need for laser line narrowing. The F2 laser was abandoned as a successor to the ArF laser for mask-projection lithography, primarily due to the large volume of high-quality CaF2 lens material required, but a maskless, spot-scanning system would use much smaller lens elements of lesser volume. The small lens scale would also greatly reduce the impact of lens birefringence, and the spot projection optics could be designed to neutralize any remaining birefringence effect (e.g., by means of polarization-control element 3106 in the '843 application's FIGS. 31A and 31B). Thus, the F2 laser may be much more practical for scanned-spot-array lithography.

An excimer laser's low repetition rate (e.g. 6 kHz) would be impractically slow with the 17.3-nm square printing grid of the preceding illustrated embodiment (FIGS. 7 and 8), but PART 2 will describe an alternative print strategy that overcomes this limitation.

PART 2

11. Nodal Line Printing

The preceding sections described a spot-scanning system that is designed to provide optimal point-imaging resolution, but lithography systems typically only require good line-imaging resolution. A perfectly uniform line image can be synthesized from a periodic sequence of discrete point exposures along the line if the period is smaller than the optical resolution limit, $\lambda/(2\,NA)$, where $\lambda$ is the wavelength and NA is the numerical aperture in the scan direction. The point exposure spots could be formed with a spot-scanning system using a pulsed laser illumination source, but throughput would be limited by the illustrated embodiment's 17.3-nm scan step, which is unnecessarily small. Throughput can be increased by an order of magnitude by using a scan step close to the $\lambda/(2\,NA)$ resolution limit.

The cross-scan grid step (line pitch) can also be much greater than 17.3 nm, with no compromise in printing resolution, by employing an alternative "nodal line printing" method in which zero- or low-intensity diffraction nodes are used to print narrow lines at a low exposure threshold. The system aperture is configured to produce a periodic pattern of parallel, linear diffraction nodes, and the cross-scan grid step is equal to the nodal line separation. Depending on the aperture apodization the cross-scan step would be of order $\lambda/NA$, where NA is the numerical aperture in the cross-scan direction. This is much larger than 17.3 nm, and the coarser line density would increase throughput by an additional order of magnitude relative to the previous illustrated embodiment. Coarse-pitch line patterns can be interleaved, using prior-art multi-patterning methods or dual-wavelength recording processes, to form high-density line patterns far exceeding the optical resolution limit.

Other design modifications (aperture narrowing in the scan direction, reduced microlens dimensions) could further improve throughput, enabling high-throughput printing with the limited repetition rate of an excimer laser such as a 193-nm ArF laser or a 157-nm F2 laser. Aside from the optical resolution benefit from a smaller wavelength, the laser's comparatively low repetition rate (e.g., 6 kHz) would reduce data flow requirements for the optical modulators, and could enable additional modulation capabilities including dynamic gray-level and spot-centering control. These and other related design alternatives are described more fully in the following sections.

12. Aperture Form

A nodal line pattern can be produced in the focused-radiation spots by using a substantially rectangular aperture stop. The precise sense in which the stop is "rectangular" is defined as follows. (The following prescription of the limiting-aperture geometry represents a preferred aperture form, but is not necessarily the only aperture form that can produce nodal lines.)

Spatial positions proximate a focused-radiation spot will be defined by a vector x, which has coordinate projections $x_1$, $x_2$, and $x_3$ relative to respective orthonormal basis vectors $\hat{e}_1$, $\hat{e}_2$, and $\hat{e}_3$, where $\hat{e}_1$ is directed normal to the image plane and $\hat{e}_2$, and $\hat{e}_3$ are parallel to the image plane with $\hat{e}_2$ directed in the spot's scan direction relative to the printing surface and $\hat{e}_3$ directed in the cross-scan direction; see FIG. 24, Eq. 24.1. (Normally the printing surface is scanned relative to a stationary spot array, so the surface scan direction is $-\hat{e}_2$.) An optical ray intercepting the image plane in a recording medium of refractive index n is characterized by an index-normalized wave vector u with coordinate projections $u_1$, $u_2$, and $u_3$, which has magnitude n; Eq. 24.2.

For an optical system with a circular aperture stop, the image-plane projections of the aperture-transmitted rays' u vectors in the image space are limited to a circle of radius NA, the numerical aperture (Eq. 24.3). For a rectangular aperture inscribed in a circular aperture limit, $u_2$ and $u_3$ are individually limited in magnitude to numerical aperture limits $NA_2$ and $NA_3$, respectively, where the magnitude of vector ($NA_2$,$NA_3$) is equal to the circular limit NA; Eq. 24.4. FIG. 25 illustrates the geometry of the circular aperture 2501 and the inscribed rectangular aperture 2502. The latter aperture is "rectangular" in terms of the aperture-transmitted rays' $u_2$ and $u_3$ projections at the image plane, but the actual physical aperture stop that has this characteristic might not be exactly rectangular.

The aperture is narrowed in the $\hat{e}_2$ direction, i.e., $NA_2$ is significantly smaller than $NA_3$ as illustrated in FIG. 25. The narrowed aperture would elongate the diffraction-limited focus spot on the image plane, as illustrated in FIG. 26. (Focus spot 702 on printing surface 105 is elongated into spot 2601 as a result of the aperture narrowing; cf. FIG. 7.) But the spots are only elongated in the scan direction $\hat{e}_2$; the cross-scan optical resolution in sectional plane 2602 is not impaired. Thus, the system would be suitable for exposing line features aligned in the scan direction. The reduced optical resolution in the scan direction would allow for a larger scan step per laser pulse, so printing throughput would be increased.

The rectangular aperture shape allows multiple projection systems to be juxtaposed with greater packing density, as illustrated in FIG. 27. (Compare to the circular aperture geometry in FIG. 9.) Also, the aperture narrowing increases the number of projection apertures that can cover the wafer 902. For example, circular aperture 2701 is truncated along the scan direction $\hat{e}_2$ to form a narrowed aperture 2702, which is closely juxtaposed to adjacent aperture 2703. This allows more projection systems to cover the wafer 902. The microlens/SLM plate 104 (FIG. 1B) would also need to be truncated to achieve the higher packing density, but the individual microlens apertures can themselves be truncated in the scan direction and juxtaposed more compactly. (The microlenses' aperture shapes would generally approximately match the shape of the aperture stop.) The total number of microlenses and focused-radiation spots per projection system need not be reduced by aperture narrowing, so printing throughput can increase in proportion to the number of projection systems.

A further advantage of aperture narrowing is that it would reduce the effect of polarization on the nodal line contrast. The polarization-control structure on surface 110 or 111 (FIG. 1B) may not be needed. It may suffice to simply direct substantially linearly polarized light into the system, with the polarization direction normal to the cross-scan direction. This could be advantageous for the SLM design if a grating modulator such as that illustrated in FIGS. 23A and 23B is used, because the grating elements would only need to be optimized for linear polarization. (Form-birefringent polarization-control surfaces could follow the SLM elements to compensate for polarization effects in the projection optics.)

13. Pupil Function

In high-resolution line printing operations the system aperture transmittance may be controlled to effect apodization or dipole illumination. The aperture transmittance is described in terms of the resulting electric field distribution inside the recording medium proximate a focused-radiation spot. The field comprises a superposition of plane waves of the form A $$\exp\left[i\frac{2\pi}{\lambda}u\cdot x\right],$$

where x is a spatial position vector (Eq. 24.1), u is an index-normalized wave vector (Eqs. 24.2), $\lambda$ is the vacuum wavelength, and A is a field amplitude vector orthogonal to u—see FIG. 28A, Eqs. 28.1. (Vectors are represented in bold type and function arguments are delimited by square braces "[ . . . ]".) The total electric field E at points x proximate a focus spot has a Fourier integral representation as described by Eq. 28.2. A is represented as a function of only two wave-vector components, $u_2$ and $u_3$, because Eqs. 24.2 implicitly define $u_1$ as a function of $u_2$ and $u_3$; see Eq. 28.3.

We are only concerned with the field in the focal plane, $x_1=0$, so Eq. 28.2 is simplified to Eq. 28.4. (The focus spot's geometric focal point is at $x_2=0=x_3$.) The field is constrained by polarization-control optics to be orthogonal to the cross-scan direction (Eq. 28.5). Based on Eqs. 28.1 and 28.5, the amplitude vector A can be represented by Eq. 28.6, where the scalar factor $P[u_2,u_3]$ represents a "pupil function" in the vicinity of the geometric focus. With substitution of Eqs. 28.6 and 28.3 in 28.4, the coordinate projections of E reduce to Eqs. 28.7-9.

Typically, the $E_1$ field component is insignificant due to the $u_2$ factor in the Eq. 28.9 integral. An accurate characterization of the image field E would require both Eqs. 28.8 and 28.9, but a simplified scalar theory can be used by considering only $E_2$ (Eq. 28.8) and neglecting $E_1$. Furthermore, we will consider pupil functions $P[u_2,u_3]$ that are multiplicatively separable into factors $P_2[u_2]$ and $P_3[u_3]$, for which $E_2[x_2, x_3]$ similarly separates into factors $E_{2,2}[x_2]$ and $E_{2,3}[x_3]$ (Eqs. 28.10-11). We will primarily be concerned with the field's amplitude distribution $E_{2,3}[x_3]$ in the cross-sectional plane $x_2=0$, as defined by the second of Eqs. 28.11.

Figure 29:
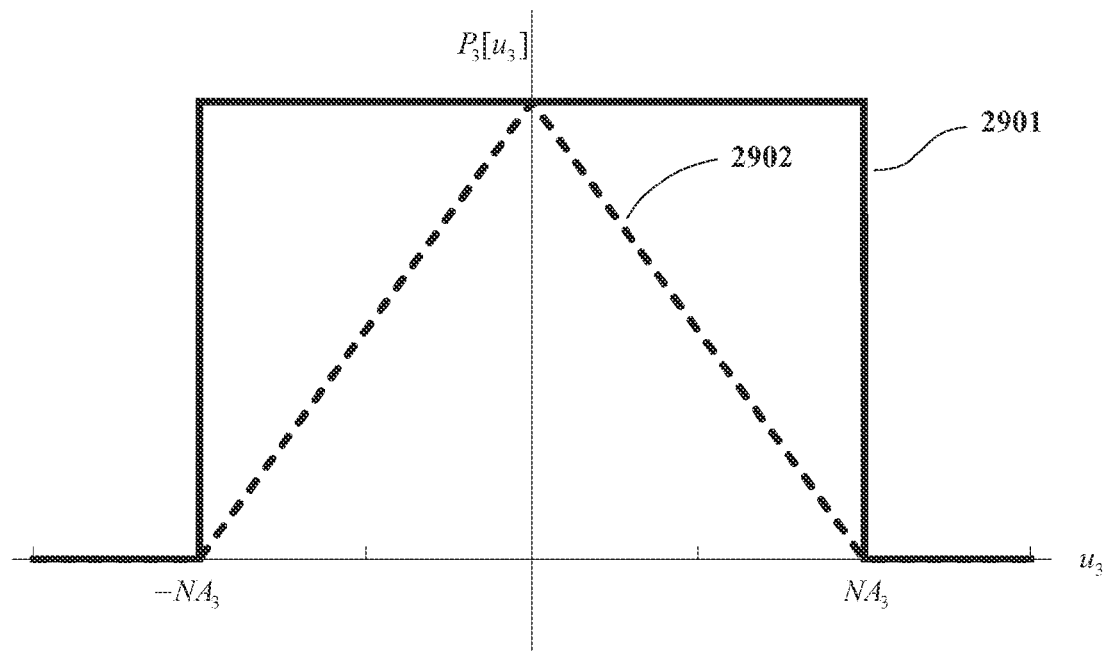
FIG. 29 illustrates a rectangular-aperture pupil function, with and without apodization.
Figure 30:
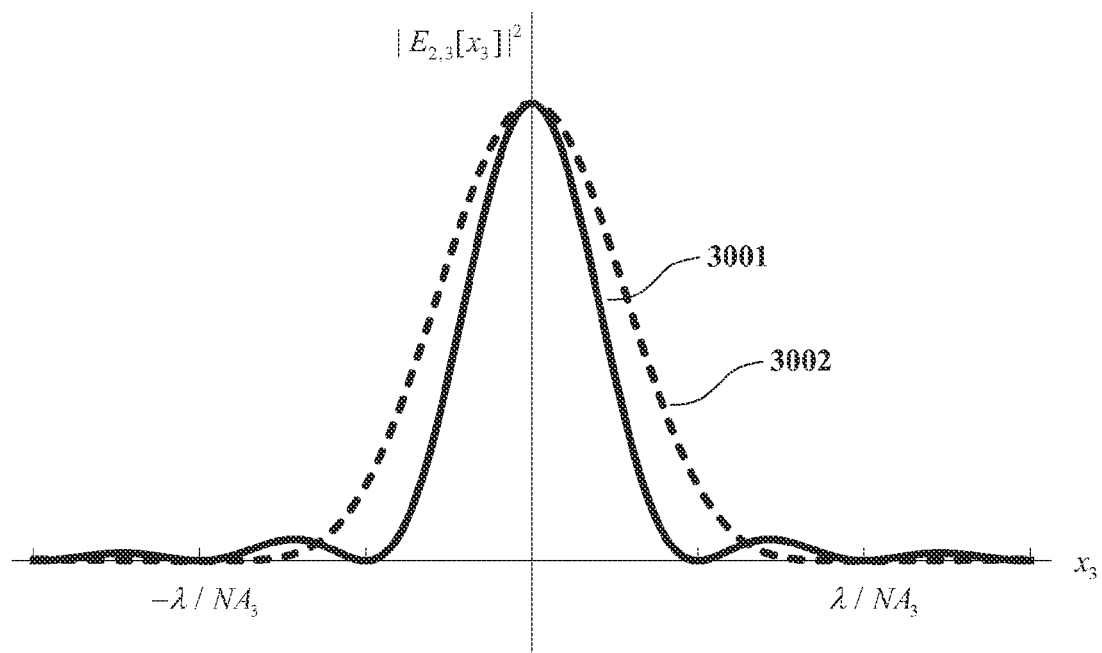
FIG. 30 illustrates the associated focal-plane field intensity.

With $P_3[u_3]$ constant and equal to 1 over the full aperture, $E_{2,3}[x_3]$ has the functional form given in Eqs. 28.12 in FIG. 28B. The pupil function $P_3[u_3]$ is illustrated in FIG. 29 (solid line 2901), and the field intensity $|E_{2,3}[x_3]|^2$ is illustrated in FIG. 30 (solid line 3001). The field has diffraction nodes at $x_3=\frac{1}{2}m\lambda/NA_3$ for non-zero integers m (as indicated in the bottom line of Eqs. 28.12).

The pupil function can be apodized to suppress diffraction tails, although this will broaden the central diffraction peak. For example, the dashed lines in FIGS. 29 and 30 represent an apodized pupil function $P_3[u_3]$ (line 2902) and the corresponding field intensity $|E_{2,3}[x_3]|^2$ (line 3002). (The illustrated intensity plots are peak-normalized.) These functions are defined by Eqs. 28.13. The diffraction nodes are at $x_3=m\lambda/NA_3$ for non-zero integers m.

Focus spots characterized by FIG. 30 could be used to print periodic line patterns with a pitch of order $\lambda/NA_3$, and multiple such patterns can be interleaved or overlaid, using prior-art multi-patterning techniques, to form narrow, densely-spaced line patterns below the optical resolution limit.

Figure 31:
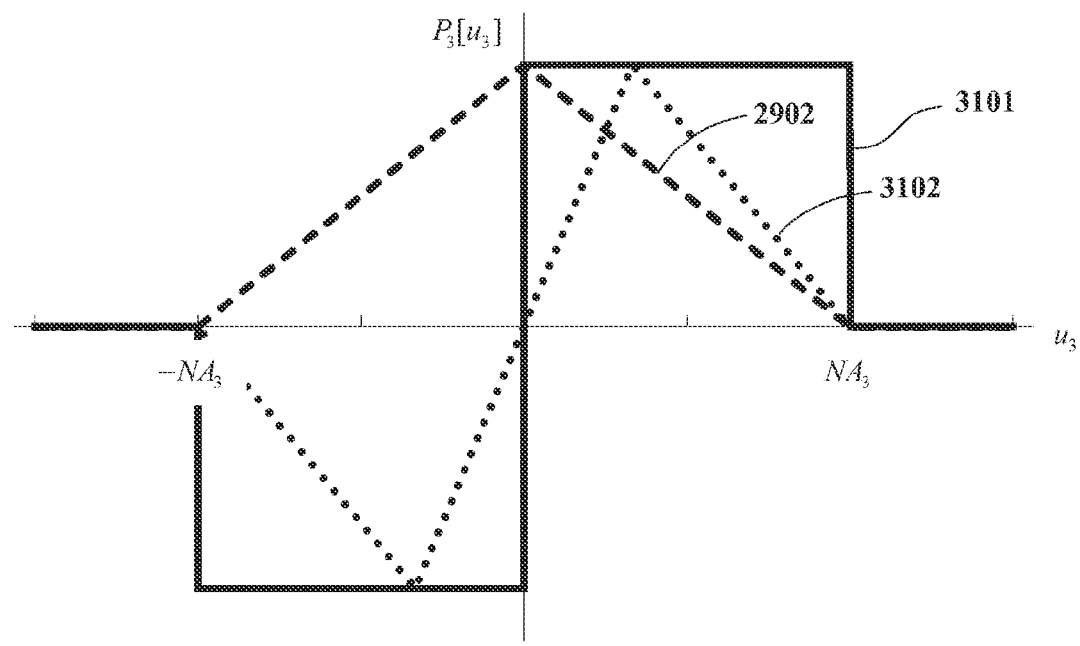
FIG. 31 illustrates the pupil functions used for nodal line printing.

Very narrow sub-resolution resist lines can be formed in a single exposure step by using an alternative pupil function illustrated in FIG. 31. A half-cycle ($\pi$-radian) phase shift is applied to half of the aperture to create a transmittance sign discontinuity at the aperture center (solid curve 3101). The resulting field intensity plot (curve 3201 in FIG. 32) has a diffraction node at the center of the focus spot. The functional form of these curves is defined by Eqs. 28.14. ("sgn" is the sign function, which is +1 for positive arguments and −1 for negative arguments.) The spot pattern has nodes at all integer multiples of $\lambda/NA_3$, including zero.

Figure 32:
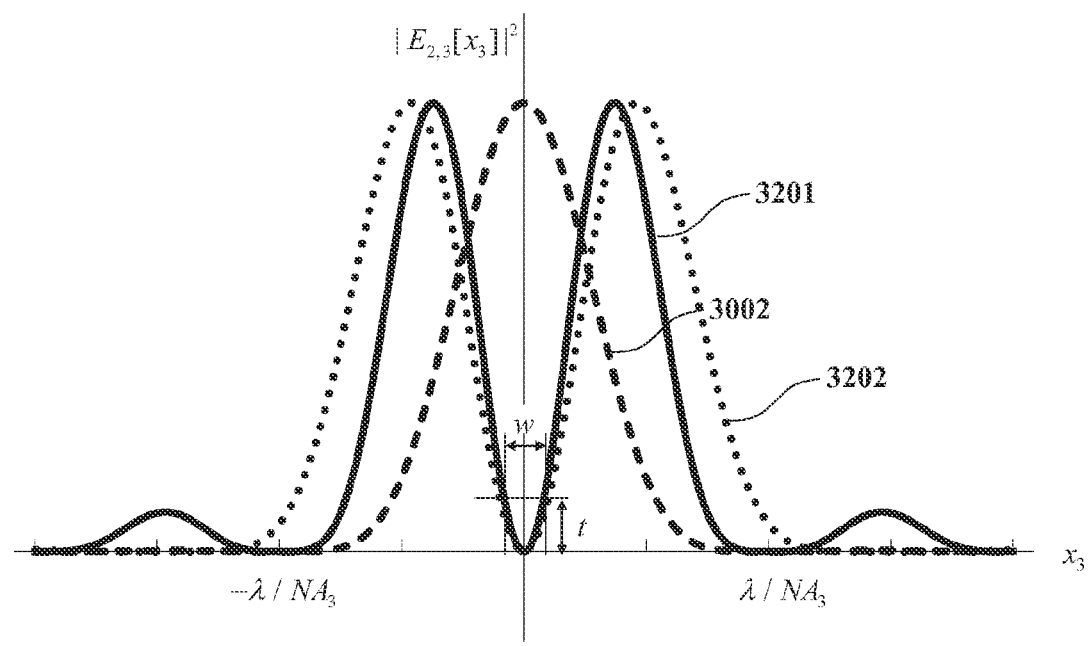
FIG. 32 illustrates the associated focal-plane field intensity.

Narrow resist lines of width w can be exposed at intensity threshold t near the central node, as illustrated in FIG. 32, and multiple lines can be scanned by different spots to form a periodic line pattern with pitch $\lambda/NA_3$. A second scanned exposure can be performed using the apodized pupil function 2902 and corresponding exposure pattern 3002 (dashed curves in FIGS. 31 and 32) to selectively trim the line patterns. (This is a "coarse trim," which may need to be followed by a higher-resolution patterning step to complete the trim process.) A sparse array of line patterns (or spaces, using a negative resist) formed in this manner may be useful for trimming an underlying dense line pattern oriented in the cross-scan direction.

Alternatively, a resist freeze process or multiple litho-etch steps may be used to interleave multiple sparse line patterns to form a dense array with pitch much smaller than $\lambda/NA_3$. A sidewall spacer method can be used to achieve further pitch division. (These types of prior-art multi-patterning methods are discussed in Ref. 24.) Section 20 describes an alternative dual-wavelength recording process in which exposure patterns 3002 and 3201 are simultaneously illuminated with different wavelengths to expose high-density line patterns without intermediate processing steps.

The pupil function can be implemented either on an optical surface proximate the projection system's aperture stop, or on the microlens surfaces. It may be advantageous to image each microlens aperture onto the projection system's entrance pupil by means of a weak focusing element proximate the microlens focal point. Each microlens would then function as a pupil-defining aperture stop for the corresponding image point. (This design option will be discussed more fully in section 19.)

Figure 33:
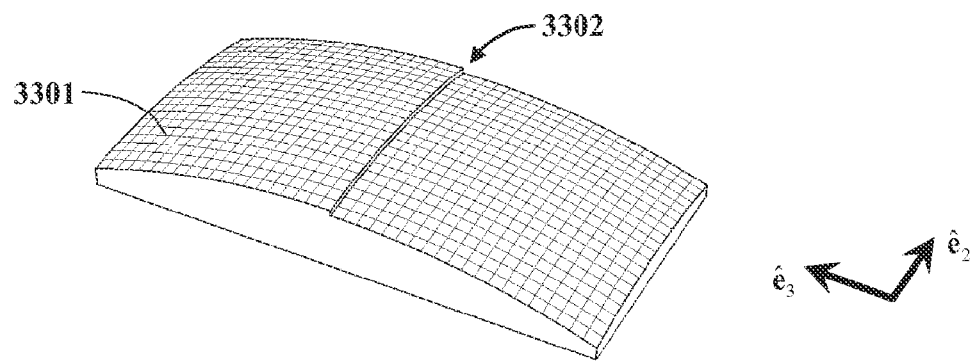
FIGS. 33 and 34 illustrate two alternative lens forms for producing the nodal lines.
Figure 34:
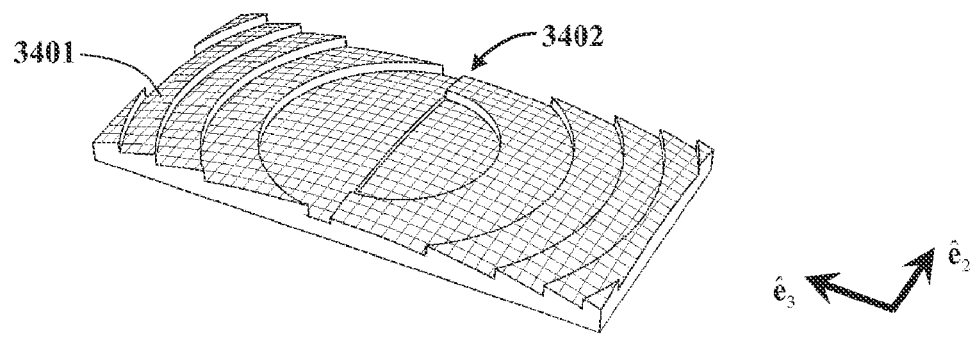

FIGS. 33 and 34 illustrate two alternative microlens forms that could be used to create the nodal lines. FIG. 33 illustrates a rectangular-aperture refractive lens 3301 having a continuous surface profile, except for a step discontinuity 3302 along the scan direction $\hat{e}_2$. The step induces a half-cycle phase discontinuity in the transmitted electromagnetic field (equivalent to a sign change of the field across the step, as illustrated by the sign discontinuity in plot 3101 of FIG. 31). FIG. 34 illustrates a rectangular-aperture phase-Fresnel lens 3401, which has a functionally similar step discontinuity 3402 in its surface topography. The sloped Fresnel zone surfaces illustrated in FIG. 34 can be approximated by stepped, planar surface structures that are formed using an ALD/e-beam process similar to that illustrated in FIGS. 12A-12C.

The surface forms illustrated in FIGS. 33 and 34 could alternatively be used for a large-scale optical surface in the projection optics, although a large phase-Fresnel element would have many more Fresnel facets than the few illustrated in FIG. 34. A structure similar to FIG. 34 can be formed on a projection lens surface by first forming an axisymmetric phase-Fresnel surface pattern via ALD and ion turning, and then ion milling half of the lens aperture to form the half-cycle phase step.

Figure 35:
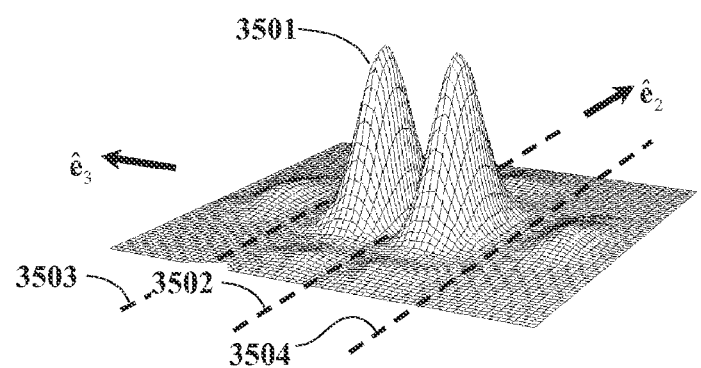
FIG. 35 illustrates a double-peak focus spot used for printing nodal lines.

The lens forms illustrated in FIGS. 33 and 34 create a double-peaked image-plane intensity pattern 3501 (i.e., $|E_2[x_2,x_3]|^2$), as illustrated in FIG. 35, which exhibits nodal diffraction lines such as lines 3502, 3503 and 3504 in the scan direction. Plot 3201 in FIG. 32 represents a cross section of pattern 3501.

The nodal line exposures and trim exposures can be performed with separate microlens groups within a projection system, or with entirely separate projection systems. The apodized pupil function 2902 in FIG. 31 can be implemented by means of an optically absorptive layer formed on a lens surface, or by a diffractive structure, which attenuates the zero order while diverting the first and higher order out of the optical field of view. It would also possible to implement either of the pupil functions 2902 or 3101 in FIG. 31 with an optical structure similarly formed on a mirror surface.

The side diffraction nodes in plot 3201 of FIG. 32 are much flatter than the central node, providing some latitude for variation of the line pitch from the exact period $\lambda/NA_3$ defined by the node spacing. (This characteristic will be useful for spot centration control, discussed in section 19, which enables printing of slightly non-periodic or non-straight line patterns.) Furthermore, the secondary side peaks in plot 3201 (which are noticeable as small bumps in the FIG. 35 area plot) can be suppressed by replacing the discontinuities in pupil function 3101 of FIG. 31 with finite-slope apodized transitions. This would somewhat broaden the two central peaks, but it could allow much greater latitude in the line pitch. With sufficient apodization, the secondary peaks can be substantially eliminated and the line pitch need only be great enough to clear the central peaks. For example, the pupil function represented by plot 3102 (dotted line) in FIG. 31 produces the corresponding field intensity plot 3202 in FIG. 32. The functional form of these plots is defined by Eqs. 28.15 in FIG. 28B. The intensity plot has discrete nodes at integer multiples of $\frac{3}{2}\lambda/NA_3$, but the secondary side peaks are reduced from about 9% to 0.6% of the central peaks in the $|E_{2,3}[x_3]|^2$ plot (curve 3202 versus curve 3201).

Figure 36:
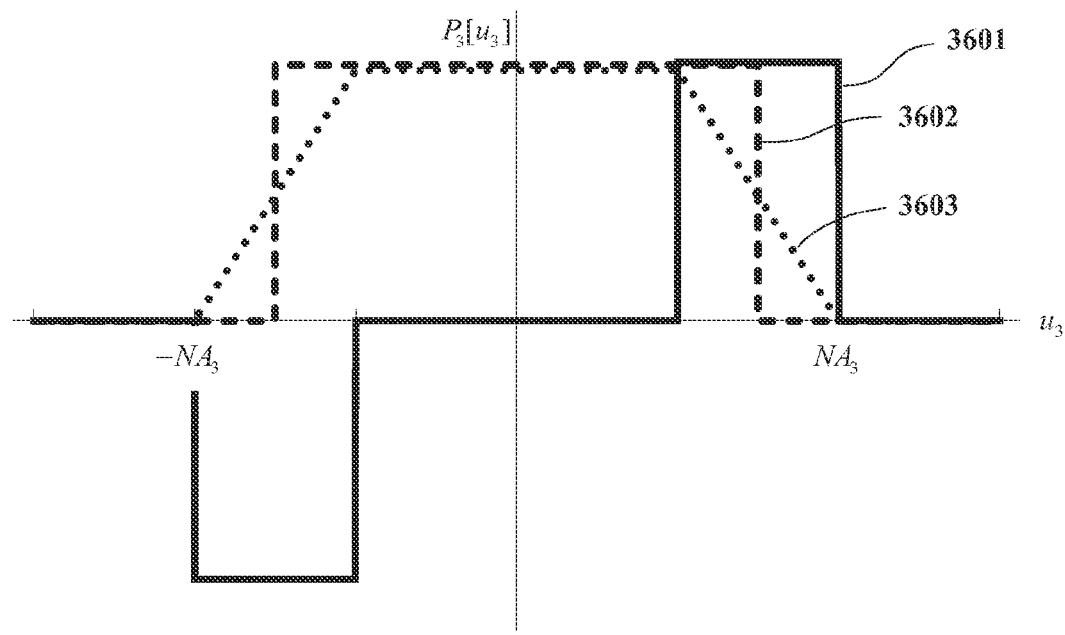
FIG. 36 illustrates alternative pupil functions used for printing higher-density nodal lines using dipole illumination.
Figure 37:
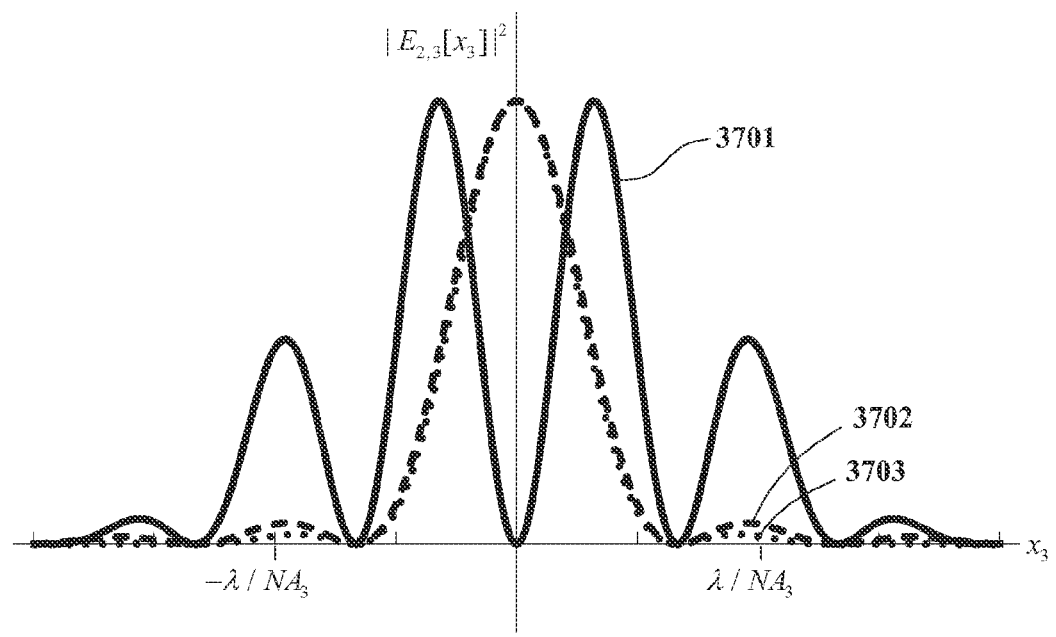
FIG. 37 illustrates the associated focal-plane field intensity.

Higher-density line patterns can be exposed by using dipole illumination, e.g., as illustrated in FIGS. 36 and 37 (although the line pitch is much more constrained with this approach). The middle half of the pupil is masked and one of the remaining sub-apertures is phase-shifted by one-half cycle, resulting in the pupil function $P_3[u_3]$ as illustrated by solid curve 3601 in FIG. 36. The corresponding intensity plot, curve 3701 in FIG. 37, has multiple prominent nodes on a periodic grid of pitch $\frac{2}{3}\lambda/NA_3$; Eqs. 28.16. This exposure pattern would print periodic lines, which may be trimmed with a second exposure using the pupil function and spot profile represented by dashed curves 3602 and 3702; Eqs. 28.17. (Spot profiles 3701 and 3702 have coinciding diffraction nodes where $x_3$ is any integer multiple of $\frac{2}{3}\lambda/NA_3$, except for the diffraction peak in profile 3702 at $x_3=0$.) The trim exposure can alternatively be done with an apodized pupil function, e.g., as represented by dotted curve 3603 in FIG. 36 and dotted spot profile 3703 in FIG. 37; Eqs. 28.18.

14. Interleaved Raster Scan

In the FIG. 7 embodiment rows of focused-radiation spots scan raster lines with raster line spacing δ much smaller than the spacing d between spot rows (e.g., δ=17.3 nm and d=4.42 μm in FIG. 8). The number of spots per row is d/δ (e.g., 256 in the preceding design example). The nodal line printing method uses a much coarser raster line spacing, e.g. δ=$\lambda/NA_3$ for the spot intensity profile 3201 in FIG. 32. For example, with $\lambda$=266 nm and $NA_3$=1.2 the line spacing would be δ=222 nm. Assuming a spot row spacing of d=4.42 μm, the same as in FIG. 8, the number of spots per row would be only d/δ=20. With a 25×-reduction projection lens, and assuming a square lens centering layout, the corresponding microlens row length in the object space would be only 4.42 μm×20×25=2.2 mm, much less than the available 40-mm object field diameter in the FIG. 8 design.

The available field area can be more fully utilized by using an alternative "interleaved raster scan" method described in U.S. Pat. No. 6,498,685. See the '685 patent's FIGS. 35A, 35B, and associated discussion beginning at column 34, line 49. (The particular method described herein is termed a "transitionless scan" in the '685 patent.) This method is primarily applicable with a pulsed light source such as an excimer laser; but a variant of the method described in section 16 can work with a continuous source. The '685 disclosure pertained to a spot-scanning system using an image-plane microlens array, but the method is applied here with an object-space microlens array.

With the raster scan method illustrated in FIG. 7, each raster line is scanned by a single focused-radiation spot, e.g., spot 702 scans raster line 703. (The diffraction-limited extent of spot 702 covers multiple raster lines, but only that spot's geometric image point scans line 703.) With the interleaved raster scan, multiple spots scan each raster line. Each spot prints a series of sparsely centered "dots" as the illumination is pulsed, and the dot patterns printed by different focus spots on the same line are interleaved to form a uniform, dense pattern of evenly spaced dots. (A "dot" is the diffraction-limited exposure pattern formed by a single focused-radiation spot during a single illumination pulse.)

The scan process is illustrated schematically in FIGS. 38-44. Notational symbols and equations associated with the scan process are tabulated in FIG. 38. (There are some notational differences from '685; e.g., the term "Spot" herein replaces "Pixel" in '685 but has a similar correspondence to a microlens and optical modulator element).

In FIG. 39A a raster line 3901 on printing surface 105 is covered by a row 3902 of focused-radiation spots labeled as Spot[ . . . , $i_{spot}$], $i_{spot}$=0, 1, . . . , $N_{spot/row}$−1, where $N_{spot/row}$ is the number of spots in the row. (The spot index $i_{spot}$ is associated with a corresponding microlens and modulator element. The " . . . " preceding $i_{spot}$, and similarly appearing in other indexed expressions, represents additional contextual indices, which will be described below.) The spots are represented schematically by the large circles in FIG. 39A, in which $N_{spot/row}$=3. (Each spot is a diffraction-limited focused-radiation point centered on the corresponding circle.) The raster line comprises image dots represented by "+" marks for unexposed dots, and by small circles for exposed dots. The sequential illumination pulses in multiple line-scan operations are designated as Pulse[$i_{line}$,$i_{pulse}$], $i_{line}$=0, 1, . . . , $N_{line/row}$−1, $i_{pulse}$=0, 1, . . . , $N_{pulse/line}$−1. Index $i_{line}$ labels the line scans, and $i_{pulse}$ labels the pulses within each line scan. $N_{line/row}$ is the number of raster lines scanned by each spot row (i.e., the total number of line-scan operations performed in a printing operation), and $N_{pulse/line}$ is the number of illumination pulses per line scan. The dot exposed by Spot[ . . . , $i_{spot}$] and Pulse[$i_{line}$,$i_{pulse}$] is labeled as Dot[ . . . , $i_{spot}$, $i_{line}$, $i_{pulse}$]. One particular spot, Spot[ . . . , 1], is highlighted in FIGS. 39A-39C and the dots printed by this spot are indicated by filled-in circles. FIG. 39A illustrates the exposure pattern immediately after Pulse [0,0] (the first exposure pulse), when each spot has exposed one dot.

FIG. 39B illustrates the exposure pattern after Pulse[0,1] (the second pulse). The spots are intensity-modulated by an object-plane spatial light modulator in synchronization with the scanning mechanism and the illumination pulse generation. For the purpose of illustration, FIGS. 39A-39C show the dot exposure pattern with all of the modulators held in their ON states. The scan direction of the focused-radiation spots relative to the printing surface is indicated by vector $\hat{e}_2$ (directed left-to-right) in FIG. 39B, and $\hat{e}_3$ points in the cross-scan direction. (In practice, the spots may be substantially stationary while the printing surface is physically scanned from right to left, as illustrated by the right-to-left direction arrow 701 in FIG. 7.) The image surface points are parameterized by $x_2$, $x_3$ position coordinates with the $x_2$ and $x_3$ axes aligned to $\hat{e}_2$ and $\hat{e}_3$, respectively. The printing grid step in the $\hat{e}_2$ direction (i.e., the dot center spacing) is indicated as $G_2$ in FIG. 39B, and the $x_2$ step per pulse is $N_{dot/pulse} \cdot G_2$ where $N_{dot/pulse}$ is an integer. The $x_2$ center offset between focused-radiation spots is $N_{dot/spot} \cdot G_2$ where $N_{dot/spot}$ is an integer. (In FIGS. 39A-39C $N_{dot/pulse}$=3 and $N_{dot/spot}$=5.)

FIG. 39C illustrates the print pattern after a large number of pulses. The spots' exposure patterns are interleaved to expose all dots that have been traversed by all spots in the row, without any multiple-exposed dots. (The dots' geometric image points do not overlap, although each dot's diffraction-limited extent will generally overlap adjacent dots). Complete and non-redundant exposure coverage will be achieved, as illustrated, if $N_{dot/pulse}$ is equal to $N_{spot/row}$, and if $N_{dot/pulse}$ and $N_{dot/spot}$ are relatively prime, Eqs. 38.1 and 38.2 in FIG. 38. (In Eq. 38.2 "GCD" denotes the greatest common divisor.)

In some designs it may be advantageous to print separate, interleaved sets of dots on a raster line with separate spot rows or separate line scans covering the same line. In this case $G_2$ is defined as the $x_2$ grid step of the dots printed by a single spot row in a single line scan. The composite, interleaved exposure pattern will have a dot spacing of $G_2/n$ for some integer n greater than 1.

Figure 40:
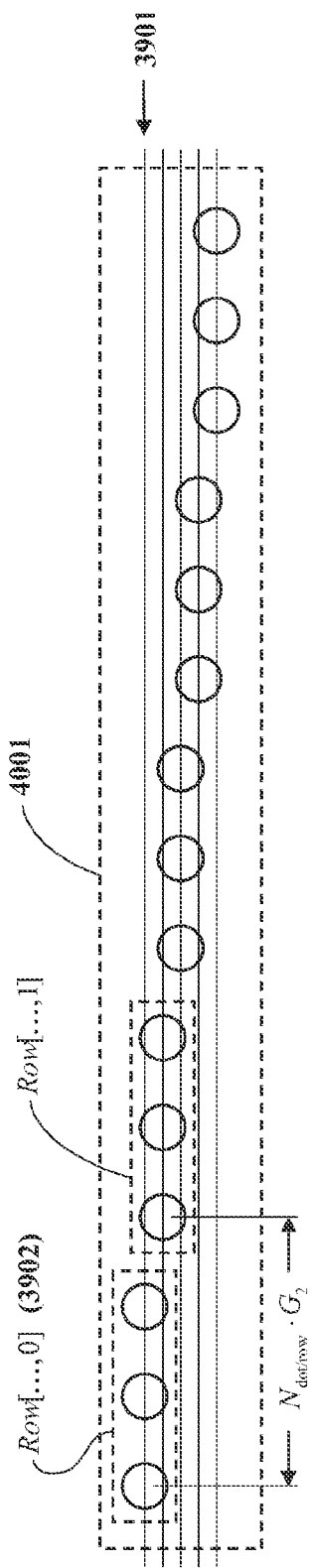

$N_{dot/spot}$ should be sufficiently large to accommodate the microlens center spacing in the object space. Additional raster lines are scanned by similar spot rows in an echelon configuration, as illustrated in FIG. 40. The spot rows in the echelon form an "echelon block" 4001. The rows are labeled as Row[ . . . , $i_{row}$], $i_{row}$=0, . . . , $N_{row/block}$−1, where $N_{row/block}$ is the number of spot rows per block. (Row[ . . . , 0] corresponds to spot row 3902 in FIG. 39A, which scans line 3901.) Spot $i_{spot}$ in Row[ ..., $i_{row}$] is labeled as Spot[ ..., $i_{row}$, $i_{spot}$], and the dot exposed by this spot in Pulse[$i_{line}$,$i_{pulse}$] is labeled as Dot[ ..., $i_{row}$, $i_{spot}$, $i_{line}$, $i_{pulse}$]. The $x_2$ offset between echelon rows is $N_{dot/row} \cdot G_2$, where $N_{dot/row}$ is the echelon step, in dot units, per row: $N_{dot/row} = N_{dot/spot} \cdot N_{spot/row}$, Eq. 38.3.

Figure 41:
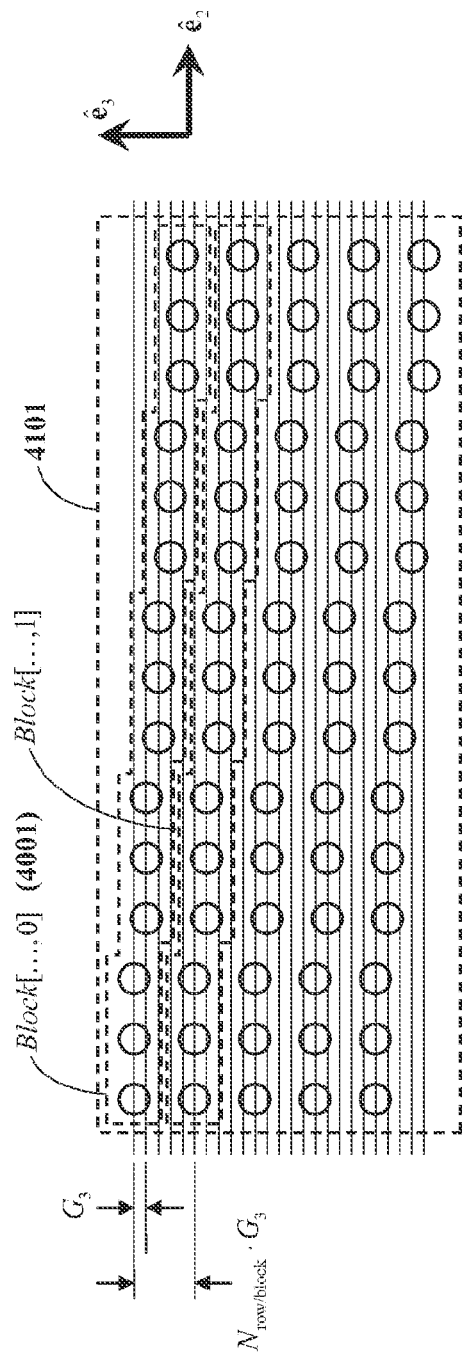

Multiple echelon blocks are combined to cover a projection system's image field 4101, as illustrated in FIG. 41. The echelon blocks are labeled Block[ ..., $i_{block}$], $i_{block}=$ 0, 1, ..., $N_{block/field}-1$, where $N_{block/field}$ is the number of blocks per image field. (Block[ ..., 0] corresponds to block 4001 in FIG. 40.) Spot row $i_{row}$ in Block[ ..., $i_{block}$] is labeled Row[ ..., $i_{block}$, $i_{row}$]; focused-radiation spot $i_{spot}$ in this row is labeled as Spot[ ..., $i_{block}$, $i_{row}$, $i_{spot}$]; and the dot exposed by this spot in Pulse[$i_{line}$,$i_{pulse}$] is labeled as Dot[ ..., $i_{block}$, $i_{row}$, $i_{spot}$, $i_{line}$, $i_{pulse}$].

The printing grid step (raster line center spacing) in the $\hat{e}_3$ (cross-scan) direction is indicated as $G_3$ in FIG. 41 (equivalent to $\delta$ in FIG. 7). Echelon rows have an $x_3$ offset (center spacing) of $G_3$, and the $x_3$ offset between echelon blocks is $N_{row/block} \cdot G_3$. The total number of spot rows per image field is $N_{row/field} = N_{row/block} \cdot N_{block/field}$, Eq. 38.4.

In some designs it may be advantageous to print separate, interleaved sets of raster lines with overlapping image fields or separate line scans. In this case $G_3$ is defined as the center spacing of the raster lines scanned over a single image field in a single line scan. The composite, interleaved exposure pattern will have raster line spacing of $G_3/n$ for some integer n greater than 1. Also, in FIG. 41 there is no $x_2$ offset between echelon blocks, but in some designs it may be advantageous to include such an offset. (Designs illustrating these variants will be described in sections 15 and 17, and illustrated in FIGS. 45 and 52.)

Figure 42:
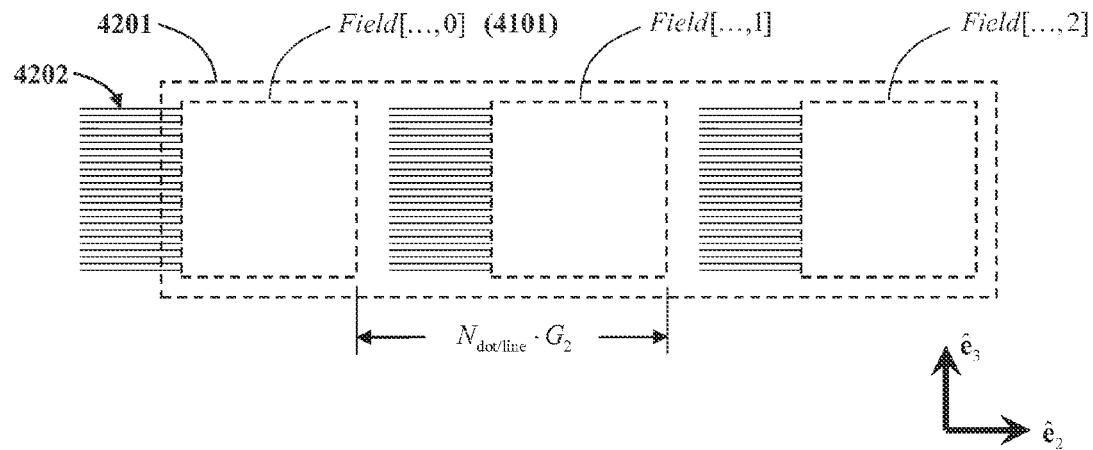

Multiple image fields are combined in field rows, e.g. row 4201 in FIG. 42. The fields are exposed through separate projection systems and are simultaneously scanned to cover an extended $x_2$ range in a single line-scan operation. The fields are labeled as Field[ ..., $i_{2\,field}$], $i_{2\,field}=0, 1, ...$ (Field[ ..., 0] corresponds to field 4101 in FIG. 41.) All fields in a field row have the same $x_3$ position, and have an $x_2$ offset (center spacing) of $N_{dot/line} \cdot G_2$, where $N_{dot/line}$ is the line-scan distance in dot units: $N_{dot/line} = N_{dot/pulse} \cdot N_{pulse/line}$, Eq. 38.5. If the line scan were not terminated after $N_{pulse/line}$ pulses, then the positions occupied by Field[ ..., $i_{2\,field}$] at exposure pulses Pulse[$i_{line}$,$N_{pulse/line}$], Pulse[$i_{line}$, $N_{pulse/line}+1$], etc. would coincide with the positions of the adjacent field, Field[ ..., $i_{2\,field}+1$], at Pulse[$i_{line}$,0], Pulse[$i_{line}$,1], etc. Thus, the dot lines printed by adjacent fields seamlessly join to form extended lines. (FIG. 42 schematically illustrates the exposed lines 4202 part way through the scan operation.)

Figure 43:
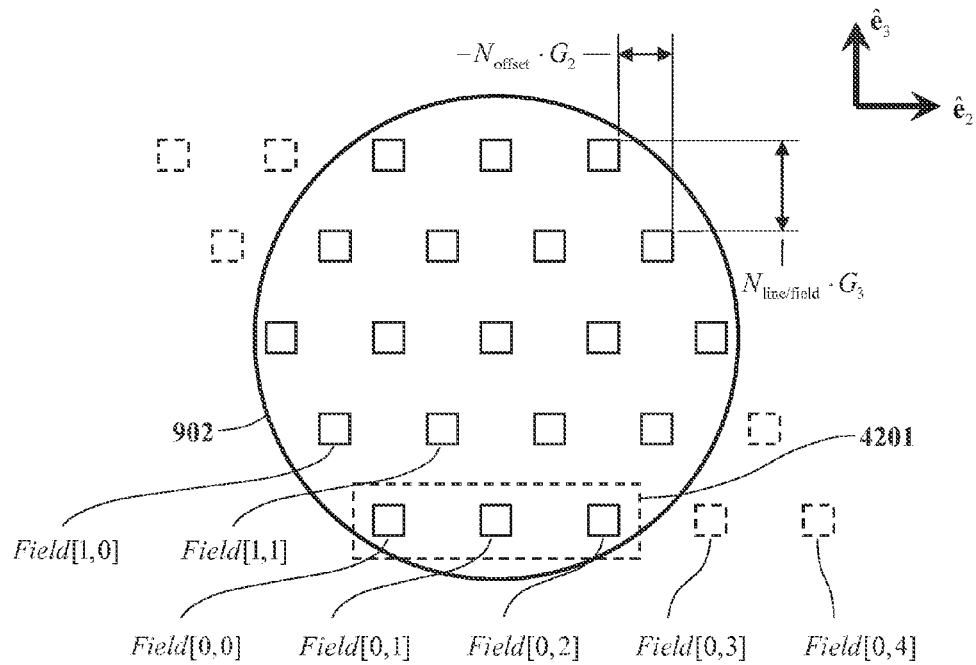

Multiple field rows with different $x_3$ positions are simultaneously scanned, as illustrated in FIG. 43, to cover a printing surface such as the semiconductor wafer 902 in FIG. 9. (FIG. 9 illustrates a distribution of projection lenses 901 above the wafer, whereas FIG. 43 illustrates the corresponding image fields on the wafer surface. FIG. 27 shows an alternative projection aperture layout.) The fields are labeled Field[$i_{3\,field}$,$i_{2\,field}$], where $i_{3\,field}=0, 1, ...$ (The $i_{3\,field}$ index values correspond to field rows, with row 4201 in FIG. 42 corresponding to $i_{3\,field}=0$.) For notational simplicity, the labeling includes some fields that do not exist. Only the fields illustrated as solid squares in FIG. 43 exist; those illustrated as dashed squares (e.g. Field[0,3]) are not used because they are near or outside the boundary of the printing area 902. The field rows have an $x_3$ offset (center spacing) of $N_{line/field} \cdot G_3$, where $N_{line/field} = N_{line/row} \cdot N_{row/field}$, Eq. 38.6. There is an $x_2$ offset of $N_{offset}$ dot units between field rows, which is indicated in FIG. 43 as $-N_{offset} \cdot G_2$ (with the minus sign indicating that $N_{offset}$ is negative, as illustrated). In the FIG. 43 illustration $N_{offset}$ is the same for all field rows, but it may potentially be a function of the field row index $i_{3\,field}$.

FIG. 44 illustrates the scan pattern traced by a particular field 4101 relative to printing surface 902. All fields follow similar scan paths. (In practice, the printing surface is typically scanned relative to substantially stationary image fields.) Field 4101 traces multiple line scans, which are labeled Scan[$i_{line}$], $i_{line}=0, 1, ..., N_{line/row}-1$. Illumination pulse $i_{pulse}$ in Scan[$i_{line}$] is Pulse[$i_{line}$,$i_{pulse}$]. The field first does a line scan (Scan[0]) in the $\hat{e}_2$ direction from position 4401 to position 4402, making $N_{pulse/line}$ pulsed exposures (Pulse[0,0], ..., Pulse[0, $N_{pulse/line}-1$]) while stepping by $N_{dot/pulse} \cdot G_2$ between pulses. It then moves to position 4403, which is displaced from position 4402 by $N_{row/field} \cdot G_3$ in the $\hat{e}_3$ direction. (No exposures are made in this step.) From position 4403 the field does a second line scan (Scan[1]) in the reverse direction ($-\hat{e}_2$) to position 4404, making pulsed exposures Pulse[1, $N_{pulse/line}-1$], ..., Pulse[1,0] (with the time sequence labeled in decreasing order of the second Pulse index). The field then again steps by a distance $N_{row/field} \cdot G_3$ in the $\hat{e}_3$ direction to position 4405, and the process repeats until $N_{line/row}$ line scans have been performed.

Echelon block $i_{block}$ in Field[$i_{3\,field}$,$i_{2\,field}$] is labeled as Block[$i_{3\,field}$, $i_{2\,field}$, $i_{block}$]; spot row $i_{row}$ in this block is labeled Row[$i_{3\,field}$,$i_{2\,field}$,$i_{block}$,$i_{row}$]; focused-radiation spot $i_{spot}$ in this spot row is labeled Spot[$i_{3\,field}$,$i_{2\,field}$,$i_{block}$,$i_{row}$,$i_{spot}$]; and the dot exposed by this spot in Pulse[$i_{line}$,$i_{pulse}$] is labeled Dot[$i_{3\,field}$,$i_{2\,field}$,$i_{block}$,$i_{row}$,$i_{spot}$,$i_{line}$,$i_{pulse}$]. The x and y coordinates of Dot[$i_{3\,field}$,$i_{2\,field}$,$i_{block}$,$i_{row}$,$i_{spot}$,$i_{line}$,$i_{pulse}$] in the respective scan ($\hat{e}_2$) and cross-scan ($\hat{e}_3$) directions are given by Eqs. 38.7 and 38.8.

15. Scan Configuration for Circular Image Field

The above-outlined scan configuration efficiently covers a rectangular image field, but a variant configuration may be used to more efficiently cover a circular field, as illustrated in FIG. 45. The projection system has a circular design image field 4501 of radius $R_{field}$, which is partitioned into two subfields 4502 and 4503. Subfield 4503 has the same geometry as subfield 4502, but rotated by 180° around the center of circle 4501. Each subfield comprises two juxtaposed rectangles of $x_2$ dimension $L_{block}$, where $L_{block}$ is the nominal $x_2$ length of the echelon bocks 4001 in FIG. 40; see Eq. 38.9 in FIG. 38.

The two subfields scan separate sets of raster lines (indicated diagrammatically as solid lines crossing the subfields), each set having line spacing $G_3$. The two sets are interleaved to form a composite exposure pattern with line spacing $G_3/2$ over the region 4504 where the subfields' $x_3$ ranges overlap. The subapertures' upper and lower portions 4505 and 4506 are outside of the overlap region, but they would overlap in different line scans to provide full coverage, at line pitch $G_3/2$, over most of the printing surface 902. (The position of subaperture 4502 in a different line scan is indicated as 4502' in FIG. 45.)

The aperture fill factor (i.e., ratio of composite subfield area to circular field area) can be maximized by defining $L_{block}$ according to Eq. 38.10 in FIG. 38. Under this condition the fill factor would be 77.6%. (By comparison, a circle-inscribed square field would have a fill factor of 63.7%.)

16. Illumination Strobing

The interleaved raster line method would not work effectively, as described above, with a continuous illumination source (such as the OXIDE laser, Ref. 23) because each focused-radiation spot only exposes a sparse array of discrete dots with $x_2$ pitch $N_{dot/pulse} \cdot G_2$ (FIGS. 39A-39C). However, continuous illumination can be effectively strobed by either using a beam-switching mechanism to cycle the illumination through several projection systems, or by repeatedly scanning a narrow band of illumination across each microlens array at high speed. This technique is described in the '986 patent (See the '986 patent's FIG. 25 and associated discussion beginning at column 18, line 31.) The '986 patent pertains to image-plane microlens arrays, but the strobe method is equally applicable to object-space microlens arrays.

Figure 46:
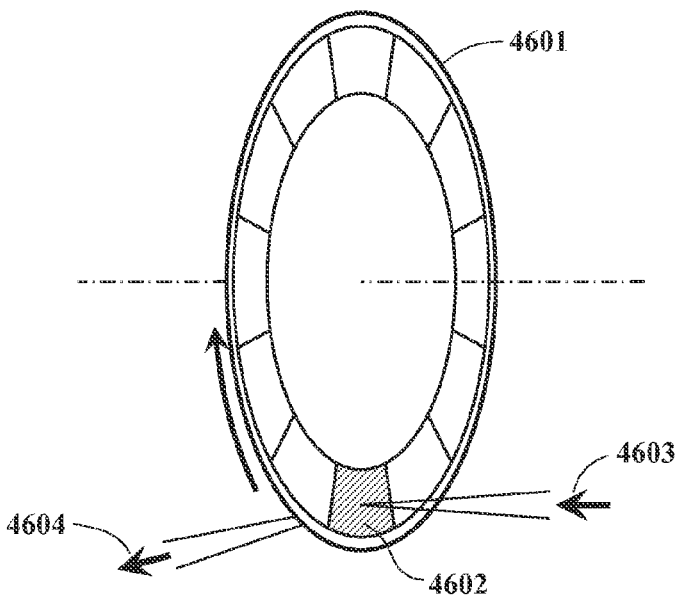
FIG. 46 illustrates a laser beam scanner used for illumination strobing when a continuous laser source is used with the interleaved raster scan method.

As illustrated in FIG. 46, a laser beam can be rapidly switched between alternative light paths by using a rotating element such as an optical disc 4601, which has multiple phase-Fresnel diffracting zones such as zone 4602 on its surface. An incident laser beam 4603 is focused onto and transmits through (or reflects from) the diffractive surface, which deflects the beam into output beam 4604. The grating phase over each zone is a linear function of the rotation angle, so that the phase gradient is angle-independent and the output beam direction will remain stationary as the zone scans the beam. Different zones deflect the beam along different light paths, which are directed by downstream optics into different projection systems. (For example 19 zones could be used to switch the illumination between the 19 projection lenses illustrated in FIG. 9.)

If $N_{dot/pulse}$ is greater than the number of projection systems, then the scan distance during each illumination pulse would be greater than the printing dot pitch $G_2$ and significant "dot smearing" would result from the raster scan motion. Under this condition—or if the laser power is insufficient to supply all projection systems—each projection system can alternatively be equipped with a beam-scanning system similar to that of FIG. 46, but configured to continuously scan a narrow illumination beam across the microlens array (in the manner illustrated in the '986 patent's FIG. 25). Other types of beam scanners, such as polygonal-mirror, Risley-wedge, or acousto-optic scanners, may alternatively be employed.

17. Microlens Aperture Geometries

Figure 47:
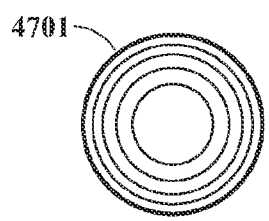
FIGS. 47-52 illustrate alternative microlens aperture geometries and array configurations.

FIGS. 47 to 52 illustrate several variant microlens aperture geometries and array patterns in plan view. FIG. 47 illustrates a circular phase-Fresnel microlens 4701. The inner circles depict the Fresnel zone boundaries.

Figure 48:
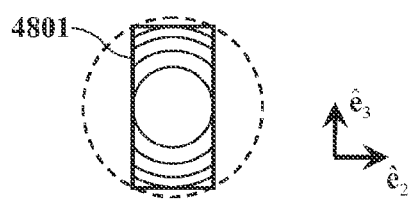
Figure 49:
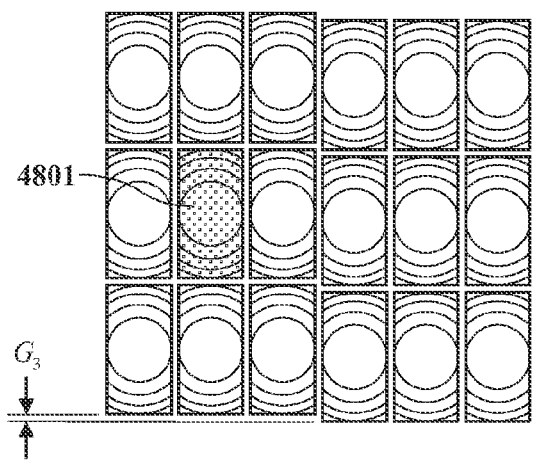

FIG. 48 illustrates a phase-Fresnel microlens 4801 similar to element 4701, but with its aperture truncated to a rectangular shape and narrowed in the scan direction ($\hat{e}_2$). This aperture type would be suitable for implementing the pupil function represented by curve 2901 in FIG. 29. Rectangular apertures can efficiently cover a microlens array with very little or no fill-factor loss. FIG. 49 illustrates a portion of an array of microlens apertures including element 4801 (shaded). The right portion of the array is illustrated with an echelon step $G_3$ relative to the left portion. (The corresponding array of image-plane focal spots is illustrated schematically in FIG. 41.)

Figure 50:
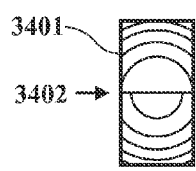

FIG. 50 illustrates a variant rectangular-aperture microlens 3401, which is similar to element 4801 except that it has a half-cycle phase discontinuity along its center line 3402 to create the pupil function illustrated by plot 3101 in FIG. 31. FIG. 34 shows a perspective view of the lens.

Figure 51:
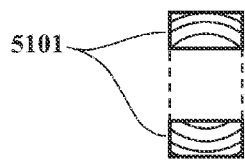
Figure 52:
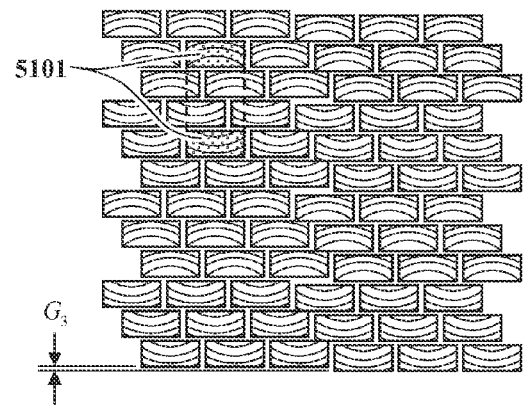

FIG. 51 illustrates a microlens 5101 similar to element 3401, but with the middle half of the aperture truncated to produce the dipole pupil function illustrated by plot 3601 in FIG. 36. The dipole-illumination aperture form need not reduce fill-factor efficiency. FIG. 52 illustrates a portion of a microlens array comprising dipole apertures such as aperture 5101 (shaded), which are interleaved to provide full area coverage with little or no fill-factor loss. (An echelon step $G_3$ is illustrated in the figure.)

18. 193i Design Example

FIGS. 53A and 53B tabulate illustrative design data for a spot-scanning immersion lithography system using a wavelength ($\lambda$) of 193 nm, a water immersion fluid, and image-space numerical aperture (NA) of 1.35; Eqs. 53.1 and 53.2 in FIG. 53A. (The high NA is possible because water has a refractive index of 1.437 at 193 nm.) The usable numerical aperture is truncated to approximate dimensions $NA_2=0.604$ in the scan direction and $NA_3=1.207$ in the cross-scan direction, according to Eq. 24.4 in FIG. 24 with the additional condition that $NA_3=2\,NA_2$; see Eq. 53.3. (The microlens aperture shapes, and the projection system's aperture stop, should both approximately match the 2:1 numerical aperture ratio in order to maximize aperture packing efficiency.)

The system uses two sets of microlenses, which could possibly be interleaved in the same microlens array, but are in separate exposure systems for this example. The first microlens set is used to write nodal lines as illustrated by diffraction plot 3201 in FIG. 32, and the second set is used to trim the nodal lines as illustrated by diffraction plot 3002 in FIG. 32. Microlenses in the first set have the form illustrated by FIGS. 50 and 34, with the pupil function represented by plot 3101 in FIG. 31. Those in the second set have the phase pattern illustrated by FIG. 48, and are apodized in the cross-scan direction as illustrated by pupil function 2902 in FIG. 31. Both sets of microlenses may similarly be apodized in the scan direction.

The raster line pitch is $G_3=\lambda/NA_3 \cong 160$ nm (equal to the nodal line pitch, cf. FIG. 32), and the dot pitch $G_2$ within each raster line is set to the optical resolution limit $\lambda/(2\,NA_2)=160$ nm (Eqs. 53.4 and 53.5; cf. FIGS. 39B and 41). The microlens center spacings are at least 25 μm in the scan direction by 50 μm in the cross-scan direction, allowing for the microlens aperture dimensions and any clearance space between the microlenses. The projection system's reduction ratio is assumed to be 25× (similar to the FIG. 1B design), so the $x_2$ offset between spots ($N_{dot/spot} \cdot G_2$ in FIG. 39B) is at least 1 μm, and the $x_3$ offset between echelon blocks ($N_{row/block} \cdot G_3$ in FIG. 41) is at least 2 μm; Eqs. 53.6 and 53.7.

Eqs. 53.5 and 53.6 imply the limit $N_{dot/spot} \geq 7$ (Eq. 53.8). $N_{dot/spot}$ is set to 8 (Eq. 53.9), implying a spot pitch in the scan direction of 1.279 μm (Eq. 53.10, FIG. 39B) and a microlens center spacing in the scan direction of 32.0 μm (at 25× reduction). The 160-nm dot pitch will result in a fairly fast scan rate, but a slower, higher-resolution line scan can be performed by dividing $G_2$ by any power of 2 and multiplying $N_{dot/spot}$ by the same factor (leaving the spot spacing $N_{dot/spot} \cdot G_2$ unchanged). The relative primality condition, Eq. 38.2 in FIG. 38, will be unaffected by this change because $N_{dot/spot}$ will still have no prime factors other than 2.

Eqs. 53.4 and 53.7 imply the limit $N_{row/block} \geq 13$ (Eq. 53.11). $N_{row/block}$ is set to 16 (i.e., $2N_{dot/spot}$, Eq. 53.12) so that the microlens apertures have a 2:1 aspect ratio matching the numerical aperture ratio $NA_3/NA_2$. The cross-scan spot pitch is 2.557 μm (Eq. 53.13, FIG. 41), and at 25× reduction the microlens cross-scan center spacing is 63.9 μm.

Figure 54:
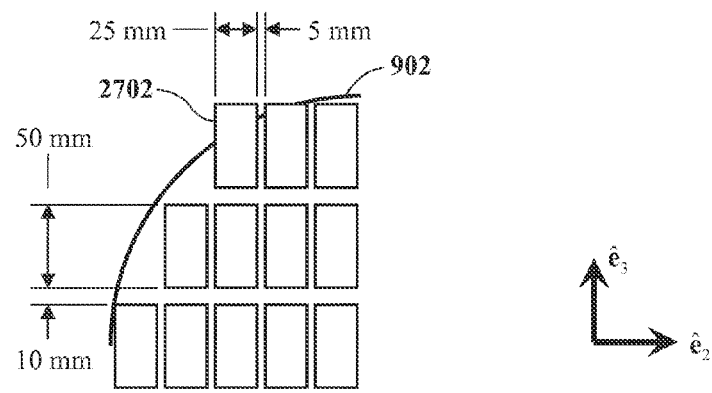
FIG. 54 illustrates the microlens array aperture dimensions and clearances for the 193i design example.

The printing system comprises 38 microlens arrays and associated projection systems, with the apertures arranged as illustrated in the FIG. 27 plan view. The arrays cover most of a 300-mm wafer 902. Each microlens array, such as array 2702, is rectangular with dimensions of approximately 25 mm in $x_2$ by 50 mm in $x_3$, and with a 5-mm $x_2$ clearance and 10-mm $x_3$ clearance between arrays, as illustrated in FIG. 54. The 25-by-50-mm array dimensions correspond to the projection systems' object field dimensions. (Each projection system's lens apertures and housing must fit within the 30-mm by 60-mm footprint.) At 25× reduction the image field dimensions are approximately 1 mm by 2 mm. Eqs. 53.14 and 53.15 (cf. FIGS. 40 and 41).

Eq. 53.14 is combined with Eqs. 53.5 and 53.12 to obtain $N_{dot/row} \approx 391$ (Eq. 53.16), and this is combined with Eqs. 38.3 (in FIG. 38) and 53.9 to obtain $N_{spot/row} \approx 49$ (Eq. 53.17). $N_{spot/row}$ is set to 49 exactly, Eq. 53.18. ($N_{spot/row}$ is equal to $N_{dot/pulse}$, which must be an odd integer in order to satisfy the relative primality constraint of Eq. 38.2; cf. Eqs. 38.1 and 53.9.) $N_{dot/row}$ is 392 (Eq. 53.19). The image field's $x_2$ dimension is 1.003 mm (Eq. 53.20), corresponding to an object field dimension of 25.1 mm at 25× reduction.

Eq. 53.15 is combined with Eqs. 53.4 and 53.12 to obtain $N_{block/field} \approx 782$ (Eq. 53.21). $N_{block/field}$ is set to 784 (i.e., $2N_{dot/row}$) in order to retain the field's 2:1 aspect ratio, Eq. 53.22. The image field's $x_3$ dimension is 2.005 mm (Eq. 53.23), corresponding to an object field dimension of 50.1 mm.

The projection systems' center spacings are approximately 30 mm in $x_2$ and 60 mm in $x_3$ (Eqs. 53.24 and 53.25 in FIG. 53B; cf. FIGS. 42, 43, and 54). Eqs. 53.4 and 53.25 imply $N_{line/field} \approx 375381$, Eq. 53.26. From Eqs. 38.4, 53.12 and 53.21, $N_{row/field} = 12544$ (Eq. 53.27), and Eqs. 38.6, 53.26 and 53.27 imply that $N_{line/row} \approx 30$ (Eq. 53.28). $N_{line/row}$ is set to 30 exactly, implying that $N_{line/field} = 376320$ and implying a 60.02-mm $x_3$ offset between projection systems (Eqs. 53.29-31). $N_{dot/line}$ is set to 188160 (i.e., $N_{line/field}/2$) to retain the 2:1 aspect ratio between the projection systems' $x_2$ and $x_3$ center spacings, Eq. 53.32. The $x_2$ spacing is 30.01 mm, Eq. 53.33.

With a laser repetition rate ("rep_rate") of 6 kHz (Eq. 53.34), the scan speed is 47.0 mm/sec, Eq. 53.35. The number of fields $N_{field}$ is 38 (Eq. 53.36, FIG. 27), and the total number of focus spots $N_{spot}$ in all fields is 23,356,928 (i.e. 614,656 per field), Eq. 53.37. Assuming that the ON/OFF state of each spot is controlled by one data bit, the total data rate ("data_rate") is 140 GHz (i.e. 3.7 GHz per field), Eq. 53.38. The data rate would be higher if control capabilities such as gray-level control (discussed in section 19) are provided. The area scan rate ("area_rate") is 35.8 cm²/sec (i.e., 94 mm²/sec per field), Eq. 53.39. The total number of printed dots $N_{dot}$ is $2.69 \cdot 10^{12}$ (i.e., $7.08 \cdot 10^{10}$ per field), Eq. 53.40. The total print area coverage is approximately 687 cm² (i.e., 18.1 cm² per field), Eq. 53.41. This amounts to 97% of a 300-mm wafer area, but includes off-wafer printing area.

The scan time per wafer ("scan_time") is 19.2 sec, Eq. 53.42. This does not include the time required for wafer loading and scan reversal, but is consistent with a throughput of order 100 wafers per hour. (However, two scans are required for the nodal-line and trim exposures, and the high throughput is also offset by the need for multiple patterning steps to form dense line structures.) Assuming an exposure dose of 30 mJ/cm² (Eq. 53.43), the image-plane exposure power is 1.07 W, Eq. 53.44. The laser power would need to be higher to accommodate optical losses. In addition, much higher power (e.g. of order 10 W) may be required to expose narrow lines using the low-threshold nodal-line printing method illustrated in FIG. 32.

19. Supplemental Control Mechanisms

With a 6 kHz pulsed laser source, the optical modulators would switch the focused-radiation spots on and off at the 6 kHz laser repetition rate, which is very low compared to prior-art optical modulators. Furthermore, the modulators would only need to be latched and stable during the very brief time interval of each laser pulse. The modulation can be effected with micromechanical shutters proximate the microlens foci, such as the modulator mechanism illustrated in FIGS. 19A-19D.

The relatively low modulation rate makes it possible to employ supplemental control mechanisms for individually controlling the spots' intensity levels ("gray level") and center positions. These mechanisms would provide additional degrees of freedom that could be exploited for resolution enhancement, and they could also be used as corrective mechanisms. For example, gray level control can be used to vary line widths and to compensate for variations in microlens transmittance and laser power fluctuations. Centering controls allow the printed line patterns to deviate somewhat from straightness and strict periodicity, and can also be used to correct small scan positioning errors and to correct thermally-induced image distortion.

Figure 55:
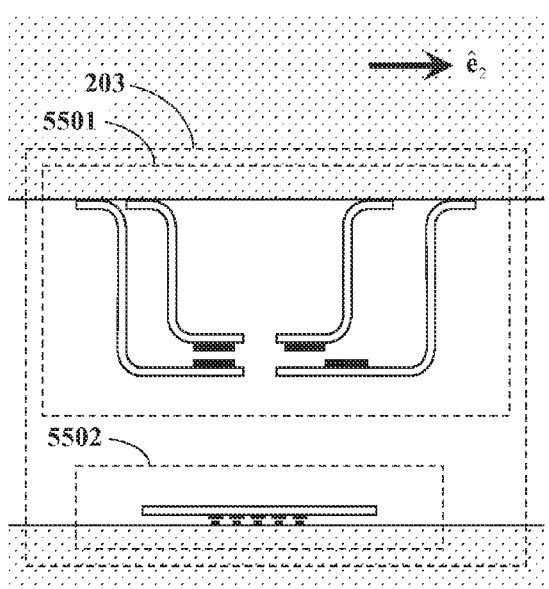
FIG. 55 illustrates an optical modulator comprising a shutter mechanism for ON/OFF control and a grating modulator for gray-level control.

A grating modulator such as that illustrated in FIGS. 23A and 23B can provide both ON/OFF switching and gray level control. The modulator can provide continuous gray-level control by positioning the movable element at intermediate positions between the OFF and ON states. However, it would be advantageous to use a grating modulator only for gray-level control over a limited transmittance range (e.g. 50% to 100%), while using a separate shutter mechanism for ON/OFF switching. For example, FIG. 55 illustrates a modulator 203 comprising a shutter mechanism 5501 of the type illustrated in FIG. 19A in series with a grating modulator 5502 similar to that illustrated in FIGS. 23A-23B but configured to provide only gray-level control. (The grating modulator 5502 may be actuated by a comb drive mechanism, not shown.) In this mode of use, the grating modulator need not be designed to the stringent tolerances that would be required to achieve a high extinction ratio in the OFF state. Also, the grating layers 2301 and 2303 in FIG. 23A can be thinner for modulating over a limited transmittance range.

The focused-radiation spot centering can be precisely varied over a limited range by equipping the microlenses with micro-mechanical positioning actuators. For example, if the projection system has a 25× reduction ratio, then a 25-nm translational movement of a microlens will induce a 1-nm positional shift of the corresponding spot. A potential limitation of this method is that if the microlens is designed to correct strong optical aberrations in the projection optics, then the translational motion will induce additional optical aberrations. (The induced aberration is proportional to the gradient of the microlens grating phase in the translation direction.) But this limitation can be overcome, as described below.

Figure 56:
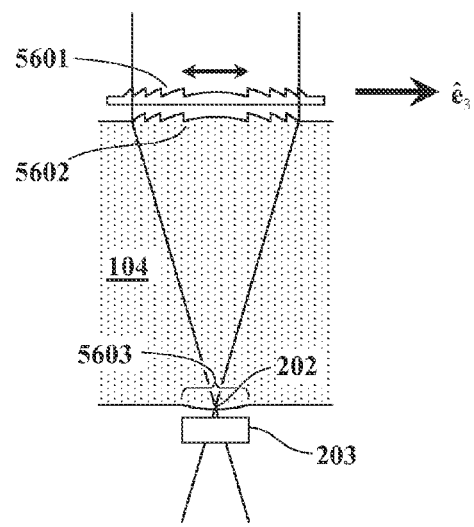
FIG. 56 illustrates spot-generation optics including a movable microlens, which provides dynamic spot centering control.

A centering control mechanism is illustrated schematically in FIG. 56, which depicts the spot-generation optics for a particular focused-radiation spot. Two proximate microlens elements 5601 and 5602 on the top of microlens/SLM plate 104 operate in conjunction to focus incident illumination through an intermediate focus 202 on the bottom of the plate. The intermediate focus 202 is at the object plane of a projection system, and is modulated by a proximate modulator element 203 (e.g., the shutter/grating mechanism of FIG. 55). Element 5601 is actuated to provide motion in the cross-scan direction ($\hat{e}_3$) for $x_3$ spot centration control. (In this embodiment $x_2$ centration control is not needed because the system operates primarily in line-printing mode.) A low-power field-lens element 5603 on the bottom of plate 104 images the microlens elements 5601 and 5602 substantially onto the system entrance pupil (which would be at infinity if the projection system is telecentric on the object side).

The FIG. 56 configuration is schematically similar to FIGS. 2, 3A and 3B, except that the microlens element 201 in is split into two elements 5601 and 5602, one of which is movable, and the field lens 5603 is added. The field lens allows the aperture of element 5602 to operate as a pupil-defining aperture stop that is optimally customized for a single focused-radiation spot. The conjugate relation between the aberration-correcting microlenses and the entrance pupil enables correction of large optical aberrations, and it ensures that the image-space focused beam remains centered in the exit pupil as element 5601 moves.

The operation of elements 5601 and 5602 can be described as follows using a thin-lens model, which is reliable when the two elements' phase-Fresnel structures are in close proximity. The phase-Fresnel surfaces are modeled approximately as zero-thickness structures in a common aperture plane. Coordinates in the microlens aperture plane are denoted as $x_2$ and $x_3$ (corresponding to the scan and cross-scan directions, respectively). With element 5601 in its nominal centered position, the element's grating phase function is denoted as $gp_1[x_2,x_3]$, and the grating phase of stationary element 5602 is similarly denoted as $gp_2[x_2,x_3]$. (Function arguments are delimited by square braces "[ . . . ]".)

When lens element 5601 is moved by positional increment $x_{3\ lens}$ in the cross-scan direction, its grating phase becomes $gp_1[x_2,x_3-x_{3\ lens}]$. The microlens motion induces a corresponding cross-scan positional shift in the focused spot's geometric image point on the image plane (the printing surface). This positional shift is denoted as $x_{3\ image}$, which is an implicit function of $x_{3\ lens}$. At the nominal centered position $x_{3\ lens}$ and $x_{3\ image}$ are both zero.

The projection system is characterized by an optical phase function $op_{proj}[x_2, x_3, x_{3\ image}]$ (also referred to as an "eikonal function"), which represents the optical path length from position $(x_2,x_3)$ on the microlens aperture plane to the positionally shifted geometric image point. The illumination system is similarly characterized by an optical phase function $op_{illum}[x_2,x_3]$ representing the optical path length from the illumination source to aperture point $(x_2,x_3)$. (The grating-phase and optical-phase functions are defined in phase cycles.)

Perfect aberration compensation would be achieved if the total source-to-image optical path length, $op_{illum}[x_2,x_3]+gp_1[x_2, x_3-x_{3\ lens}]+gp_2[x_2,x_3]+op_{proj}[x_2, x_3, x_{3\ image}]$, were independent of $x_2$ and $x_3$ for any $x_{3\ lens}$ within a design positional range. There are not generally enough design degrees of freedom to achieve this phase-matching condition exactly, but it can be achieved for small $x_{3\ lens}$ values by using first-order differential approximations as outlined in FIG. 57.

The above-stated phase-matching condition is restated in Eq. 57.1, in which C is a constant in the sense of being independent of $x_2$ and $x_3$. C may be an implicit function of $x_{3\ lens}$. A first-order approximation is made to translate Eq. 57.1 to Eq. 57.2, with derivative terms defined in Eqs. 57.3-6: $Dgp_1[x_2,x_3]$ is the derivative of $gp_1[x_2,x_3]$ with respect to $x_3$; $Dop_{proj}[x_2,x_3,0]$ is the derivative of $op_{proj}[x_2,x_3,x_{3\ image}]$ with respect to $x_{3\ image}$ at $x_{3\ image}=0$; M is the derivative of $x_{3\ image}$ with respect to $x_{3\ lens}$ at $x_{3\ lens}=0$; and DC is the derivative of C with respect to $x_{3\ lens}$ at $x_{3\ lens}=0$.

Eq. 57.2 is required to hold for any $x_{3\ lens}$, implying Eqs. 57.7 and 57.8. (C is evaluated at $x_{3\ lens}=0$ in Eq. 57.7.)

Eq. 57.8 is integrated with respect to $x_3$ to obtain $gp_1[x_2,x_3]$, Eq. 57.9. This is substituted in Eq. 57.7 to obtain $gp_2[x_2,x_3]$, Eq. 57.10. The resulting design has several degrees of freedom, including the constants C, DC, and M, and the function $gp_1[x_2,0]$. Substantially wedge-free grating phase functions can be obtained by setting DC to zero (Eq. 57.11), and $gp_1[0,0]$ can be set to zero (Eq. 57.12) because any constant phase offset can be absorbed in C. The choice of C is irrelevant to optical performance, but constant offsets can be applied to $gp_1[x_2,x_3]$ and $gp_2[x_2,x_3]$ to adjust the positions of the Fresnel zone boundaries. $gp_1[x_2,0]$ can be set equal to $gp_1[0,x_2]$ to make the grating phase functions approximately axially symmetric, Eq. 57.13.

The remaining free design choice, M, can be selected to control the sensitivity of focus spot position to microlens displacement, or to balance the optical power between elements 5601 and 5602 in FIG. 56. If all of the optical power is concentrated in the movable element 5601, then a lens displacement of $x_{3\ lens}$ will simply induce the same $x_{3\ lens}$ positional shift in the object-plane focus spot, resulting in an image-plane spot translation $x_{3\ image}$ approximately equal to $x_{3\ lens}$ times the projection system's magnification factor, i.e., the ratio $dx_{3\ image}/dx_{3\ lens}$ in Eq. 57.5 will be equal to the magnification. Thus, if M is set to the magnification factor, then most of the optical power will be concentrated in element 5601, and element 5602 will only function to preserve aberration compensation over the spot displacement range. (The magnification factor is the reciprocal of the projection system's reduction factor, and may be negative to accommodate image inversion.)

It may be advantageous to set M to approximately half the magnification factor in order to balance the microlens optical power approximately evenly between elements 5601 and 5602. The spot positioning range would be reduced by a factor of two, but positioning resolution would improve by a factor of two, relative to a design with M equal to the magnification factor.

The above design outline applies primarily to spot-generation optics that are designed to produce a pupil function such as that represented by plot 2901 in FIG. 29 (for a rectangular pupil). Based on this starting design, element 5602 in FIG. 56 can be modified to effect an apodized pupil function such as plot 2902 in FIGS. 29 and 31, or the phase-step pupil function represented by plot 3101 in FIG. 31 (cf. FIGS. 34 and 50).

The shutter mechanism 5501 in FIG. 55 preferably comprises shutter apertures (1903 and 1904 in FIG. 19A) having the form of elongated slits oriented in the cross-scan ($\hat{e}_3$) direction, which are MEMS-actuated to move in the scan ($\hat{e}_2$) direction. This will allow the focused beam to be moved in the $\hat{e}_3$ direction for centration control without being clipped by the shutter apertures. Also, the grating modulator 5502 preferably comprises grating lines oriented in the $\hat{e}_3$ direction, with the movable grating actuated to move in the $\hat{e}_2$ direction. The gratings' transmittance characteristics will be more uniform over the entrance pupil in this configuration because $NA_2$ is small in relation to $NA_3$, cf. FIG. 25. (A line grating's diffraction characteristics are generally comparatively insensitive to ray direction variations in a plane parallel to the grating lines, relative to directional variations in a transverse plane, so it is advantageous to align the grating lines to the wide aperture direction.) The grating lines can be elongated in the $\hat{e}_3$ direction to accommodate beam centration control.

Any beam apodization in the $\hat{e}_2$ direction is preferably applied at the projection system's aperture stop, not in the microlenses, because beam truncation by the shutter apertures could otherwise interfere with the apodization. The shutter apertures' $x_2$ limits are preferably located at the first diffraction nodes of the focused beam in order to minimize both the shutters' range of motion and the sensitivity to shutter position in the ON state. The truncation of the focused beam's diffraction tails in the $\hat{e}_2$ direction will result in partial beam apodization at the image-space exit pupil. The optical attenuation profile across the projection system's aperture stop can be tailored to further apodize the beam in the $\hat{e}_2$ direction.

Aberration control need only optimize the focus spot's cross-scan ($x_3$) resolution for line printing. Aberration-induced broadening in the scan ($x_2$) dimension can be tolerated, allowing the microlenses to be designed to generate resolved nodal lines at the shutter apertures' $x_2$ limits while also performing aberration compensation for line printing.

Figure 58:
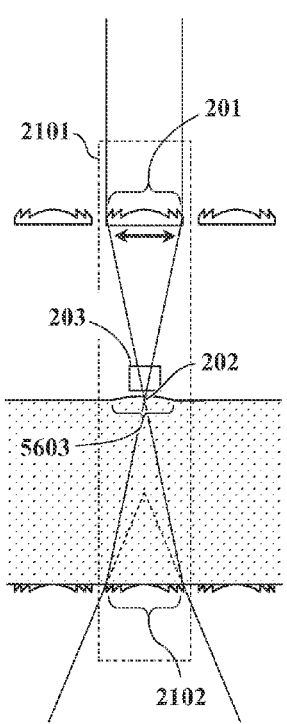
FIG. 58 illustrates a Schupmann-type microlens doublet with a movable element for spot centering control.

The Schupmann lens configuration 2101 of FIG. 21B can be modified to provide beam centration control, as illustrated in FIG. 58, by making the top microlens element 201 movable. A small field lens 5603 proximate the intermediate focus 202 images the entrance pupil onto element 201. The optical power can be balanced between elements 201 and 2102 to optimize aberration compensation performance over the positional range of element 201 while maintaining substantial achromaticity.

20. Dual-Wavelength Lithography

The above-described nodal line printing method is applicable to multi-patterning, single-wavelength lithography, in which multiple coarse-pitch line structures are interleaved to form high-pitch structures. The method is also adaptable to dual-wavelength processes, such as absorbance modulation optical lithography and two-color lithography, which can perform the interleaving in a single exposure process without intermediate processing. Absorbance modulation is described in U.S. patent application Ser. No. 13/103,874 (the '874 application) and the references cited therein, and two-color lithography is described in Ref. 25.

In this mode of operation, two focus spot patterns such as 3002 and 3201 illustrated in FIG. 32 are simultaneously superimposed, using separate illumination wavelengths for the two patterns, to expose narrow lines in a photoresist. Pattern 3002 is illuminated with an "exposure wavelength" $\lambda_1$ which modifies the resist solubility in relation to the absorbed energy. Pattern 3201 is illuminated with a separate "masking wavelength" $\lambda_2$, which inhibits the resist photo-activation by wavelength $\lambda_1$ so that only a narrow line of width w in FIG. 32 is formed where the $\lambda_2$ intensity is below threshold t. Multiple lines can be scanned at a line pitch significantly smaller than $\lambda_1/NA_3$ by this method, without any intermediate resist processing steps. (The line pitch $G_3$ in FIG. 41 might be comparable to $\lambda_1/NA_3$, but multiple line scans can be used to expose interleaved line patterns at a pitch much smaller than $G_3$.)

The '874 application disclosed methods for creating optical nulls at isolated points (as in the '874 application's FIGS. 26 and 27) by using spiral-phase microlenses such as those illustrated in the '874 application's FIGS. 18-23. Similar techniques are used in other prior art (e.g., as illustrated in FIG. 1 of Ref. 25). By contrast, the exposure pattern plot 3201 in FIG. 32 has an optical null along a line (3502 in FIG. 35), not at an isolated point. The use of line patterns, rather than isolated points, for lithography can greatly increase the system's achievable throughput and power efficiency.

In absorbance modulation optical lithography, a photochromic layer in contact with the resist operates as a contact mask, absorbing the exposure wavelength over regions where the masking wavelength has high intensity. For example, the cover plate 2012 in FIG. 20 could have a photochromic layer on its bottom side, or a photochromic immersion fluid might be used between the cover plate and resist. This type of process is described in the '874 application, which notes that it may alternatively be possible to emulsify the photochromic medium in the resist. The latter method is analogous to two-color lithography, which uses a photo-inhibitor in the resist.

The two wavelengths can be merged into the projection system by means of a beam combiner, as illustrated schematically by element 112 in the '874 application's FIG. 29. (A projection system similar to that illustrated in FIG. 1B could possibly accommodate a beam combiner in the space between elements PL1 and PL2.) Alternatively, dual-wavelength optics can be used throughout the optical system (e.g. from the source point 101 in FIG. 1A through the projection system), eliminating the need for beam combining in the projection system.

Methods of achromatizing an optical system can be adapted to provide dual-wavelength operation with two narrow-band sources. Phase-Fresnel optics (either transmitting or reflecting) can work with two widely separated wavelengths by using different diffraction orders for the two wavelengths. (For example, as noted previously, the phase-Fresnel structure illustrated in FIG. 22C could operate simultaneously at wavelength 266 nm and 532 nm.) With orders $m_1$ and $m_2$ used for respective wavelengths $\lambda_1$ and $\lambda_2$, a phase-Fresnel diffractive lens can exhibit simultaneous blazing (high efficiency) and approximately equivalent raytrace properties at the two wavelengths if the approximate relation $m_1\lambda_1 \approx m_2\lambda_2$ holds.

A phase-Fresnel optic need not be perfectly corrected for chromatic aberration between $\lambda_1$ and $\lambda_2$. Some amount of chromatic aberration can be useful for counterbalancing glass dispersion in the projection optics (e.g. by means of phase-Fresnel surfaces 108 and 109 in FIG. 1B). If the chromatic dispersion between $\lambda_1$ and $\lambda_2$ in the spot-generation optics is significant, Schupmann-type microlens doublets (FIG. 21B) can be used to mitigate the dispersion. (The two Schupmann elements have sufficient design degrees of freedom to effect aberration correction at two wavelengths, bringing both wavelengths to a common focal point on the image plane.)

Catoptric or catadioptric projection optics, such as the Schwarzschild mirror system of the '919 application or the catadioptric DUV system of Ref. 26, can be used for wideband or dual-wavelength operation.

A shutter-type optical modulator (FIGS. 19A-19D) can operate to simultaneously block or transmit the two wavelengths, or it can operate to divert $\lambda_1$ radiation (the exposure wavelength) out of the optical system via diffractive scattering (zero-order extinction) in the OFF state. A diffractive optical modulator (FIGS. 23A and 23B) need only be optimized for high zero-order extinction at wavelength $\lambda_1$ in the OFF state, but it should be configured to have high zero-order transmission of both wavelengths in the ON state.

The wavelength-$\lambda_2$ phase discontinuity illustrated by plot 3101 in FIG. 31 can be effected by means of a phase-shifting optical surface such as surface 3301 in FIG. 33 or surface 3401 in FIG. 34 that induces a phase discontinuity approximately equal to a whole number of phase cycles at wavelength $\lambda_1$ and a half-integer number of phase cycles at wavelength $\lambda_2$. (For example, the phase step 3302 in FIG. 33 or 3402 in FIG. 34 could induce a phase discontinuity of one cycle phase at $\lambda_1$ and ½ or ³⁄₂ cycle at $\lambda_2$.)

20. System Schematic

Figure 59:
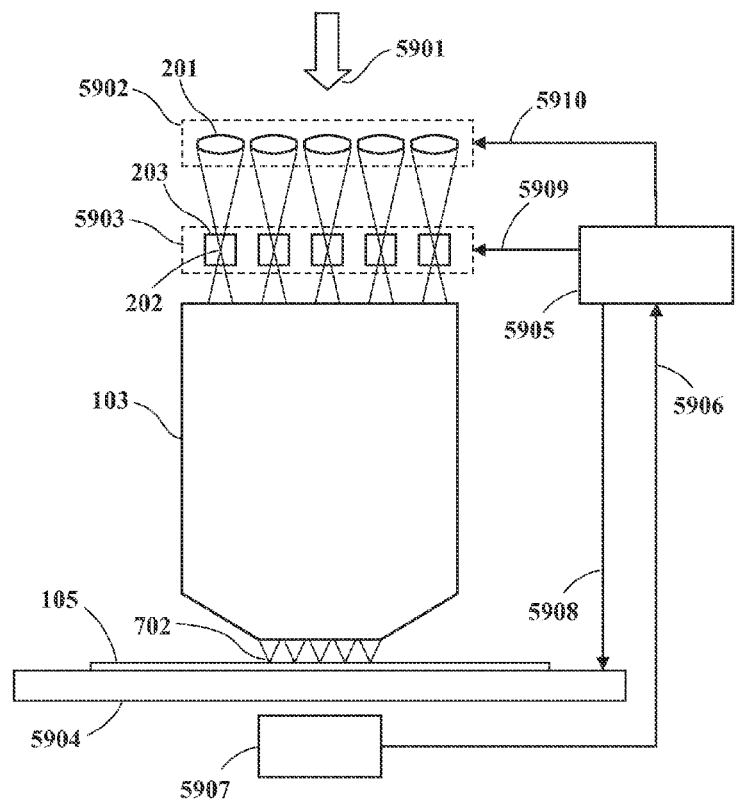
FIG. 59 schematically illustrates the components of a scanned-spot-array lithography system and their functional relationships.

FIG. 59 schematically illustrates the components of a scanned-spot-array lithography system and their functional relationships. Illuminating radiation 5901 is directed onto a microlens array 5902 comprising elements such as microlens 201, which focuses the radiation through an intermediate focal point 202 at the object surface of a projection system 103. The projection system transmits the radiation to a printing surface 105 at its image plane, and focuses the radiation from each intermediate focus 202 onto a focused-radiation spot 702 on the printing surface. An array 5903 of optical modulators proximate the intermediate foci, including modulator element 203, modulates the radiation transmitting to the focused-radiation spots. A mechanical stage 5904 raster-scans the printing surface in synchronization with the modulation to record a synthesized, high-resolution optical image on the surface.

The synchronization is effected by a control mechanism 5905 (e.g., a computer, digital micro-controllers, analog circuits, or a combination of such elements). The control mechanism receives position information 5906 from a position sensor or sensors 5907 (e.g., interferometric optical encoders), which detect the positional relationship between the projection system and the printing surface. The control mechanism generates positional control signals 5908 for the scanning stage and modulation signals 5909 for the modulator array. The control mechanism may also generate control signals 5910 for a mechanical actuator coupled to the microlens array, or for micromechanical actuators coupled to individual microlens elements, which effect small positional changes in the focused-radiation spots by moving the microlenses.

REFERENCES

The following additional patent references are referred to in this disclosure and are incorporated by reference:

| | | |
|---|---|---|
| U.S. Pat. No. 5,061,049 | October 1991 | Hornbeck |
| U.S. Pat. No. 5,161,057 | November 1992 | Johnson |
| U.S. Pat. No. 5,589,982 | December 1996 | Faklis, et al. |
| U.S. Pat. No. 5,623,365 | April 1997 | Kuba |
| U.S. Pat. No. 5,841,579 | November 1998 | Bloom, et al. |
| U.S. Pat. No. 5,900,637 | May 1999 | Smith |
| U.S. Pat. No. 6,133,986 | October 2000 | Johnson |
| U.S. Pat. No. 6,187,211 | February 2001 | Smith, et al. |
| U.S. Pat. No. 6,214,633 | April 2001 | Clark, et al. |
| U.S. Pat. No. 6,701,039 | March 2004 | Bourgeois, et al. |
| U.S. Pat. No. 6,897,941 | May 2005 | Almogy |
| U.S. Pat. No. 6,960,773 | November 2005 | Menon, et al. |
| U.S. Pat. No. 7,283,576 | October 2007 | Krupke |
| U.S. Pat. No. 8,355,201 | January 2013 | Shafer, et al. |
| U.S. Pat. No. 8,687,277 | April 2014 | Johnson |

The following literature references and information sources are referred to in this disclosure. Literature references are incorporated by reference:

| | |
|---|---|
| Ref. 1 | Zemax is a commercial lens design program from Radiant Zemax LLC, based in Redmond, WA, USA (http://www.radiantzemax.com/). |
| Ref. 2 | "TWINSCAN scanner evolution" in ASML Images, Fall Edition 2008, pp. 14-15 (http://www.asml.com). |
| Ref. 3 | Coherent, Inc., Santa Clara, CA (http://www.coherent.com/). |
| Ref. 4 | "Review and Assessment of Measured Values of the Nonlinear Refractive-Index Coefficient of Fused Silica," Appl. Opt. 37, 546-550 (1998). doi: 10.1364/AO.37.000546 |
| Ref. 5 | M. K. Yang et al., "Index of refraction of high-index lithographic immersion fluids and its variability," J. Micro/Nanolith. MEMS MOEMS 8(2), 023005 (2009). doi: 10.1117/1.3124189 |
| Ref. 6 | P. R. Dumas et al., "Applications and benefits of 'perfectly bad' optical surfaces," Proc. SPIE 7102, Optical Fabrication, Testing, and Metrology III, 71020G (2008). doi: 10.1117/12.797718 |
| Ref. 7 | K. Miyamoto, "The Phase Fresnel Lens," J. Opt. Soc. Am. 51, 17-20 (1961). doi: 10.1364/JOSA.51.000017 |
| Ref. 8 | H. Rostalski et al., "Use of Diffractive Lenses in Lithographic Projection Lenses," in International Optical Design, Technical Digest (CD) (Optical Society of America, 2006), paper WD4. doi: 10.1364/IODC.2006.WD4 |
| Ref. 9 | "Optical Properties of Thin Films for DUV and VUV Microlithography," RIT Center for Nanolithography Research (http://www.rit.edu/kgcoe/microsystems/lithography/utilities.html). |
| Ref. 10 | T. Nishimura et al., "Atomic scale characterization of $HfO_2/Al_2O_3$ thin films grown on nitrided and oxidized Si substrates," J. Appl. Phys. 96, 6113 (2004). doi: 10.1063/1.1808245 |
| Ref. 11 | H. Hu et al., "High performance ALD $HfO_2$—$Al_2O_3$ laminate MIM capacitors for RF and mixed signal IC applications," Electron Devices Meeting, 2003. IEDM '03 Technical Digest. IEEE International. doi: 10.1109/IEDM.2003.1269303 |
| Ref. 12 | Foltyn et al., "Deposition of multilayer mirrors with arbitrary period thickness distributions," Proc. SPIE 5193, Advances in Mirror Technology for X-Ray, EUV Lithography, Laser, and Other Applications, 124 (2004). doi: 10.1117/12.505401 |
| Ref. 13 | M. J. Vasile et al., "Microfabrication by ion milling: The lathe technique," J. Vac. Sci. Technol. B 12, 2388 (1994). doi: 10.1116/1.587769 |
| Ref. 14 | GD-Calc ® (Grating Diffraction Calculator), http://software.kjinnovation.com/GD-Calc.html. |
| Ref. 15 | Z. Bomzon et al., "Radially and azimuthally polarized beams generated by space-variant dielectric subwavelength gratings," Opt. Lett. 27, 285-287 (2002). doi: 10.1364/OL.27.000285. |
| Ref. 16 | I. Richter et al., "Design considerations of form birefringent microstractures," Appl. Opt. 34, 2421-2429 (1995). doi: 10.1364/AO.34.002421 |
| Ref. 17 | D. C. Flanders, "Submicrometer periodicity gratings as artificial anisotropic dielectrics," Appl. Phys. Lett. 42(6), 492-494 (1983). doi: 10.1063/1.93979 |

-continued

Ref. 18 J. R. Karpinsky et al., "MEMS microshutter SLM for intensity modulation," Proc. SPIE 3633, Diffractive and Holographic Technologies, Systems, and Spatial Light Modulators VI, 254 (1999). doi: 10.1117/12.349335
Ref. 19 K. P. Larsen, *Micro Electro Mechanical Devices for Controlling Light: Ph.D. Thesis*, MIC - Department of Micro and Nanotechnology, Technical University of Denmark, 2005. ISBN 8789935772
Ref. 20 J. H. Burnett et al., "High-index optical materials for 193 nm immersion lithography," Proc. SPIE 6154, Optical Microlithography XIX, 615418 (2006). doi: 10.1117/12.656901
Ref. 21 P. A. Zimmerman et al., "High index 193 nm immersion lithography: the beginning or the end of the road," Proc. SPIE 7274, Optical Microlithography XXII, 727420 (2009). doi: 10.1117/12.814381
Ref. 22 J. H. Burnett et al., "Birefringence issues with uniaxial crystals as last lens elements for high-index immersion lithography," Proc. SPIE 7274, Optical Microlithography XXII, 727421 (2009). doi: 10.1117/12.814324
Ref. 23 OXIDE laser company, http://www.opt-oxide.com/en/.
Ref. 24 International Technology Roadmap for Semiconductors, 2011 Edition, Lithography, http://www.itrs.net/Links/2011itrs/2011Chapters/2011Lithography.pdf
Ref. 25 R. R. McLeod et al., "Two-color photo-initiation/inhibition lithography," Proc. SPIE 7591, *Advanced Fabrication Technologies for Micro/Nano Optics and Photonics III*, 759102 (Feb. 16, 2010). doi: 10.1117/12.845850
Ref. 26 P. Huang and D. Leibfried, "Achromatic catadioptric microscope objective in deep ultraviolet with long working distance," *Optical Science and Technology, the SPIE 49th Annual Meeting*. International Society for Optics and Photonics (2004). doi: 10.1117/12.559790

CONCLUSION

Scanned-spot-array imaging has multiple advantages for lithography including maskless operation, modularity, relative simplicity and small dimensional scale of the projection optics, low power requirement, low scan speed, and accurate alignment and focus control. With the nodal line printing technique, such systems could provide ultra-high-resolution and high-throughput printing capability in conjunction with multi-patterning or dual-wavelength recording processes.

While the above is a complete description of specific embodiments of the invention, the above description should not be taken as limiting the scope of the invention as defined by the claims.

What is claimed is:

1. A scanned-spot-array lithography system comprising an array of microlenses and corresponding optical modulators,
a projection system, and
a scanning mechanism, wherein:
the array of microlenses and corresponding optical modulators, the projection system, and the scanning mechanism operate cooperatively to print a lithographic image on a photosensitive layer when the layer is positioned proximate an image plane;
each microlens receives radiation from a radiation source and focuses it into a convergent beam converging toward a corresponding intermediate focus;
each convergent beam transmits through and diverges from the corresponding intermediate focus, transmits through the projection system, and is focused by the projection system onto a corresponding focused-radiation spot on the image plane;
the optical modulator corresponding to each microlens is positioned to intercept the corresponding convergent beam proximate the intermediate focus, and operates to modulate the radiation transmitting to the corresponding focused-radiation spot; and
the scanning mechanism raster-scans the photosensitive layer relative to the focused-radiation spots in synchronization with the modulation to record a synthesized, high-resolution raster image on the photosensitive layer.

2. The scanned-spot-array lithography system of claim 1, and further comprising collimation optics, which receive divergent radiation from the radiation source and direct it into substantially collimated radiation intercepting the microlens array.

3. The scanned-spot-array lithography system of claim 1 wherein the microlenses are configured to substantially eliminate geometric point-imaging optical aberrations at the focused-radiation spots.

4. The scanned-spot-array lithography system of claim 1 wherein the microlenses are singlet microlens elements.

5. The scanned-spot-array lithography system of claim 1 wherein:
the microlenses are Schupmann doublets, each doublet comprising first and second microlens elements; and
the first microlens element of each doublet focuses radiation toward the corresponding intermediate focus, the second element receives radiation diverging from the intermediate focus and further diverges it; and
the first and second elements are configured to substantially eliminate chromatic aberration at the corresponding focused-radiation spot.

6. The scanned-spot-array lithography system of claim 1 wherein the microlenses comprise phase-Fresnel elements.

7. The scanned-spot-array lithography system of claim 1 wherein the projection system comprises at least one phase-Fresnel lens surface.

8. The scanned-spot-array lithography system of claim 1 wherein the radiation source is monochromatic, the microlenses and the projection system are configured to produce substantially zero-intensity nodal lines at some or all of the focused-radiation spots, and the scanning mechanism raster-scans the photosensitive layer in the direction of the nodal lines.

9. A method of printing a synthesized, high-resolution raster image on a photosensitive layer proximate an image plane by exposing the photosensitive layer to a nodal line exposure pattern and a trim exposure pattern, wherein:

a scanned-spot-array lithography system of claim 8 performs the nodal line exposure; and selected portions of the nodal line pattern are exposed by the trim exposure.

10. The printing method of claim 9, wherein the trim exposure is performed by a scanned-spot-array lithography system that comprises an array of microlenses and corresponding optical modulators, a projection system, and a scanning mechanism, wherein:

the array of microlenses and corresponding optical modulators, the projection system, and the scanning mechanism operate cooperatively to print a lithographic image on a photosensitive layer when the layer is positioned proximate an image plane;

each microlens receives radiation from a radiation source and focuses it into a convergent beam converging toward a corresponding intermediate focus;

each convergent beam transmits through and diverges from the corresponding intermediate focus, transmits through the projection system, and is focused by the projection system onto a corresponding focused-radiation spot on the image plane;

the optical modulator corresponding to each microlens is positioned to intercept the corresponding convergent beam proximate the intermediate focus, and operates to modulate the radiation transmitting to the corresponding focused-radiation spot; and the scanning mechanism raster-scans the photosensitive layer relative to the focused-radiation spots in synchronization with the modulation to record a synthesized, high-resolution raster image on the photosensitive layer.

11. The scanned-spot-array lithography system of claim 1, wherein:

the radiation from the radiation source comprises first and second distinct wavelengths;

the microlenses and the projection system are configured to produce intensity maxima in the first wavelength coinciding with substantially zero-intensity nodal lines in the second wavelength at some or all of the focused-radiation spots; and the scanning mechanism raster-scans the photosensitive layer in the direction of the nodal lines.

12. A method of printing a synthesized, high-resolution raster image on a photosensitive layer proximate an image plane by exposing the photosensitive layer to focused-radiation spots comprising intensity maxima at a first wavelength coinciding with nodal lines at a second wavelength, wherein:

a scanned-spot-array lithography system of claim 11 performs the dual-wavelength exposure; and wherein the second wavelength inhibits photo-activation of the photosensitive layer by the first wavelength.

13. A scanned-spot-array system comprising multiple subsystems of claim 1 configured to operate in parallel and to simultaneously print onto a photosensitive layer on a common image plane, wherein the separate subsystems comprise separate microlens arrays, modulators, and projection systems.

14. The scanned-spot-array lithography system of claim 1, wherein each modulator comprises a micromechanical shutter mechanism.

15. The scanned-spot-array lithography system of claim 1, wherein each modulator comprises two proximate transmission diffraction gratings, one of which is actuated to vary the convergent beam's zero-order transmittance through both gratings between a substantially zero-transmittance OFF state and a high-transmittance ON state.

16. The scanned-spot-array lithography system of claim 1, wherein each modulator comprises:

a micromechanical shutter mechanism for effecting ON/OFF switching; and two proximate transmission diffraction gratings, one of which is actuated to effect gray-level control by continuously varying the convergent beam's zero-order transmittance through both gratings between low, high, and intermediate transmittance levels.

17. The scanned-spot-array lithography system of claim 1, wherein each convergent beam traverses two microlens elements, one of which is micromechanically actuated to provide spot centration control.

18. The scanned-spot-array lithography system of claim 17, wherein the microlenses are configured to substantially eliminate geometric point-imaging optical aberrations at the focused-radiation spots and to maintain substantial elimination of aberrations over the full actuation range of the centration control.

19. A method of printing a synthesized, high-resolution raster image on a photosensitive layer proximate an image plane, the method comprising:

directing radiation from a radiation source through an array of microlenses and corresponding optical modulators, through a projection system, and onto the image plane, wherein:

each microlens receives radiation from the radiation source and focuses it into a convergent beam converging toward a corresponding intermediate focus, each convergent beam transmits through and diverges from the corresponding intermediate focus, transmits through the projection system, and is focused by the projection system onto a corresponding focused-radiation spot on the image plane, and the optical modulator corresponding to each microlens is positioned to intercept the corresponding convergent beam proximate the intermediate focus, and operates to modulate the radiation transmitting to the corresponding focused-radiation spot; and operating a scanning mechanism to raster-scan the photosensitive layer relative to the focused-radiation spots in synchronization with the modulation to record the synthesized, high-resolution raster image on the photosensitive layer.

* * * * *